US012435118B2

(12) United States Patent
Hwang et al.

(10) Patent No.: US 12,435,118 B2
(45) Date of Patent: Oct. 7, 2025

(54) CHIMERIC ANTIGEN RECEPTOR AND NATURAL KILLER CELLS EXPRESSING SAME

(71) Applicant: GC Cell Corporation, Yongin-si (KR)

(72) Inventors: Yu Kyeong Hwang, Yongin-si (KR); Sung Yoo Cho, Yongin-si (KR); Sung Yong Won, Yongin-si (KR); Ho Yong Lim, Yongin-si (KR); Jung Hyun Her, Yongin-si (KR); Mi Young Jung, Yongin-si (KR); Hyun Ah Kim, Yongin-si (KR); Su Hyun Gwon, Yongin-si (KR); Eun Sol Lee, Yongin-si (KR); Han Sol Kim, Yongin-si (KR)

(73) Assignee: GC Cell Corporation, Gyeonggi-do (KR)

( * ) Notice: Subject to any disclaimer, the term of this patent is extended or adjusted under 35 U.S.C. 154(b) by 0 days.

(21) Appl. No.: 17/845,793

(22) Filed: Jun. 21, 2022

(65) Prior Publication Data

US 2023/0025506 A1 Jan. 26, 2023

Related U.S. Application Data

(63) Continuation of application No. 16/474,426, filed as application No. PCT/KR2017/015635 on Dec. 28, 2017, now abandoned.

(30) Foreign Application Priority Data

Dec. 28, 2016 (KR) .......................... 1020160181119

(51) Int. Cl.
*C07K 14/725* (2006.01)
*A61K 40/15* (2025.01)
(Continued)

(52) U.S. Cl.
CPC .......... *C07K 14/7051* (2013.01); *A61K 40/15* (2025.01); *A61K 40/31* (2025.01);
(Continued)

(58) Field of Classification Search
CPC ................................................. C07K 14/7051
See application file for complete search history.

(56) References Cited

U.S. PATENT DOCUMENTS 4,554,101 A 11/1985 Hopp
5,783,186 A 7/1998 Arakawa et al.
(Continued)

FOREIGN PATENT DOCUMENTS

CA 2402930 3/2004
CN 104177499 12/2014
(Continued)

OTHER PUBLICATIONS

Dotti et al., Design and Development of Therapies using Chimeric Antigen Receptor-Expressing T cells Immunol Rev. Jan. 2014 ; 257(1): pp. 1-35.*

(Continued)

*Primary Examiner* — Mark L Shibuya
(74) *Attorney, Agent, or Firm* — Fish & Richardson P.C.

(57) ABSTRACT

The present invention provides a chimeric antigen receptor and natural killer cells expressing the same, and particularly, a chimeric antigen receptor (CAR) which includes an intracellular signaling domain including the whole or a portion of an OX40 ligand (CD252), thereby having excellent effects of increasing anticancer activity of immune cells, and immune cells expressing the same.

5 Claims, 22 Drawing Sheets

Specification includes a Sequence Listing.

(51) Int. Cl.

| | |
|---|---|
| ***A61K 40/31*** | (2025.01) |
| ***A61K 40/42*** | (2025.01) |
| ***C07K 16/28*** | (2006.01) |
| ***C12N 5/0783*** | (2010.01) |

(52) U.S. Cl.

CPC ...... *A61K 40/4221* (2025.01); *A61K 40/4224* (2025.01); *C07K 16/2815* (2013.01); *C07K 16/2818* (2013.01); *C07K 16/283* (2013.01); *C07K 16/2851* (2013.01); *C12N 5/0646* (2013.01); *A61K 2239/22* (2023.05); *A61K 2239/48* (2023.05); *A61K 2239/49* (2023.05); *A61K 2239/55* (2023.05); *C07K 2317/622* (2013.01); *C07K 2317/73* (2013.01); *C07K 2319/03* (2013.01); *C07K 2319/33* (2013.01)

(56) References Cited

U.S. PATENT DOCUMENTS

| | | | |
|---|---|---|---|
| 5,821,337 A | 10/1998 | Carter et al. | |
| 7,674,460 B2 | 3/2010 | Serrero | |
| 7,741,465 B1 | 6/2010 | Eshhar et al. | |
| 8,314,213 B2 | 11/2012 | Bernett et al. | |
| 8,404,811 B2 | 3/2013 | Ye et al. | |
| 9,079,976 B2 * | 7/2015 | Shirwan | A61P 31/00 |
| 9,394,368 B2 | 7/2016 | Brogdon et al. | |
| 9,624,276 B2 | 4/2017 | Young et al. | |
| 9,777,064 B2 | 10/2017 | Wang et al. | |
| 9,845,362 B2 | 12/2017 | Mukherjee | |
| 10,124,023 B2 | 11/2018 | Brentjens et al. | |
| 10,174,116 B2 | 1/2019 | Lee et al. | |
| 10,273,280 B2 | 4/2019 | Ma et al. | |
| 10,736,918 B2 | 8/2020 | Jensen et al. | |
| 11,091,532 B2 * | 8/2021 | Pulé | C12N 5/0636 |
| 11,197,919 B2 | 12/2021 | Priceman et al. | |
| 11,649,294 B2 | 5/2023 | Lee et al. | |
| 11,970,547 B2 | 4/2024 | Lee et al. | |
| 12,116,417 B2 | 10/2024 | Lee et al. | |
| 2004/0043401 A1 * | 3/2004 | Sadelain | C07K 14/70521 435/325 |
| 2009/0285837 A1 | 11/2009 | Kao et al. | |
| 2010/0183604 A1 | 7/2010 | Ohta et al. | |
| 2014/0199334 A1 | 7/2014 | Sasikumar et al. | |
| 2014/0255363 A1 | 9/2014 | Metelitsa et al. | |
| 2014/0294898 A1 | 10/2014 | Miller et al. | |
| 2014/0322275 A1 | 10/2014 | Brogdon et al. | |
| 2015/0125491 A1 | 5/2015 | Sasikumar et al. | |
| 2016/0130357 A1 | 5/2016 | Mukherjee | |
| 2016/0158285 A1 | 6/2016 | Cooper et al. | |
| 2016/0340391 A1 | 11/2016 | Miller et al. | |
| 2016/0340406 A1 | 11/2016 | Zhao et al. | |
| 2017/0051068 A1 | 2/2017 | Pillarisetti et al. | |
| 2017/0107216 A1 | 4/2017 | Wu et al. | |
| 2017/0151281 A1 | 6/2017 | Wagner et al. | |
| 2017/0174679 A1 | 6/2017 | Lajkiewicz et al. | |
| 2017/0190786 A1 | 7/2017 | Fendly et al. | |
| 2017/0252432 A1 | 9/2017 | Allen et al. | |
| 2017/0313759 A1 | 11/2017 | Batuwangala | |
| 2017/0335281 A1 | 11/2017 | Loew et al. | |
| 2017/0362253 A1 | 12/2017 | Xiao et al. | |
| 2018/0057486 A1 | 3/2018 | Wu et al. | |
| 2018/0079824 A1 | 3/2018 | Ahmed et al. | |
| 2018/0326032 A1 | 11/2018 | Priceman et al. | |
| 2019/0037831 A1 | 2/2019 | Hwang et al. | |
| 2019/0336533 A1 * | 11/2019 | Hwang | C07K 14/70521 |
| 2020/0038441 A1 | 2/2020 | Klingemann et al. | |
| 2020/0102366 A1 | 4/2020 | Cooper et al. | |
| 2020/0108096 A1 | 4/2020 | Min et al. | |
| 2020/0399397 A1 | 12/2020 | Lee et al. | |
| 2021/0008105 A1 | 1/2021 | Martin | |
| 2021/0040216 A1 | 2/2021 | Chui et al. | |
| 2021/0060070 A1 | 3/2021 | Coughlin | |
| 2021/0147803 A1 | 5/2021 | Hwang et al. | |
| 2021/0179733 A1 | 6/2021 | Lee et al. | |
| 2022/0133663 A1 | 5/2022 | Splichal | |
| 2023/0303716 A1 | 9/2023 | Lee et al. | |
| 2024/0270872 A1 | 8/2024 | Lee et al. | |
| 2024/0366663 A1 | 11/2024 | Kim et al. | |
| 2024/0409665 A1 | 12/2024 | Lee et al. | |
| 2025/0073264 A1 | 3/2025 | Lim et al. | |

FOREIGN PATENT DOCUMENTS

| | | |
|---|---|---|
| CN | 105246504 | 1/2016 |
| CN | 105925536 | 9/2016 |
| EP | 3567049 A2 | 11/2019 |
| JP | 2010-006705 | 1/2010 |
| JP | 2013-534809 | 9/2013 |
| JP | 2016-508725 | 3/2016 |
| JP | 2016-518368 | 6/2016 |
| KR | 10-1453462 | 10/2014 |
| KR | 10-2015- 0048783 | 5/2015 |
| KR | 10-2016-0015195 | 2/2016 |
| KR | 10-2016- 0022857 | 3/2016 |
| KR | 10-2016-0062760 | 6/2016 |
| WO | WO 1994/000136 | 1/1994 |
| WO | WO 2006/033700 | 9/2006 |
| WO | WO 2011/127297 | 10/2011 |
| WO | WO 2013/094988 | 6/2013 |
| WO | WO 2014/130657 | 8/2014 |
| WO | WO 2014/185704 | 11/2014 |
| WO | WO 2015/033299 | 3/2015 |
| WO | WO 2015/033301 | 3/2015 |
| WO | WO 2015/033303 | 3/2015 |
| WO | WO 2015/034820 | 3/2015 |
| WO | WO 2015/036927 | 3/2015 |
| WO | WO 2016/039749 | 3/2015 |
| WO | WO 2015/044900 | 4/2015 |
| WO | WO 2015/095895 | 6/2015 |
| WO | WO 2015/160641 | 10/2015 |
| WO | WO 2015/164594 | 10/2015 |
| WO | WO 2016/176639 | 3/2016 |
| WO | WO 2016/077518 | 5/2016 |
| WO | WO 2016/085248 | 6/2016 |
| WO | WO 2016/090320 | 6/2016 |
| WO | WO 2016/100608 | 6/2016 |
| WO | WO 2016/120219 | 8/2016 |
| WO | WO 2016/123333 | 8/2016 |
| WO | WO 2016/126646 | 8/2016 |
| WO | WO 2016/142833 | 9/2016 |
| WO | WO 2016/142835 | 9/2016 |
| WO | WO 2016/142852 | 9/2016 |
| WO | WO 2016/142886 | 9/2016 |
| WO | WO 2016/142894 | 9/2016 |
| WO | WO 2016/154585 | 9/2016 |
| WO | WO 2016/174652 | 11/2016 |
| WO | WO 2016/191756 | 12/2016 |
| WO | WO 2017/066227 | 4/2017 |
| WO | WO 2017/070089 | 4/2017 |
| WO | WO 2017/079694 | 5/2017 |
| WO | WO 2017/079705 | 5/2017 |
| WO | WO 2017/106634 | 6/2017 |
| WO | WO 2017/118762 | 7/2017 |
| WO | WO 2017/167967 | 10/2017 |
| WO | WO 2017/176608 | 10/2017 |
| WO | WO 2017/192961 | 11/2017 |
| WO | WO 2017/202273 | 11/2017 |
| WO | WO 2017/202275 | 11/2017 |
| WO | WO 2017/202276 | 11/2017 |
| WO | WO 2017/205464 | 11/2017 |
| WO | WO 2017/222593 | 12/2017 |
| WO | WO 2018/005374 | 1/2018 |
| WO | WO 2018/006795 | 1/2018 |
| WO | WO 2018/009505 | 1/2018 |
| WO | WO 2018/013789 | 1/2018 |
| WO | WO 2018/026971 | 2/2018 |
| WO | WO 2018/044963 | 3/2018 |
| WO | WO 2018/045142 | 3/2018 |
| WO | WO 2018/051254 | 3/2018 |
| WO | WO 2018/051255 | 3/2018 |
| WO | WO 2018/140725 | 8/2018 |
| WO | WO 2019/008152 | 1/2019 |
| WO | WO 2019/008154 | 1/2019 |

(56) References Cited

FOREIGN PATENT DOCUMENTS

WO WO 2019/023575 1/2019
WO WO 2019/030757 2/2019
WO WO 2019/079564 4/2019
WO WO 2019/160501 8/2019
WO WO 2019/160956 8/2019
WO WO 2020/055040 3/2020
WO WO 2020/069409 4/2020
WO WO 2020/096646 5/2020
WO WO 2020/097346 A1 5/2020
WO WO 2020/101361 5/2020
WO WO 2021/071962 4/2021
WO WO 2021/218947 11/2021
WO WO 2021/235894 11/2021
WO WO 2022/133056 6/2022
WO WO 2022/133057 6/2022
WO WO 2022/133061 6/2022
WO WO 2022/204244 9/2022
WO WO 2022/216144 10/2022
WO WO 2022/216811 10/2022
WO WO 2022/216813 10/2022
WO WO 2022/216815 10/2022
WO WO 2022/216826 10/2022
WO WO 2022/216831 10/2022
WO WO 2022/216837 10/2022
WO WO 2023/080895 5/2023
WO WO 2023/081317 5/2023
WO WO 2024/040135 2/2024
WO WO 2024/119126 6/2024
WO WO 2024/238582 A2 11/2024
WO WO 2024/243058 A1 11/2024
WO WO 2024/254507 A2 12/2024
WO WO 2024/259070 A2 12/2024

OTHER PUBLICATIONS

Ataca et al., Chimeric Antigen Receptor T Cell Therapy in Hematology Turk J Hematol 2015;32:285-294.*
Gacerez, et al., How Chimeric Antigen Receptor Design Affects Adoptive T Cell Therapy; J. Cell. Physiol. 231: 2590-2598, 2016.*
Jena, Blood 2010, 116 No. 7, 1035-1044.*
Sadelain, Cancer Discovery, vol. 3, No. 4, pp. 388 to 398, Apr. 2013 (Year: 2013).*
Stephan, Nature Medicine, vol. 13, No. 12, pp. 1440 to 1449, Nov. 18, 2007, plus supplement (Year: 2007).*
Andarini, Can Res 64, pp. 3281 to 3287, May 1, 2004 (Year: 2004).*
U.S. Appl. No. 18/298,310, Lee et al., filed Apr. 10, 2023.
U.S. Appl. No. 16/764,276, Lee et al., filed Sep. 28, 2020.
U.S. Appl. No. 16/881,650, Lee et al., filed May 22, 2020.
Akiyama et al., "The product of the human c-erbB-2 gene: a 185-kilodalton glycoprotein with tyrosine kinase activity," Science, Jun. 27, 1986, 232(4758):1644-1646.
Altschul et al., "Basic local alignment search tool," Journal of Molecular Biology, Oct. 5, 1990, 215(3):403-410.
Arteaga et al., "p185c-erbB-2 Signaling Enhances Cisplatin-induced Cytotoxicity in Human Breast Carcinoma Cells: Association between an Oncogenic Receptor Tyrosine Kinase and Drug-induced DNA Repair," Cancer Research, Jul. 1994, 54:3758-3765.
Bacus et al., "Differentiation of cultured human breast cancer cells (AU-565 and MCF-7) associated with loss of cell surface HER-2/neu antigen," Molecular Carcinogenesis, 1990, 3:350-362.
Bacus et al., "Tumor-inhibitory Monoclonal Antibodies to the HER-2/Neu Receptor Induce Differentiation of Human Breast Cancer Cells," Cancer Research, May 1992, 52:2580-2589.
Bussolati et al., "A modified Trastuzumab antibody for the immunohistochemical detection of HER-2 overexpression in breast cancer," British Journal of Cancer, Apr. 5, 2005, 92:1261-1267.
Corpet, "Multiple sequence alignment with hierarchical clustering," Nuc. Acids Res., Nov. 25, 1988, 16(22):10881-10890.
Glazyrin et al., "Direct Detection of Herceptin/Transtuzumab Binding on Breast Tissue Sections," J Histology & Cytochemistry, 2007, 55(1):25-33.
Hancock et al., "A Monoclonal Antibody against the c-erbB-2 Protein Enhances the Cytotoxicity of cis-Diamminedichloroplatinum against Human Breast and Ovarian Tumor Cell Lines," Cancer Res., Sep. 1, 1991, 51:4575-4580.
Harwerth et al., "Monoclonal Antibodies against the Extracellular Domain of erbB-2 Receptor Fuction as Partial Lgand Agonists," J Biol. Chem., Jul. 25, 1992, 267(21):15160-15167.
Higgins et al., "CLUSTAL: a packate for performing multiple sequence alignment on a microcomputer," Gene, 1988, 73:237-244.
Higgins et al., "Fast and sensitive multiple sequence alignments on a microcomputer," Cabios Commuications, 1989, 5(2):151-153.
Hu et al., "Epitope mapping and structural analysis of an anti-ErbB2 antibody A21: Molecular basis for tumor inhibitory mechanism," Proteins, Feb. 15, 2008, 70(3):938-949.
Huang et al., "Parallelization of a local similarity algorithm," Cabios, 1992, 8(2):155-165.
Kasprzyk et al., "Therapy of an Animal Model of Human Gastric Cancer Using a Combination of Anti-erbB-2 Monoclonal Antibodies," Cancer Research, May 15, 1992, 52:2771-2776.
Klapper et al., "A subclass of tumor inhibitory monoclonal antibodies to ErbB-2/HER2 blocks crosstalk with growth factor receptors," Oncogene, Jan. 1997 , 14:2099-2109.
Maier et al., "Requirements for the Internalization of a Murine Monoclonal Antibody Directed against the HER-2/neu Gene Product c-erbB-2," Cancer Res., Oct. 1, 1991, 51:5361-5369.
Nahta et al., "The HER-2-Targeting Antibodies Transtuzumab and Pertuzumab Synergistically Inhibit the Survival of Breast Cancer Cells", Cancer Research, Apr. 2004, 64(7): 2343-2346.
Needleman et al., "A General Method Applicable to the Search for Similarities in the Amino Acid Sequence of Two Proteins," J Mol. Biol, 1970, 48:443-453.
Rockberg et al., "Discovery of epitopes for targeting the human epidermal growth factor receptor 2 (HER2) with antibodies," Molecular Oncology, Jun. 2009, 3(3):238-247.
Ross et al., "The HER-2/neu Gene and Protein in Breast Cancer2003: Biomarker and Target of Therapy," The Oncologist, 2003, 8(4):307-325, 19 pages.
Sapino et al., "Patients with advanced stage breast carcinoma immunoreactive to biotinylated Herceptin® are most likely to benefit from trastuzumab-based therapy: an hypothesis-generating study," Annals of Oncology, Dec. 2007, 18(12):1963-1968, 6 pages.
Shawver et al., "Ligand-like Effects Induced by Anti-c-erbB-2 Antibodies do not Correlate with and are not Required for Growth Inhibition of Human Carcinoma Cells," Cancer Res., Mar. 1, 1994, 54:1367-1373.
Smith et al., "Comparison of biosequences," Adv. Appl. Math, Dec. 1981, 2(4):482-489.
Stancovski et al., "Mechanistic aspects of the opposing effects of monoclonal antibodies to the ERBB2 receptor on tumor growth," PNAS USA, Oct. 1, 1991, 88(19):8691-8695.
Sun et al., "Construction and evaluation of a novel humanized HER2-specific chimeric receptor," Breast Cancer Research, Jun. 11, 2014, 16:R61, 10 Pages.
Tagliabue et al., "Selection of monoclonal antibodies which induce internalization and phosphorylation of P185HER2 and growth inhibition of cells with HER2/neu gene amplification," Int. J Cancer, Apr. 1, 1991, 47(6):933-937.
Uhlman et al., "Antisense oligonucleotides: a new therapeutic principle," Chemical Reviews, Jun. 1, 1990, 90(4):543-584.
Xu et al., "Antibody-induced growth inhibition is mediated through immunochemically and functionally distinct epitopes on the extracellular domain of the c-erbb-2 (her-2/neu) gene product p185," Int. J Cancer, Feb. 1, 1993, 53:401-408.
Yamashita-Kashima et al., "Pertuzumab in Combination with Trastuzumab Shows Significantly Enhanced Antitumor Activity in HER2-Positive Human Gastric Cancer Xenograft Models", Clinical Cancer Research, Jun. 2011, 17(15):5060-5071.
Croft et al., "Regulation of T Cell Immunity by OX40 and OX40L," Madame Curie Bioscience Database, 2000-2013, retrieved on Jan. 12, 2022, retrieved from URL <"https://www.ncbi.nlm.nih.gov/books/NBK5990/">, 12 pages.
Crossland, "CD56-Specific T Cells; Using Genetically Engineered T Cells to Redirect Specificty to a T Cell Expressed Antigen"

(56) References Cited

OTHER PUBLICATIONS

Dissertation for the degree of PhD, The University of Texas MD Anderson Cancer Center UTHealth Graduate School of Biomedical Sciences, Aug. 2014, 232 pages.
Extended European Search Report in European Appln. No. 17886739.6, dated Jul. 29, 2020, 12 pages.
Gacerez et al., "How chimeric antigen receptor design affects adoptive T cell therapy" J. Cell Physiol., Dec. 2016, 231(12):2590-2598.
GenBank Accession No. AB590584.1, "Synthetic construct DNA, clone: pFN21AE1768, *Homo sapiens* TNFRSF4 gene for tumor necrosis factor receptor superfamily, member 4, without stop codon, in Flexi system," Jul. 25, 2016, 2 pages.
GenBank Accession No. AF461811.1, "*Homo sapiens* NKG2D mRNA, complete cds" Jan. 17, 2002, 2 pages.
GenBank Accession No. N_000734.3, "*Homo sapiens* CD247 molecule (CD247), transcript variant 2, mRNA" Mar. 15, 2015, 5 pages.
GenBank Accession No. NM_001561.5, "*Homo sapiens* tumor necrosis factor receptor superfamily member 9 (TNFRSF9), mRNA" Nov. 20, 2015, 5 pages.
GenBank Accession No. NM_001768.6, "*Homo sapiens* CD8a molecule (CD8A), transcript variant 1, Mrna," Mar. 15, 2015, 4 pages.
GenBank Accession No. NM_003326.4, "*Homo sapiens* TNF superfamily member 4 (TNFSF4), transcript variant 1, mRNA" Nov. 21, 2015, 4 pages.
GenBank Accession No. NM_006139.3, "*Homo sapien*CD28 molecule (CD28), transcript variant 1, mRNA," Mar. 15, 2015, 5 pages.
GenBank Accession No. X52645.1 "Human Fc-gamma RIII-2 cDNA for Fc-gamma receptor III-2 (CD16)," Oct. 7, 2008, 2 pages.
International Preliminary Report on Patentability in International Appln. No. PCT/KR2017/015635, dated Jul. 2, 2019, 7 pages.
International Search Report and Written Opinion in International Appln. No. PCT/KR2017/015635, dated Oct. 29, 2018, 7 pages.
Office Action in Chinese Appln No. 201780081622.3, dated Jun. 23, 2022, 19 pages (with English translation).
Office Action in European Appln. No. 17886739.6, dated Apr. 14, 2022, 8 pages.
Office Action in Indian Appln. No. 201947029640, dated Mar. 30, 2022, 8 pages.
Office Action in Japanese Appln. No. 2019-536074, dated Feb. 24, 2021, 6 pages (with English translation).
Office Action in Japanese Appln. No. 2019-536074, dated Jul. 30, 2020, 12 pages (with English translation).
Sadelain et al., "The Basic Principles of Chimeric Antigen Receptor Design," Cancer Discovery, Apr. 2013, 3:388-398.
Webb et al., "OX40, OX40L and Autoimmunity: a Comprehensive Review," Clinic Rev. Allerg. Immunol., 2016, 50: 312-332.
Wilkie et al., "Retargeting of Human T Cells to Tumor-Associated MUC1: The Evolution of a Chimeric Antigen Receptor," The Journal of Immunology, 2008, 180:4901-9.
U.S. Appl. No. 18/285,631, Hwang et al., Oct. 4, 2023.
U.S. Appl. No. 18/285,634, Kim et al., Oct. 4, 2023.
U.S. Appl. No. 18/285,636, Lim et al., Oct. 4, 2023.
Abou-Alfa et al., "Randomized phase II placebo controlled study of codrituzumab in previously treated patients with advanced hepatocellular carcinoma," J. Hepatol., Aug. 2016, 65(2):289-95.
Agus et al., "Phase I clinical study of pertuzumab, a novel HER dimerization inhibitor, in patients with advanced cancer," J. Clin. Oncol., Apr. 10, 2005, 23(11):2534-43.
Alizadeh et al., "IL15 Enhances CAR-T Cell Antitumor Activity by Reducing mTORC1 Activity and Preserving Their Stem Cell Memory Phenotype," Cancer Immunology Research, May 2019, 7(5):759-772.
Altschul et al., "Basic local alignment search tool," J. Mol. Biol., Oct. 5, 1990, 215(3):403-410.
Andre et al., "Anti-NKG2A mAb is a Checkpoint Inhibitor that Promotes Anti-tumor Immunity by Unleashing Both T and NK Cells," Cell. Dec. 13, 2018;175(7):1731-1743.
Awada et al., "Abstract No. 2504: Results from a first-in-man, open label, safety and tolerability trial of CAN04 (nidanilimab), a fully humanized monoclonal antibody against the novel antitumor target, IL1RAP, in patients with solid tumors," Presented at ASCO 2019, Chicago, Illinois, May 31-Jun. 4, 2019, 14 pages.
Babic et al., "Pritumumab, the first therapeutic antibody for glioma patients," Hum Antibodies, Feb. 5, 2018, 26(2):95-101.
Baldo et al., "Amatuximab and novel agents targeting mesothelin for solid tumors," Onco Targets Ther., Nov. 2017, 10:5337-5353.
Bang et al., "First-in-human phase 1 study of margetuximab (MGAH22), an Fc-modified chimeric monoclonal antibody, in patients with HER2-positive advanced solid tumors," Ann. Oncol., Apr. 2017, 28(4):855-861.
Bauman et al., "Phase I Study of Ficlatuzumab and Cetuximab in Cetuximab-Resistant, Recurrent/Metastatic Head and Neck Cancer.," Cancers, Jun. 11, 2020, 12(6):1537.
Bhati et al., "Efficacy and safety of an anti-CD 20 monoclonal antibody (Reditux™) for the treatment of patients with moderate to severe rheumatoid arthritis following the failure of conventional synthetic disease-modifying anti-rheumatic drugs," Clin. Rheumatol., Aug. 2016, 35(8):1931-1935.
Bilusic et al., "Phase I trial of HuMax-IL8 (BMS-986253), an anti-IL-8 monoclonal antibody, in patients with metastatic or unresectable solid tumors," J. Immunother. Cancer, Sep. 5, 2019, 7(1):240.
Bobkov et al., "Antibodies targeting chemokine receptors CXCR4 and ACKR3," Mol. Pharmacol., Dec. 2019, 96(6):753-764.
Brunker et al., "RG7386, a novel tetravalent FAP-DR5 antibody, effectively triggers FAP-dependent, avidity-driven DR5 hyperclustering and tumor cell apoptosis," Mol. Cancer Ther., May 2016, 15(5):946-57.
Burge et al., "Pharmacokinetic and pharmacodynamic properties of TRU-015, a CD20-directed small modular immunopharmaceutical protein therapeutic, in patients with rheumatoid arthritis: a Phase I, open-label, dose-escalation clinical study," Clin. Ther., Oct. 2008, 30(10):1806-1816.
Casulo et al., "A phase I study of PRO131921, a novel anti-CD20 monoclonal antibody in patients with relapsed/refractory CD20+ indolent NHL: correlation between clinical responses and AUC pharmacokinetics," Clin. Immunol. , Sep. 2014, 154(1):37-46.
Catenacci et al., "Phase I escalation and expansion study of bemarituzumab (FPA144) in patients with advanced solid tumors and FGFR2b-selected gastroesophageal adenocarcinoma.," J. Clin. Oncol., Jul. 20, 2020, 38(21):2418-2426.
Cerutti et al., "Physicochemical and biological characterization of RTXM83, a new rituximab biosimilar," BioDrugs, Jun. 2019, 33(3):307-319.
Chamie et al., "Adjuvant weekly girentuximab following nephrectomy for high-risk renal cell carcinoma: the ARISER randomized clinical trial," JAMA Oncol., Jul. 2017, 3(7):913-920.
Chen et al., "IGF-1R as an anti-cancer target—trials and tribulations," Chinese Journal of Cancer, May 2013, 32(5):242-252.
Cheney et al., "Ocaratuzumab, an Fc-engineered antibody demonstrates enhanced antibody-dependent cell-mediated cytotoxicity in chronic lymphocytic leukemia," MAbs, May-Jun. 2014, 6(3):749-55.
Cheng et al., "Safety and efficacy of tigatuzumab plus sorafenib as first-line therapy in subjects with advanced hepatocellular carcinoma: a phase 2 randomized study," J. Hepatol., Oct. 2015, 63(4):896-904.
Cho et al., "Antitumor activity of MEDI3726 (ADCT-401), a pyrrolobenzodiazepine antibody-drug conjugate targeting PSMA, in preclinical models of prostate cancer," Mol Cancer Ther., Oct. 2018, 17(10):2176-2186.
Choi et al., "Phase I Trial: Cirmtuzumab Inhibits ROR1 Signaling and Stemness Signatures in Patients with Chronic Lymphocytic Leukemia," Cell Stem Cell, Jun. 2018, 22(6):951-959.
D'Angelo et al., "A phase 2 study of ontuxizumab, a monoclonal antibody targeting endosialin, in metastatic melanoma," Invest. New Drugs, Feb. 2018, 36(1):103-113.
Dalili et al., "A Review of Sorting, Separation and Isolation of Cells and Microbeads for Biomedical Applications: Microfluidic Approaches," Analyst, 2019, 144:87-113.

(56) References Cited

OTHER PUBLICATIONS

Damjanov et al., "Safety and efficacy of SBI-087, a subcutaneous agent for B cell depletion, in patients with active rheumatoid arthritis: results from a phase II randomized, double-blind, placebo-controlled study," J. Rheumatol., Dec. 2016, 43(12):2094-2100.
De Bono et al., "Phase I trial of a murine antibody to MUC1 in patients with metastatic cancer: evidence for the activation of humoral and cellular antitumor immunity," Ann Oncol., Dec. 2004, 15(12):1825-33.
De Weers et al., "Daratumumab, a novel therapeutic human CD38 monoclonal antibody, induces killing of multiple myeloma and other hematological tumors," J. Immunol., Feb. 2011, 186(3):1840-1848.
Du et al., "Next-generation anti-CD20 monoclonal antibodies in autoimmune disease treatment," Autoimmunity Highlights, Dec. 2017, 8(1):1-2.
Forero et al., "First-in-human study of the antibody DR5 agonist DS-8273a in patients with advanced solid tumors," Invest New Drugs, Jan. 3, 2017, 35(3):298-306.
Fox et al., "A phase 2 multicenter study of ublituximab, a novel glycoengineered anti-CD20 monoclonal antibody, in patients with relapsing forms of multiple sclerosis," Mult. Scler., Mar. 2021, 27(3):420-429.
Fulciniti et al., "Anti-DKK1 mAb (BHQ880) as a potential therapeutic agent for multiple myeloma," Blood, Jul. 9, 2009, 114(2):371-9.
Garcia et al., "Bevacizumab (Avastin®) in cancer treatment: A review of 15 years of clinical experience and future outlook," Cancer Treat Rev., Jun. 2020, 86:102017.
Genovese et al., "Ocrelizumab, a humanized anti-CD20 monoclonal antibody, in the treatment of patients with rheumatoid arthritis: a phase I/II randomized, blinded, placebo-controlled, dose-ranging study," Arthritis Rheum., Sep. 2008, 58(9):2652-61.
Geoghegan et al., "Inhibition of CD73 AMP hydrolysis by a therapeutic antibody with a dual, non-competitive mechanism of action," MAbs, Apr. 2, 2016, 8(3):454-67.
Gibson et al., "Randomized Phase III Trial Results of Panitumumab, a Fully Human Anti-Epidermal Growth Factor Receptor Monoclonal Antibody, in Metastatic Colorectal Cancer," Clin Colorectal Cancer, May 1, 2006, 6(1):29-31.
Gilbert et al., "Effect of CC chemokine receptor 2 CCR2 blockade on serum C-reactive protein in individuals at atherosclerotic risk and with a single nucleotide polymorphism of the monocyte chemoattractant protein-1 promoter region," Am. J. Cardiol., Mar. 15, 2011, 107(6):906-11.
Golan et al., "LY2495655, an antimyostatin antibody, in pancreatic cancer: a randomized, phase 2 trial," J. Cachexia Sarcopenia Muscle, Oct. 2018, 9(5):871-879.
Gold et al., "Mapping PAM4 (clivatuzumab), a monoclonal antibody in clinical trials for early detection and therapy of pancreatic ductal adenocarcinoma, to MUC5AC mucin," Molecular Cancer, Dec. 2013, 12(143):1-8.
Goldenberg, "Trastuzumab, a recombinant DNA-derived humanized monoclonal antibody, a novel agent for the treatment of metastatic breast cancer," Clin. Ther., Feb. 1999, 21(2):309-18.
Gross et al., "Five-Year Outcomes of Panretinal Photocoagulation vs Intravitreous Ranibizumab for Proliferative Diabetic Retinopathy: A Randomized Clinical Trial," JAMA Ophthalmol., Oct. 2018, 136(10):1138-1148.
Gupta et al., "Targeting CA 19-9 with a humanized monoclonal antibody at the time of surgery may decrease recurrence rates for patients undergoing resections for pancreatic cancer, cholangiocarcinoma and metastatic colorectal cancer," J. Gastrointest. Oncol., Apr. 2020, 11(2):231-235.
Hammer et al., "Preclinical Efficacy of a PSMA-Targeted Thorium-227 Conjugate (PSMA-TTC), a Targeted Alpha Therapy for Prostate Cancer," Clin. Cancer Res., Apr. 15, 2020, 26(8):1985-1996.
Hashimoto et al., "A novel HER3-targeting antibody-drug conjugate, U3-1402, exhibits potent therapeutic efficacy through the delivery of cytotoxic payload by efficient internalization," Clin. Cancer Res., Dec. 2019, 25(23):7151-7161.
Hassan et al., "First-in-human, multicenter, phase I dose-escalation and expansion study of anti-mesothelin antibody-drug conjugate anetumab ravtansine in advanced or metastatic solid tumors," J. Clin. Oncol., Jun. 6, 2020, 38(16):1824-1835.
Hassan et al., "Mesothelin immunotherapy for cancer: ready for prime time?," J. Clin. Oncol., Dec. 12, 2016, 34(34):4171-4179.
Hensel et al., "Early development of PAT-SM6 for the treatment of melanoma," Melanoma Res., Aug. 2013, 23(4):264-75.
Hernandez-Hoyos et al., "MOR209/ES414, a novel bispecific antibody targeting PSMA for the treatment of metastatic castration-resistant prostate cancer," Mol. Cancer Ther., Sep. 2016, 15(9):2155-2165.
Hersey et al., "A randomized phase 2 study of etaracizumab, a monoclonal antibody against integrin alpha(v)beta(3), + or − dacarbazine in patients with stage IV metastatic melanoma," Cancer, Mar. 15, 2010, 116(6):1526-1534.
Heublin et al., "Potential interplay of the gatipotuzumab epitope TA-MUC1 and estrogen receptors in ovarian cancer," Int. J. Mol. Sci., Jan. 12, 2019, 20(2):295.
Hosseini et al., "Mitigating the risk of cytokine release syndrome in a Phase I trial of CD20/CD3 bispecific antibody mosunetuzumab in NHL: impact of translational system modeling," NPJ Syst. Biol. Appl., Aug. 28, 2020,6(1):28.
Hoy, "Dinutuximab: A Review in High-Risk Neuroblastoma," Target Oncol., Apr. 2016, 11(2):247-53.
Hoy, "Tafasitamab: first approval," Drugs, Nov. 2020, 80(16):1731-1737.
Huang et al., "The CD20-specific engineered toxin antibody MT-3724 exhibits lethal effects against mantle cell lymphoma," Blood Cancer J., Mar. 20, 2018, 8(3):33.
Hudecek et al., "Going Non-Viral: The Sleeping Beauty Transposon System Breaks on Through to the Clinical Side," Critical Reviews in Biochemistry and Molecular Biology, Jul. 4, 2017, 52(4):355-380.
Hughes et al., "Have Clinical Trials Properly Assessed c-Met Inhibitors?," Trends Cancer, Feb. 2018, 4(2):94-97.
Hummel et al., "Pasotuxizumab, a BiTE® immune therapy for castration-resistant prostate cancer: Phase I, dose-escalation study findings," Immunotherapy, Feb. 2021, 13(2):125-141.
Jiang et al., "Abituzumab targeting of αV-class integrins inhibits prostate cancer progression," Mol. Cancer Res., Jul. 2017, 15(7):875-883.
Jiang et al., "Pharmacokinetics and safety of IBI301 versus rituximab in patients with CD20+ B-cell lymphoma: a multicenter, randomized, double-blind, parallel-controlled study," Sci. Rep., Jul. 15, 2020, 10(1):11676.
Jonker et al., "Cetuximab for the treatment of colorectal cancer," N. Engl. J. Med., Nov. 15, 2007,357(20):2040-2048.
Kang et al., "Drozitumab, a human antibody to death receptor 5, has potent antitumor activity against rhabdomyosarcoma with the expression of caspase-8 predictive of response," Clin. Cancer Res., May 15, 2011, 17(10):3181-92.
Kappos et al., "Ocrelizumab in relapsing-remitting multiple sclerosis: a phase 2, randomised, placebo-controlled, multicentre trial," Lancet., Nov. 19, 2011, 378(9805):1779-87.
Kim et al., "First-in-Human Phase I Study of Aprutumab Ixadotin, a Fibroblast Growth Factor Receptor 2 Antibody-Drug Conjugate (BAY 1187982) in Patients with Advanced Cancer," Target Oncol., Oct. 2019, 14(5):591-601.
Kim et al., "Phase II study of ensituximab, a novel chimeric monoclonal antibody, in adults with unresectable, metastatic colorectal cancer," Clin. Cancer Res., Jul. 15, 2020, 26(14):3557-3564.
Koene et al., "FcγRIIIa-158V/F Polymorphism Influences the Binding of IgG by Natural Killer Cell FcγRIIIa, Independently of the FcγRIIIa-48L/R/H Phenotype," Blood, Aug. 1997, 90(3):1109-1114.
Kuenen et al., "A phase I pharmacologic study of necitumumab (IMC-11F8), a fully human IgG1 monoclonal antibody directed against EGFR in patients with advanced solid malignancies," Clin. Cancer Res., Mar. 15, 2010, 16(6):1915-23.

(56) References Cited

OTHER PUBLICATIONS

Leary et al., "Abstract No. 2521: First-in-human first-in-class phase I trial of murlentamab, an anti-Mullerian-hormone receptor II (AMHRII) monoclonal antibody acting through tumor-associated macrophage (TAM) engagement, as single agent and in combination with carboplatin (C) and paclitaxel (P) in AMHRII-expressing advanced/metastatic gynecological cancer patients (pts)," Presented at ASCO 2019, Chicago, Illinois, May 31-Jun. 4, 2019; Journal of Clinical Oncology, May 20, 2019, 37,(15_suppl.), 4 pages.
Lee et al., "Preclinical pharmacokinetics, interspecies scaling, and pharmacokinetics of a Phase I clinical trial of TTAC-0001, a fully human monoclonal antibody against vascular endothelial growth factor 2," Drug Des. Devel. Ther., Mar. 8, 2018, 12:495-504.
Liu et al., "Identification of PAM4 (clivatuzumab)-reactive epitope on MUC5AC: a promising biomarker and therapeutic target for pancreatic cancer," Oncotarget., Feb. 28, 2015, 6(6):4274-85.
Liu et al., "Phase I study of safety and pharmacokinetics of the anti-MUC16 antibody-drug conjugate DMUC5754A in patients with platinum-resistant ovarian cancer or unresectable pancreatic cancer," Ann. Oncol., Nov. 2016, 27(11):2124-2130.
Liu et al., "Use of CAR-Transduced Natural Killer Cells in CD19-Positive Lymphoid Tumors," N. Engl. J. Med., Feb. 6, 2020, 382(6):545-553.
Lonial et al., "Elotuzumab Therapy for Relapsed or Refractory Multiple Myeloma," N. Engl. J. Med., Aug. 13, 2015, 373(7):621-631.
Lord et al., "Structure-based engineering to restore high affinity binding of an isoform-selective anti-TGFβ1 antibody," MAbs., Apr. 2018, 10(3):444-452.
LoRusso et al., "Icrucumab, a fully human monoclonal antibody against the vascular endothelial growth factor receptor-1, in the treatment of patients with advanced solid malignancies: a Phase 1 study," Invest. New. Drugs, Apr. 2014, 32(2):303-11.
Mahalingham et al., "Phase I study of imalumab (BAX69), a fully human recombinant antioxidized macrophage migration inhibitory factor antibody in advanced solid tumours," Br. J. Clin. Pharmacol., Sep. 2020, 86(9):1836-1848.
Marcus et al., "Obinutuzumab for the First-Line Treatment of Follicular Lymphoma," N. Engl. J. Med., Oct. 5, 2017, 377(14):1331-1344.
Markham, "Naxitamab: First Approval," Drugs, Feb. 2021, 81(2):291-296.
Martin et al., "Phase I trial of isatuximab monotherapy in the treatment of refractory multiple myeloma," Blood Cancer J., Mar. 29, 2019, 9(4):41, 10 pages.
Martinsson-Niskanen et al., "Monoclonal antibody TB-403: a first-in-human, Phase I, double-blind, dose escalation study directed against placental growth factor in healthy male subjects," Clin. Ther., Sep. 2011, 33(9):1142-9.
Milone et al., "Clinical Use of Lentiviral Vectors," Leukemia, Jul. 2018, 32(7):1529-41.
Musolino et al., "Immunoglobulin G Fragment C Receptor Polymorphisms and Clinical Efficacy of Trastuzumab-Based Therapy in Patients with HER-2/*neu*-Positive Metastatic Breast Cancer," J. Clin. Oncol., Apr. 10, 2008, 26(11):1789-1796.
Nadafi et al., "Anti-CD19 Monoclonal Antibodies: A New Approach to Lymphoma Therapy," Int. J. Mol. Cell Med., 2015, 4(3):143-151.
Niederwieser et al., "Efficacy and Safety of ABP 798: Results from the JASMINE Trial in Patients with Follicular Lymphoma in Comparison with Rituximab Reference Product," Target Oncol., Oct. 2020, 15(5):599-611.
O'Day et al., "A randomised, phase II study of intetumumab, an anti-αv-integrin mAb, alone and with dacarbazine in stage IV melanoma," Br. J. Cancer, Jul. 26, 2011, 105(3):346-52.
Okamoto et al., "TAK-701, a humanized monoclonal antibody to hepatocyte growth factor, reverses gefitinib resistance induced by tumor-derived HGF in non-small cell lung cancer with an EGFR mutation," Mol. Cancer Ther., Oct. 2010, 9(10):2785-92.
Overdijk et al., "Dual Epitope Targeting and Enhanced Hexamerization by DR5 Antibodies as a Novel Approach to Induce Potent Antitumor Activity Through DR5 Agonism," Mol. Cancer Ther., Oct. 2020, 19(10):2126-2138.
Petrylak et al., "PSMA ADC monotherapy in patients with progressive metastatic castration-resistant prostate cancer following abiraterone and/or enzalutamide: Efficacy and safety in open-label single-arm phase 2 study," Prostate, Jan. 2020, 80(1):99-108.
Piloto et al., "IMC-EB10, an anti-FLT3 monoclonal antibody, prolongs survival and reduces nonobese diabetic/severe combined immunodeficient engraftment of some acute lymphoblastic leukemia cell lines and primary leukemic samples," Cancer Res., May 2006, 66(9):4843-51.
Plummer et al., "Phase 1 and pharmacokinetic study of lexatumumab in patients with advanced cancers," Clin. Cancer Res., Oct. 15, 2007, 13(20):6187-94.
Poddubnaya et al., "Proposed rituximab biosimilar BCD-020 versus reference rituximab for treatment of patients with indolent non-Hodgkin lymphomas: An international multicenter randomized trial," Hematol. Oncol., Feb. 2020, 38(1):67-73.
Pognan et al., "Colony-stimulating factor-1 antibody lacnotuzumab in a phase 1 healthy volunteer study and mechanistic investigation of safety outcomes.," J Pharmacol Exp Ther., Jun. 2019, 369(3):428-442.
Ponath et al., "A Novel, Fully Human Anti-fucosyl-GM1 Antibody Demonstrates Potent In Vitro and In Vivo Antitumor Activity in Preclinical Models of Small Cell Lung Cancer," Clin Cancer Res., Oct. 15, 2018, 24(20):5178-5189.
Pyo et al., "Different Patterns of Evolution in the Centromeric and Telomeric Regions of Group *A* and *B* Haplotypes of the Human Killer Cell Ig-like Receptor Locus," PLoS One, Dec. 29, 2010, 5(12)e15115:1-14.
Rice et al., "Fresolimumab treatment decreases biomarkers and improves clinical symptoms in systemic sclerosis patients," J Clin Invest., Jul. 2015, 125(7):2795-2807.
Sabbatini et al., "Abagovomab as maintenance therapy in patients with epithelial ovarian cancer: a phase III trial of the AGO OVAR, COGI, GINECO, and GEICO—the MIMOSA study," J Clin Oncol., Apr. 20, 2013, 31(12):1554-1561.
Salles et al., "Rituximab in B-Cell Hematologic Malignancies: A Review of 20 Years of Clinical Experience," Adv Ther., Oct. 2017, 34(10):2232-2273.
Sasikumar et al., "Peptide and Peptide-Inspired Checkpoint Inhibitors: Protein Fragments to Cancer Immunotherapy," Medicine in Drug Discovery, Dec. 2020, 8(100073):1-10.
Sato et al., "Profile of farletuzumab and its potential in the treatment of solid tumors," Onco Targets Ther., Mar. 7, 2016, 9:1181-1188.
Sawas et al., "A phase 1/2 trial of ublituximab, a novel anti-CD20 monoclonal antibody, in patients with B-cell non-Hodgkin lymphoma or chronic lymphocytic leukaemia previously exposed to rituximab," Br J Haematol., Apr. 2017, 177(2):243-253.
Segal et al., "Phase I Study of Single-Agent Utomilumab (PF-05082566), a 4-1BB/CD137 Agonist, in Patients with Advanced Cancer," Clin Cancer Res., Apr. 15, 2018, 24(8):1816-1823.
Segal et al., "Results from an Integrated Safety Analysis of Urelumab, an Agonist Anti-CD137 Monoclonal Antibody," Clin Cancer Res., Apr. 15, 2017, 23(8):1929-1936.
Sharman et al., "A Randomized, Double-Blind, Efficacy and Safety Study of PF-05280586 (a Rituximab Biosimilar) Compared with Rituximab Reference Product (MabThera®) in Subjects with Previously Untreated CD20-Positive, Low-Tumor-Burden Follicular Lymphoma (LTB-FL)," BioDrugs, Apr. 2020, 34(2):171-181.
Shi et al., "A phase 3 study of rituximab biosimilar HLX01 in patients with diffuse large B-cell lymphoma," J Hematol Oncol., Apr. 16, 2020, 13(1):38, 5 pages.
Simonelli et al., "Phase I study of PF-03446962, a fully human monoclonal antibody against activin receptor-like kinase-1, in patients with hepatocellular carcinoma," Ann Oncol., Sep. 2016, 27(9):1782-1787.
Smith and Waterman, "Identification of common molecular subsequences," J Mol Biol., Mar. 25, 1981, 147(1):195-197.
Smolen et al., "A randomised, double-blind trial to demonstrate bioequivalence of GP2013 and reference rituximab combined with

(56) References Cited

OTHER PUBLICATIONS methotrexate in patients with active rheumatoid arthritis," Ann Rheum Dis., Sep. 2017, 76(9):1598-1602.

Strouhalova et al., "Vimentin intermediate filaments as potential target for cancer treatment," Cancers, Jan. 11, 2020, 12(1):184.

Swords et al., "KB004, a first in class monoclonal antibody targeting the receptor tyrosine kinase EphA3, in patients with advanced hematologic malignancies: Results from a phase 1 study.," Leuk Res., Nov. 2016, 50:123-131.

Takebe et al., "Targeting Notch signaling pathway in cancer: clinical development advances and challenges," Pharmacol Ther., Feb. 2014, 141(2):140-149.

Tolcher et al., "A phase 1 study of anti-TGFβ receptor type-II monoclonal antibody LY3022859 in patients with advanced solid tumors," Cancer Chemother Pharmacol., Apr. 2017, 79(4):673-680.

Tolcher et al., "Cantuzumab mertansine, a maytansinoid immunoconjugate directed to the CanAg antigen: a phase I, pharmacokinetic, and biologic correlative study," J Clin Oncol., Jan. 15, 2003, 21(2):211-222.

U.S. Appl. No. 18/618,414, filed Mar. 27, 2024, Lee et al.

Abate-Daga et al., "CAR models: next-generation CAR modifications for enhanced T-cell function," Molecular Therapy—Oncolytics, Jan. 2016, 3(16014):1-7.

Bacigalupo et al., "Treatment of steroid resistant acute graft versus host disease with an anti-CD26 monoclonal antibody—Begelomab," Bone Marrow Transplant, Aug. 2020, 55(8):1580-1587.

Bajaj et al., "Conatumumab: a novel monoclonal antibody against death receptor 5 for the treatment of advanced malignancies in adults," Expert Opin. Biol. Ther., Nov. 2011, 11(11):1519-1524.

Bilen et al. "Association of Neutrophil-to-Lymphocyte Ratio with Efficacy of First-Line Avelumab plus Axitinib vs. Sunitinib in Patients with Advanced Renal Cell Carcinoma Enrolled in the Phase 3 JAVELIN Renal 101 Trial," Clin Cancer Res., Feb. 15, 2022, 28(4):738-747.

Carson et al., "A potential role for interleukin-15 in the regulation of human natural killer cell survival," The Journal of Clinical Investigation, Mar. 1, 1997, 99(5):937-943.

ClinicalTrials.gov [online], "64Cu-TLX592 Phase I Safety, PK, Biodistribution and Dosimetry Study (CUPID Study) (CUPID)," NCT04726033, Nov. 28, 2022, retrieved on Feb. 20, 2024, retrieved from URL: <https://clinicaltrials.gov/study/NCT04726033>, 26 pages.

ClinicalTrials.gov [online], "A Dose Escalation Study of Glofitamab (RO7082859) as a Single Agent and in Combination With Obinutuzumab After a Fixed, Single Pre-Treatment Dose of Obinutuzumab in Participants With Relapsed/Refractory B-Cell Non-Hodgkin's Lymphoma," NCT03075696, Jan. 30, 2024, retrieved on Feb. 16, 2024, retrieved from URL: <https://clinicaltrials.gov/study/NCT03075696>, 41 pages.

ClinicalTrials.gov [online], "A Double-blind, Randomized Controlled Study in CD20-positive Diffuse B Cell Non-Hodgkin's Lymphoma Subjects," NCT01205737, Oct. 22, 2013, retrieved on Feb. 16, 2024, retrieved from URL: <https://clinicaltrials.gov/study/NCT01205737>, 22 pages.

ClinicalTrials.gov [online], "A First-in-human Study of the Safety, Pharmacokinetics, Pharmacodynamics and Anti-tumor Activity of SAR439459 Monotherapy and Combination of SAR439459 and Cemiplimab in Patients With Advanced Solid Tumors," NCT03192345, May 12, 2022, retrieved on Feb. 16, 2024, retrieved from URL: <https://clinicaltrials.gov/study/NCT03192345>, 37 pages.

ClinicalTrials.gov [online], "A Phase 1 Study of the Clinical and Immunologic Effects of ALT-803 in Patients With Advanced Solid Tumors," NCT01946789, Apr. 17, 2019, retrieved on Feb. 16, 2024, retrieved from URL: <https://clinicaltrials.gov/study/NCT01946789>, 23 pages.

ClinicalTrials.gov [online], "A Phase I Dose-Escalation Study of IMGN388 in Patients With Solid Tumors," NCT00721669, Sep. 13, 2013, retrieved on Feb. 8, 2024, retrieved from URL: <https://clinicaltrials.gov/study/NCT00721669>, 21 pages.

ClinicalTrials.gov [online], "A Phase I Pilot Study Comparing 123I MIP 1072 Versus 111In Capromab Pendetide in Subjects With Metastatic Prostate Cancer," NCT00992745, Oct. 12, 2011, retrieved on Feb. 8, 2024, retrieved from URL: <https://clinicaltrials.gov/study/NCT00992745>, 23 pages.

ClinicalTrials.gov [online], "A Phase I Study of Intravenous CO-H01 in Patients With Refractory or Relapsed Follicular Lymphoma," NCT03221348, Jan. 24, 2018, retrieved on Feb. 16, 2024, retrieved from URL: <https://clinicaltrials.gov/study/NCT03221348>, 22 pages.

ClinicalTrials.gov [online], "A Phase I Study of Lintuzumab-Ac225 in Patients With Refractory Multiple Myeloma," NCT02998047, Mar. 8, 2022, retrieved on Feb. 16, 2024, retrieved from URL: <https://clinicaltrials.gov/study/NCT02998047>, 25 pages.

ClinicalTrials.gov [online], "A Randomized, Double-blind, Multicenter, Multi-national Trial to Evaluate the Efficacy, Safety, and Immunogenicity of SAIT101 Versus Rituximab as a First-line Immunotherapy Treatment in Patients With Low Tumor Burden Follicular Lymphoma (RAMO-2)," NCT02809053, Oct. 8, 2020, retrieved on Feb. 16, 2024, retrieved from URL: <https://clinicaltrials.gov/study/NCT02809053>, 68 pages.

ClinicalTrials.gov [online], "A Safety and Tolerability Study of NC318 in Subjects With Advanced or Metastatic Solid Tumors," NCT03665285, Dec. 26, 2023, retrieved on Feb. 16, 2024, retrieved from URL: <https://clinicaltrials.gov/study/NCT03665285>, 29 pages.

ClinicalTrials.gov [online], "A Study Comparing GB241 and Rituximab in Patients With B-cell Non-Hodgkin's Lymphoma," NCT03003039, Mar. 23, 2021, retrieved on Feb. 16, 2024, retrieved from URL: <https://clinicaltrials.gov/study/NCT03003039>, 20 pages.

ClinicalTrials.gov [online], "A Study Evaluating the Safety and Pharmacokinetics of DMUC4064A in Participants With Platinum-Resistant Ovarian Cancer or Unresectable Pancreatic Cancer," NCT02146313, Jun. 21, 2018, retrieved on Feb. 16, 2024, retrieved from URL: <https://clinicaltrials.gov/study/NCT02146313>, 26 pages.

ClinicalTrials.gov [online], "A Study in Participants With Diabetic Kidney Disease," NCT01113801, Sep. 17, 2019, retrieved on Feb. 8, 2024, retrieved from URL: <https://classic.clinicaltrials.gov/ct2/show/NCT01113801>, 54 pages.

ClinicalTrials.gov [online], "A Study of AK119 (Anti-CD73 Antibody), a Treatment for COVID-19, in Health Subjects," NCT04516564, Oct. 18, 2021, retrieved on Feb. 20, 2024, retrieved from URL: <https://clinicaltrials.gov/study/NCT04516564>, 21 pages.

ClinicalTrials.gov [online], "A Study of Anti-VEGFR2 AK109 in Subjects With Advanced Solid Tumors," NCT04547205, Feb. 23, 2023, retrieved on Feb. 20, 2024, retrieved from URL: < https://clinicaltrials.gov/study/NCT04547205>, 21 pages.

ClinicalTrials.gov [online], "A Study of Axatilimab at 3 Different Doses in Participants With Chronic Graft Versus Host Disease (cGVHD) (AGAVE-201)," NCT04710576, Aug. 21, 2023, retrieved on Feb. 20, 2024, retrieved from URL: <https://clinicaltrials.gov/study/NCT04710576>, 28 pages.

ClinicalTrials.gov [online], "A Study of BI-1206 in Combination With Pembrolizumab in Subjects With Advanced Solid Tumors (KEYNOTE-A04)," NCT04219254, Nov. 24, 2023, retrieved on Feb. 20, 2024, retrieved from URL: <https://clinicaltrials.gov/study/NCT04219254>, 29 pages.

ClinicalTrials.gov [online], "A Study of HLX06, a Humanized Monoclonal Antibody Targeting Human Vascular Endothelial Growth Factor Receptor-2 in Patients With Advanced Solid Tumors," NCT03494231, Jul. 30, 2019, retrieved on Feb. 16, 2024, retrieved from URL: <https://clinicaltrials.gov/study/NCT03494231>, 23 pages.

ClinicalTrials.gov [online], "A Study of IGN002 for Refractory NHL," NCT02847949, Mar. 11, 2022, retrieved on Feb. 16, 2024, retrieved from URL: <https://clinicaltrials.gov/study/NCT02847949>, 21 pages.

ClinicalTrials.gov [online], "A Study of Imvotamab Monotherapy and in Combination in Subjects With Relapsed/Refractory Non-Hodgkin Lymphoma," NCT04082936, Nov. 15, 2023, retrieved on Feb. 20, 2024, retrieved from URL: <https://clinicaltrials.gov/study/NCT04082936>, 23 pages.

ClinicalTrials.gov [online], "A Study of JNJ-63898081 in Participants With Advanced Stage Solid Tumors," NCT03926013, Nov. 7, 2022, retrieved on Feb. 20, 2024, retrieved from URL: <https://clinicaltrials.gov/study/NCT03926013>, 23 pages.

(56) References Cited

OTHER PUBLICATIONS

ClinicalTrials.gov [online], "A Study of LY3076226 in Participants With Advanced or Metastatic Cancer," NCT02529553, Apr. 17, 2020, retrieved on Feb. 16, 2024, retrieved from URL: <https://clinicaltrials.gov/study/NCT02529553>, 40 pages.
ClinicalTrials.gov [online], "A Study of MIL62 in Treatment of CD20 Positive B-cell Lymphomas," NCT04103905, Jun. 16, 2021, retrieved on Feb. 20, 2024, retrieved from URL: <https://clinicaltrials.gov/study/NCT04103905>, 23 pages.
ClinicalTrials.gov [online], "A Study of MSB0254 Injection in Advanced Solid Tumors," NCT04381325, Apr. 5, 2023, retrieved on Feb. 20, 2024, retrieved from URL: <https://clinicaltrials.gov/study/NCT04381325>, 26 pages.
ClinicalTrials.gov [online], "A Study to Assess Safety and Efficacy of PRL3-Zumab in Patients With Solid Tumors," NCT04452955, Mar. 1, 2023, retrieved on Feb. 20, 2024, retrieved from URL: <https://clinicaltrials.gov/study/NCT04452955>, 26 pages.
ClinicalTrials.gov [online], "A Study to Assess the Anti-Tumor Activity and Safety of Odronextamab in Patients With B-cell Non-Hodgkin Lymphoma That Have Been Previously Treated (ELM-2)," NCT03888105, Apr. 20, 2023, retrieved on Feb. 16, 2024, retrieved from URL: <https://clinicaltrials.gov/study/NCT03888105>, 36 pages.
ClinicalTrials.gov [online], "A Study to Assess the Safety and Efficacy of ASP1650, a Monoclonal Antibody Targeting Claudin 6 (CLDN6), in Male Subjects With Incurable Platinum Refractory Germ Cell Tumors," NCT03760081, Dec. 2, 2021, retrieved on Feb. 16, 2024, retrieved from URL: <https://clinicaltrials.gov/study/NCT03760081>, 65 pages.
ClinicalTrials.gov [online], "A Study to Compare the Efficacy and Safety of JHL1101 Versus Rituximab in Patients With Previously Untreated Diffuse Large B- Cell Lymphoma (DLBCL)," NCT03670901, Jan. 9, 2020, retrieved on Feb. 16, 2024, retrieved from URL: <https://clinicaltrials.gov/study/NCT03670901>, 21 pages.
ClinicalTrials.gov [online], "A Study to Evaluate Escalating Doses of ASP1235 (AGS62P1) Given as Monotherapy in Subjects With Acute Myeloid Leukemia (AML)," NCT02864290, Oct. 29, 2021, retrieved on Feb. 16, 2024, retrieved from URL: <https://clinicaltrials.gov/study/NCT02864290>, 46 pages.
ClinicalTrials.gov [online], "A Study to Evaluate Safety, Tolerability and Prelimianry Efficacy of FP-1305 in Cancer Patients (MATINS)," NCT03733990, Nov. 27, 2023, retrieved on Feb. 16, 2024, retrieved from URL: <https://clinicaltrials.gov/study/NCT03733990>, 26 pages.
ClinicalTrials.gov [online], "An A/B Dose Escalation Study of AbGn-7 Alone and With FOLFOX7 Treatment in Patients With Advanced Solid Tumors," NCT01466569, Jun. 23, 2015, retrieved on Feb. 16, 2024, retrieved from URL: <https://clinicaltrials.gov/study/NCT01466569>, 23 pages.
ClinicalTrials.gov [online], "An Active Treatment Study of SRK-015 in Patients With Type 2 or Type 3 Spinal Muscular Atrophy," NCT03921528, Apr. 12, 2023, retrieved on Feb. 20, 2024, retrieved from URL: <https://clinicaltrials.gov/study/NCT03921528>, 56 pages.
ClinicalTrials.gov [online], "An Open-Label Study of Intra-articular AMB-05X Injections in Subjects With Tenosynobial Giant Cell Tumor of the Knee," NCT04731675, Oct. 6, 2022, retrieved on Feb. 20, 2024, retrieved from URL: <https://clinicaltrials.gov/study/NCT04731675>, 24 pages.
ClinicalTrials.gov [online], "ARX517 as Monotherapy and in Combination Regimens in Subjects With Metastatic Castration-resistant Prostate Cancer (ARX517)," NCT04662580, Nov. 22, 2023, retrieved on Feb. 20, 2024, retrieved from URL: <https://clinicaltrials.gov/study/NCT04662580>, 27 pages.
ClinicalTrials.gov [online], "Assessment of the Safety and Efficacy of BG9924 in Rheumatoid Arthritis (RA) Participants (Respond)," NCT00664716, Jan. 1, 2016, retrieved on Feb. 8, 2024, retrieved from URL: <https://clinicaltrials.gov/study/NCT00664716>, 17 pages.
ClinicalTrials.gov [online], "B001 in Patients With CD20 Positive B-cell Non Hodgkin's Lymphoma," NCT03332121, Nov. 15, 2021, retrieved on Feb. 16, 2024, retrieved from URL: <https://clinicaltrials.gov/study/NCT03332121>, 21 pages.
ClinicalTrials.gov [online], "Comparative Pharmacokinetic Trial of RGB-03 and MabThera," NCT02371096, Feb. 25, 2015, retrieved on Feb. 16, 2024, retrieved from URL: <https://clinicaltrials.gov/study/NCT02371096>, 15 pages.
ClinicalTrials.gov [online], "Comparative Study of the Efficacy and Safety of BCD-132 With Teriflunomide and Placebo in Multiple Sclerosis," NCT04056897, Sep. 8, 2021, retrieved on Feb. 20, 2024, retrieved from URL: <https://clinicaltrials.gov/study/NCT04056897>, 31 pages.
ClinicalTrials.gov [online], "First in Human Trial of TAS266 in Patients With Advanced Solid Tumors," NCT01529307, Dec. 21, 2020, retrieved on Feb. 16, 2024, retrieved from URL: <https://clinicaltrials.gov/study/NCT01529307>, 20 pages.
ClinicalTrials.gov [online], "First-in-man Dose Escalation Study of BAY1179470 in Patients With Advanced, Refractory Solid Tumors," NCT01881217, Sep. 14, 2017, retrieved on Feb. 16, 2024, retrieved from URL: <https://clinicaltrials.gov/study/NCT01881217>, 24 pages.
ClinicalTrials.gov [online], "Intra-operative Optical Imaging With MDX1201-A488 in Patients With Prostate Cancer," NCT02048150, Mar. 21, 2023, retrieved on Feb. 16, 2024, retrieved from URL: <https://clinicaltrials.gov/study/NCT02048150>, 23 pages.
ClinicalTrials.gov [online], "MabionCD20 Compared to Mab Thera in Lymphoma Patients (MADILYM)," NCT02617485, Oct. 25, 2023, retrieved on Feb. 16, 2024, retrieved from URL: <https://clinicaltrials.gov/study/NCT02617485>, 51 pages.
ClinicalTrials.gov [online], "Nivolumab Combined With BMS-986253 in HCC Patients," NCT04050462, Aug. 30, 2023, retrieved on Feb. 20, 2024, retrieved from URL: <https://clinicaltrials.gov/study/NCT04050462>, 22 pages.
ClinicalTrials.gov [online], "Pharmacokinetics and Pharmacodynamics of BI 695500 vs. Rituximab as First Line-treatment in Patients With Low Tumor Burden Follicular Lymphoma," NCT01950273, Sep. 5, 2018, retrieved on Feb. 16, 2024, retrieved from URL: <https://clinicaltrials.gov/study/NCT01950273>, 45 pages.
ClinicalTrials.gov [online], "Pharmacokinetics, Efficacy and Safety of the 304 Injection," NCT03980379, Jun. 10, 2019, retrieved on Feb. 20, 2024, retrieved from URL: <https://clinicaltrials.gov/study/NCT03980379>, 22 pages.
ClinicalTrials.gov [online], "Phase 1 Study of INBRX-109 in Subjects With Locally Advanced or Metastatic Solid Tumors Including Sarcomas," NCT03715933, Feb. 15, 2024, retrieved on Feb. 16, 2024, retrieved from URL: <https://clinicaltrials.gov/study/NCT03715933>, 29 pages.
ClinicalTrials.gov [online], "Phase 1/2 Study of OBI-999 in Patients With Advanced Solid Tumors," NCT04084366, Jan. 5, 2024, retrieved on Feb. 20, 2024, retrieved from URL: <https://clinicaltrials.gov/study/NCT04084366>, 26 pages.
ClinicalTrials.gov [online], "Phase 2 Study to Evaluate Safety & Efficacy of VPI_2690B in Diabetic Nephropathy Patients," NCT02251067, Mar. 28, 2017, retrieved on Feb. 16, 2024, retrieved from URL: <https://clinicaltrials.gov/study/NCT02251067>, 18 pages.
ClinicalTrials.gov [online], "Pilot Study With CY, Pembrolizumab, GVAX, and IMC-CS4 (LY3022855) in Patients With Borderline Resectable Adenocarcinoma of the Pancreas," NCT03153410, Jan. 29, 2024, retrieved on Feb. 16, 2024, retrieved from URL: <https://clinicaltrials.gov/study/NCT03153410>, 24 pages.
ClinicalTrials.gov [online], "Preoperative Immunotherapy in Patients With Squamous Cell Carcinoma of the Head and Neck," NCT03708224, Jan. 17, 2023, retrieved on Feb. 16, 2024, retrieved from URL: <https://clinicaltrials.gov/study/NCT03708224>, 32 pages.
ClinicalTrials.gov [online], "RHCACD20MA (HS006) With CHOP (Hi-CHOP) in Patients With Previously Untreated Diffuse Large B-cell Lymphoma (Hi-CHOP)," NCT03485118, Apr. 2, 2018, retrieved on Feb. 16, 2024, retrieved from URL: <https://clinicaltrials.gov/study/NCT03485118>, 23 pages.
ClinicalTrials.gov [online], "Safety and Pharmacokinetic Study of IMM0306 in Patients With Refractory or Relapsed CD20-positive B-cell Non-Hodgkin's Lymphoma (B-NHL)," NCT04746131, Sep. 26, 2022, retrieved on Feb. 20, 2024, retrieved from URL: <https://clinicaltrials.gov/study/NCT04746131>, 18 pages.

(56) References Cited

OTHER PUBLICATIONS

ClinicalTrials.gov [online], "Safety, Pharmacokinetics and Pharmacodynamics of Recombinant Chimeric Anti-CD20 Monoclonal Antibody in Patients With B-cell Non-Hodgkin's Lymphoma," NCT02206308, Aug. 1, 2014, retrieved on Feb. 16, 2024, retrieved from URL: <https://clinicaltrials.gov/study/NCT02206308>, 19 pages.
ClinicalTrials.gov [online], "SRK-181 Alone or in Combination With Anti-PD(L)1 Antibody Therapy in Patients With Locally Advanced or Metastatic Solid Tumors (DRAGON)," NCT04291079, Jan. 11, 2024, retrieved on Feb. 20, 2024, retrieved from URL: <https://clinicaltrials.gov/study/NCT04291079>, 26 pages.
ClinicalTrials.gov [online], "Study Evaluating the Safety, Pharmacokinetics, and Pharmacodynamics of MYO-029," NCT00563810, Nov. 26, 2007, retrieved on Feb. 8, 2024, retrieved from URL: <https://clinicaltrials.gov/study/NCT00563810>, 16 pages.
ClinicalTrials.gov [online], "Study of AVE1642 Anti-IGFIR Monoclonal Antibody in Patients With Advanced Multiple Myeloma," NCT01233895, Nov. 3, 2010, retrieved on Feb. 16, 2024, retrieved from URL: <https://clinicaltrials.gov/study/NCT01233895>, 21 pages.
ClinicalTrials.gov [online], "Study of Efficacy and Safety of NIS793 (With and Without Spartalizumab) in Combination With SOC Chemotherapy in First-line Metastatic Pancreatic Ductal Adenocarcinoma (mPDAC) (daNIS-1)," NCT04390763, Jan. 25, 2024, retrieved on Feb. 20, 2024, retrieved from URL: <https://clinicaltrials.gov/study/NCT04390763>, 29 pages.
ClinicalTrials.gov [online], "Study of Idelalisib in Combination With BI 836826 in Participants With Chronic Lymphocytic Leukemia," NCT02538614, Nov. 25, 2020, retrieved on Feb. 16, 2024, retrieved from URL: <https://clinicaltrials.gov/study/NCT02538614>, 47 pages.
ClinicalTrials.gov [online], "Study of JTX 8064, as Monotherapy and in Combination With a PD-1 Inhibitor, in Adult Subjects With Advanced Refractory Solid Tumors," NCT04669899, Feb. 12, 2024, retrieved on Feb. 20, 2024, retrieved from URL: <https://clinicaltrials.gov/study/NCT04669899>, 32 pages.
ClinicalTrials.gov [online], "Study of MK-8808 for Participants With Follicular Lymphoma (MK-8808-001)," NCT01370694, Mar. 15, 2019, retrieved on Feb. 16, 2024, retrieved from URL: <https://clinicaltrials.gov/study/NCT01370694>, 39 pages.
ClinicalTrials.gov [online], "Study of Recombinant Human-Mouse Chimeric Anti-CD20 Monoclonal Antibody to Treat Non-hodgkin's Lymphoma," NCT01459887, Oct. 26, 2011, retrieved on Feb. 16, 2024, retrieved from URL: <https://clinicaltrials.gov/study/NCT01459887>, 23 pages.
ClinicalTrials.gov [online], "Study of STRO-001, an Anti-CD74 Antibody Drug Conjugate, in Patients With Advanced B-Cell Malignancies," NCT03424603, Dec. 14, 2022, retrieved on Feb. 16, 2024, retrieved from URL: <https://clinicaltrials.gov/study/NCT03424603>, 27 pages.
ClinicalTrials.gov [online], "Study of TQB2303 in Patients With CD20-Positive Diffuse Large B-cell Lymphoma (DLBCL)," NCT03777085, May 30, 2019, retrieved on Feb. 16, 2024, retrieved from URL: <https://clinicaltrials.gov/study/NCT03777085>, 21 pages.
ClinicalTrials.gov [online], "Study to Assess the Safety and Tolerability of Multiple Ascending Doses of REGN1033 (SAR391786)," NCT01720576, Sep. 12, 2013, retrieved on Feb. 16, 2024, retrieved from URL: <https://clinicaltrials.gov/study/NCT01720576>, 20 pages.
ClinicalTrials.gov [online], "Study to Evaluate Safety and Tolerability of XmAb13676 (Plamotamab) in Patients With CD20-expressing Hematologic Malignancies," NCT02924402, Dec. 20, 2023, retrieved on Feb. 16, 2024, retrieved from URL: <https://clinicaltrials.gov/study/NCT02924402>, 25 pages.
ClinicalTrials.gov [online], "This Study is to Evaluate Safe and Effective Treatment Dose of OBI-888 in Patients With Locally Advanced or Metastatic Solid Tumors," NCT03573544, Jul. 8, 2022, retrieved on Feb. 16, 2024, retrieved from URL: <https://clinicaltrials.gov/study/NCT03573544>, 26 pages.
ClinicalTrials.gov [online], "TREatment of degeNerative and Neoplastic Diseases With Rituximab (TREND)," NCT01277172, Jan. 14, 2011, retrieved on Feb. 16, 2024, retrieved from URL: <https://clinicaltrials.gov/study/NCT01277172>, 22 pages.
ClinicalTrials.gov [online], "Trial of Active Immunotherapy With OBI-833 (Globo H-CRM197) in Advanced/Metastatic Gastric, Lung, Colorectal or Breast Cancer Subjects," NCT02310464, Oct. 3, 2022, retrieved on Feb. 16, 2024, retrieved from URL: <https://clinicaltrials.gov/study/NCT02310464>, 42 pages.
ClinicalTrials.gov [online], "A Study of Paclitaxel/Carboplatin With or Without CDP791 in Patients With Lung Cancer," NCT00152477, Apr. 12, 2022, retrieved on Feb. 8, 2024, retrieved from URL: <https://classic.clinicaltrials.gov/ct2/show/NCT00152477>, 35 pages.
Coiffier, "Pharmacokinetics, efficacy and safety of the rituximab biosimilar CT-P10," Expert Rev. Clin. Pharmacol., Sep. 2017, 10(9):923-933.
Cooper et al., "Human natural killer cells: a unique innate immunoregulatory role for the CD56bright subset," Immunobiology, May 15, 2001, 97 (10): 3146-3151.
Gagez et al., "Obinutuzumab: a new class of anti-CD20 monoclonal antibody," Curr. Opin. Oncol., Sep. 2014, 26(5):484-491.
Goldenberg et al., "Veltuzumab (humanized anti-CD20 monoclonal antibody): characterization, current clinical results, and future prospects," Leuk. Lymphoma, May 2010, 51(5):747-755.
Hsu et al., "The Killer Cell Immunoglobulin-Like Receptor (KIR) Genomic Region: Gene-Order, Haplotypes and Allelic Polymorphism," Immunological Review, Dec. 2002, 190:40-52.
Ishiguro et al., "An anti-glypican 3/CD3 bispecific T cell-redirecting antibody for treatment of solid tumors," Sci. Transl. Med., Oct. 4, 2017, 9(410):eaal4291.
Kalaycio et al., "Subcutaneous injections of low doses of humanized anti-CD20 veltuzumab: a phase I study in chronic lymphocytic leukemia," Leuk. Lymphoma, 2016, 57(4):803-11.
Khan et al., "Ramucirumab for the treatment of gastric or gastroesophageal junction cancer," Expert Opin. Biol. Ther., Nov. 2019, 19(11):1135-1141.
Kruschinski et al., "Engineering antigen-specific primary human NK cells against HER-2 positive carcinomas," Proceedings of the National Academy of Sciences, Nov. 11, 2008, 105(45):17481-17486.
Lima et al., "Phase Ib study of drozitumab combined with first-line mFOLFOX6 plus bevacizumab in patients with metastatic colorectal cancer," Cancer Invest., Dec. 2012, 30(10):727-31.
Liu et al., "Driving better and safer HER2-specific CARs for cancer therapy," Oncotarget, Sep. 5, 2017, 8(37):62730-62741.
Marchio et al. "Evolving concepts in HER2 evaluation in breast cancer: Heterogeneity, HER2-low carcinomas and beyond," Semin Cancer Biol, Feb. 26, 2020, 72:123-135.
Office Action in Canadian Application No. 3061898, dated Feb. 9, 2024, 6 pages.
Office Action in European Application No. 17886739.6, dated Mar. 7, 2024, 10 pages.
Rafiq et al, "Engineering strategies to overcome the current roadblocks in CAR T cell therapy," Nature Reviews Clinical Oncology, Mar. 2020, 17(3):147-167.
Reck et al., "A randomized, double-blind, placebo-controlled phase 2 study of tigatuzumab (CS-1008) in combination with carboplatin/paclitaxel in patients with chemotherapy-naïve metastatic/unresectable non-small cell lung cancer," Lung Cancer, Dec. 2013, 82(3):441-448.
Robak, "Ofatumumab, a human monoclonal antibody for lymphoid malignancies and autoimmune disorders," Curr Opin Mol Ther., Jun. 2008, 10(3):294-309.
Rosevear et al., "Conatumumab, a fully human mAb against death receptor 5 for the treatment of cancer," Curr Opin Investig Drugs, Jun. 2010, 11(6):688-698.
Schönfeld et al., "Selective Inhibition of Tumor Growth by Clonal NK Cells Expressing an ErbB2/HER2-Specific Chimeric Antigen Receptor," Molecular Therapy, Nov. 6, 2014, 23(2):330-338.
Sorensen et al., "Safety and efficacy of ofatumumab in relapsing-remitting multiple sclerosis: a phase 2 study," Neurology, Feb. 18, 2014, 82(7):573-581.
Stasi, "Gemtuzumab ozogamicin: an anti-CD33 immunoconjugate for the treatment of acute myeloid leukaemia," Expert Opin Biol Ther., Apr. 2008, 8(4):527-540.

(56) References Cited

OTHER PUBLICATIONS

UniProtKB Accession No. P40933, "RecName: Full=Interleukin-15; Short=IL-15; Flags: Precursor," Dec. 24, 2019, 6 pages.
UniProtKB Accession No. P41273, "RecName: Full=Tumor necrosis factor ligand superfamily member 9; AltName: Full=4-1BB ligand; Short=4-1BBL," Oct. 16, 2019, 5 pages.
Vaickus, "Immune markers in hematologic malignancies," Crit Rev. in Oncol./Hemotol., Dec. 1991, 11(4):267-297.
Vallabhajosula et al., "Radioimmunotherapy of Metastatic Prostate Cancer with 177Lu-DOTAhuJ591 Anti Prostate Specific Membrane Antigen Specific Monoclonal Antibody," Curr Radiopharm., 2016, 9(1):44-53.
Van der Horst et al., "Epcoritamab induces potent anti-tumor activity against malignant B-cells from patients with DLBCL, FL and MCL, irrespective of prior CD20 monoclonal antibody treatment," Blood Cancer J., Feb. 18, 2021, 11(38):1-8.
Vose et al., "Multicenter phase II study of iodine-131 tositumomab for chemotherapy-relapsed/refractory low-grade and transformed low-grade B-cell non-Hodgkin's lymphomas," J Clin Oncol., Mar. 2000, 18(6):1316-1323.
Waddell et al., "Potential role of rilotumumab in the treatment of gastric cancer," Immunotherapy, Dec. 2014, 6(12):1243-1253.
Wagner et al., "Randomized phase 2 trial and open-label extension of domagrozumab in Duchenne muscular dystrophy," Neuromuscul Disord., Jun. 2020, 30(6):492-502.
Wall et al., "The anti-DKK1 antibody DKN-01 as an immunomodulatory combination partner for the treatment of cancer," Expert Opin Investig Drugs., Jul. 2, 2020, 29(7):639-644.
Wiseman et al., "Phase I/II 90 Y-Zevalin (yttrium-90 ibritumomab tiuxetan, IDEC-Y2B8) radioimmunotherapy dosimetry results in relapsed or refractory non-Hodgkin's lymphoma," Eur J Nucl Med., 2000, 27(7):766-777.
Witzig et al., "Randomized controlled trial of yttrium-90-labeled ibritumomab tiuxetan radioimmunotherapy versus rituximab immunotherapy for patients with relapsed or refractory low-grade, follicular, or transformed B-cell non-Hodgkin's lymphoma," J Clin Oncol., May 15, 2002, 20(10):2453-2463.
Wolff et al., "Human Epidermal Growth Factor Receptor 2 Testing in Breast Cancer," Arch Pathol Lab Med., Nov. 2018, 142(11):1364-1382.
Wu et al., "piggyBac is a Flexible and Highly Active Transposon as Compared to Sleeping Beauty, Tol2, and Mos1 in Mammalian Cells," PNAS, Oct. 10, 2006, 103(41):15008-15013.
Yoo et al., "Phase I study of bintrafusp alfa, a bifunctional fusion protein targeting TGF-β and PD-L1, in patients with pretreated biliary tract cancer.," J Immunother Cancer, May 2020,8(1):e000564, 9 pages.
Yu et al., "Antibody-drug conjugates in clinical trials for lymphoid malignancies and multiple myeloma," Journal of Hematology & Oncology, Dec. 2019, 12(94):1-7.
Zelenetz, "A clinical and scientific overview of tositumomab and iodine I 131 tositumomab," Semin Oncol., Apr. 2003, 30(2 Suppl 4):22-30.
Zhang et al., "A novel anti-DR5 antibody-drug conjugate possesses a high-potential therapeutic efficacy for leukemia and solid tumors.," Theranostics., Jul. 13, 2019, 9(18):5412-5423.
Zhang et al., "ErbB2/HER2-Specific NK Cells for Targeted Therapy of Glioblastoma," Journal of the National Cancer Institute, Dec. 6, 2015, 108(5):djv375, 12 pages.
U.S. Appl. No. 18/816,413, Lee et al., Aug. 27, 2024.
Office Action in Chinese Application No. 201780081622.3, dated Jan. 19, 2023, 14 pages (with English translation).
Qin et al., "Incorporation of a hinge domain improves the expansion of chimeric antigen receptor T cells," Journal of Hematology & Oncology, Dec. 2017, 10(68):1-11.

* cited by examiner

Mock

CD16V-Z

CD16V-OX40LZ

Mock
NKG2D-Z
NKG2D-OX40Z
NKG2D-BBZ
NKG2D-28Z
<FITC-A>
<PE-A>
Cells
0.103
0.172
67.2
32.5
0.194
75.9
0.703
16.5
6.96
78.5
87.3
0.154
10.9
1.64
85
0.244
14
0.708
88.3
0.331
10.3
1
88.5

Mock
NKG2D-Z
NKG2D-28Z
NKG2D-28(H)OX40LZ
NKG2D-AAA-28(H)OX40LZ
Comp-FITC-A
Comp-PE-A
Count
Comp-PE-A subset
Q1
Q2
Q3
Q4
9.82E-3
0.049
68.1
31.8
0.088
98.7
0.10
0.070
1.17
98.8
98.0
0.25
9.62E-3
1.70
98.4
95.6
0.40
0.019
3.96
96.3
97.0
0.41
0
2.59
97.5

| IgG1a | 112 |
|---|---|
| MIC-A/B | 894 |
| ULBP-1 | 290 |
| ULBP-2/5/6 | 280 |
| ULBP-3 | 401 |

| IgG1a | 100 |
|---|---|
| MIC-A/B | 263 |
| ULBP-1 | 253 |
| ULBP-2/5/6 | 136 |
| ULBP-3 | 267 |

CHIMERIC ANTIGEN RECEPTOR AND NATURAL KILLER CELLS EXPRESSING SAME

This application is a continuation of U.S. application Ser. No. 16/474,426 filed Jun. 27, 2019, now abandoned, which is a National Stage of International Application No. PCT/KR2017/015635 filed Dec. 28, 2017, claiming priority based on Korean Patent Application No. 10-2016-0181119 filed Dec. 28, 2016.

SEQUENCE LISTING

This application contains a Sequence Listing that has been submitted electronically as an ASCII text file named SequenceListing.txt. The ASCII text file, created on Jun. 21, 2022, is 182 kilobytes in size. The material in the ASCII text file is hereby incorporated by reference in its entirety.

TECHNICAL FIELD

The present invention relates to a chimeric antigen receptor and natural killer cells expressing the same.

BACKGROUND ART

Human natural killer cells (NK cells) play an important role in innate immune defense against malignant lymphoma cells, and thus may be suitable for adoptive immune therapy (i.e., adoptive cellular immunotherapy). However, due to difficulties in ex vivo cell expansion and differences in activities of NK cells in individual patients, it is difficult to use the NK cells.

In a field of immune cell therapy using T cells, that is, T cell therapy field, a chimeric antigen receptor for treatment of autoimmune cells has been developed. The chimeric antigen receptor has been known to help activation of T cells by reprogramming T cells in order to improve treatment effects to specific cancers or overcome resistance against T cell treatment.

OX40 ligand (CD252) is a protein belonging to a TNFR superfamily, and is known to be expressed in antigen-presenting cells (APCs), some of NK cells and some of B cells, as well as known to be expressed in several hours to a few days after activation of these cells.

As a receptor of OX40 ligand (CD252), OX40 (CD134) is known to be expressed in T cells, and also known to be expressed in 24 hours after activation of T cells by antigen and CD28. It is known that expression of CD134 may further enhance a response of T cells by CD28 activation, so as to increase proliferation of T cells, and cytokine secretion and survival.

However, a role of OX40 ligand in enhancement of anticancer activity of NK cells is not well known, and an attempt to use the OX40 ligand for the chimeric antigen receptor is still not yet reported.

In order to research functional roles of CD252 in antitumor response of NK cells, the present inventors have constructed two different kinds of NK receptors containing CAR. First, a variety of stimulatory cofactors known to increase cytotoxicity of NK cells in a signaling domain were genetically engineered to produce lentivirus encoding high affinity recombination FCRG3A V158 variants (CD16V). CD16V receptors including different intercellular signaling molecules were transduced in NK cells, followed by detecting expression thereof. Further, antitumor responses of the transduced NK cells were investigated using lymphoma cell lines in vitro in the presence of rituximab specific to CD20 molecules.

As a second approach, functional roles of CD252 in NKG2D-mediated antitumor activity was tested. NKG2D as a key receptor in NK cell activation can recognize MHC class 1 chain-related A (MICA), MICB and other diverse UL 16-binding proteins (ULBP), which are preferentially expressed after genotoxic stress, infection and/or cytotoxicity.

A variety of NKG2D chimeric antigen receptors containing different signaling molecules were genetically engineered, transduced, and expressed in NK92MI cells. Thereafter, the transduced cells were subjected to evaluation of antitumor effects in vitro.

The present inventors have found that, as one approach to overcome limitations of current immune cell therapy like NK cells, a chimeric antigen receptor containing OX40 ligand has significantly improved in anticancer activities ofNK cells, as compared to the other signaling domains known, thereby completing the present invention.

DISCLOSURE

Technical Problem

Accordingly, it is an object of the present invention to provide a chimeric antigen receptor capable of increasing anticancer immune cell treatment efficiency using natural killer (NK) cells.

Technical Solution

1. A chimeric antigen receptor, including: an intracellular signaling domain which includes the whole or a portion of OX40 ligand (CD252).
2. The chimeric antigen receptor according to the above 1, further including: a transmembrane domain linked to the intracellular signaling domain; a spacer domain linked to the transmembrane domain; and an extracellular domain linked to the spacer domain.
3. The chimeric antigen receptor according to the above 2, further comprising a signal sequence linked to the extracellular domain.
4. The chimeric antigen receptor according to the above 3, wherein the signal sequence includes the whole or a portion of CD16 and the signal sequence includes the whole or a portion of CD8α, respectively.
5. The chimeric antigen receptor according to the above 2, wherein the extracellular domain includes the whole or a portion of any one selected from the group consisting of an antigen-binding fragment of an antibody, an Fc receptor, a natural cytotoxicity receptor, NKG2D, 2B4 and DNAM-1.
6. The chimeric antigen receptor according to the above 5, wherein the antigen-binding fragment is Fab fragment, F(ab') fragment, F(ab')2 fragment or Fv fragment.
7. The chimeric antigen receptor according to the above 6, wherein the Fv fragment is a single-chain variable fragment (ScFv).
8. The chimeric antigen receptor according to the above 5, wherein the Fc receptor is selected from the group consisting of CD16, CD32, CD64, CD23, CD89 and variants thereof.
9. The chimeric antigen receptor according to the above 8, wherein the Fc receptor is CD16 or variants thereof.

10. The chimeric antigen receptor according to the above 5, wherein the natural cytotoxicity receptor is selected from the group consisting of NKp46, NKp30, NKp44, NKp80 and NKp65 receptors.
11. The chimeric antigen receptor according to the above 2, wherein the spacer domain includes the whole or a portion of any one selected from the group consisting of CD8α and CD28.
12. The chimeric antigen receptor according to the above 2, wherein the transmembrane domain includes the whole or a portion of any one selected from the group consisting of CD8α and CD28.
13. The chimeric antigen receptor according to the above 1, wherein the intracellular signaling domain further includes the whole or a portion of CD3-zeta.
14. The chimeric antigen receptor according to the above 13, wherein the whole or a portion of CD3-zeta and the whole or a portion of OX40 ligand are arranged in order from a cell membrane toward an inside of the cell.
15. The chimeric antigen receptor according to the above 2, further comprising an AAA linker between the extracellular domain and the spacer domain.
16. A chimeric antigen receptor, comprising intracellular signaling domains which include: a first intracellular signaling domain including the whole or a portion of any one selected from the group consisting of CD28 and 4-1BB; a second intracellular signaling domain including the whole or a portion of any one selected from the group consisting of OX40 ligand, OX40 and 4-1BB; and a third intracellular signaling domain including the whole or a portion of CD3-zeta, wherein the first, second and third intracellular signaling domains are arranged in order from a cell membrane toward an inside of the cell.
17. The chimeric antigen receptor according to the above 16, further including: a transmembrane domain linked to the intracellular signaling domain; a spacer domain linked to the transmembrane domain; and an extracellular domain linked to the spacer domain.
18. The chimeric antigen receptor according to the above 17, further comprising a signal sequence linked to the extracellular domain.
19. The chimeric antigen receptor according to the above 18, wherein the signal sequence includes the whole or a portion of CD16 and the signal sequence includes the whole or a portion of CD8α, respectively.
20. The chimeric antigen receptor according to the above 17, wherein the extracellular domain includes the whole or a portion of any one selected from the group consisting of an antigen-binding fragment of an antibody, an Fc receptor, a natural cytotoxicity receptor, NKG2D, 2B4 and DNAM-1.
21. The chimeric antigen receptor according to the above 17, wherein the spacer domain includes the whole or a portion of any one selected from the group consisting of CD8α and CD28.
22. The chimeric antigen receptor according to the above 17, wherein the transmembrane domain includes the whole or a portion of any one selected from the group consisting of CD8α and CD28.
23. The chimeric antigen receptor according to the above 16, wherein the first intracellular signaling domain includes the whole or a portion of CD28; the second intracellular signaling domain includes the whole or a portion of the OX40 ligand; and the third intracellular signaling domain includes the whole or a portion of CD3-zeta.
24. The chimeric antigen receptor according to the above 17, further comprising an AAA linker between the extracellular domain and the spacer domain. 25. An immune cell expressing the chimeric antigen receptor according to any one of the above 1 to 24.
26. The immune cell according to the above 25, wherein the immune cell is a natural killer cell (NK cell).
27. A pharmaceutical composition for treatment of tumor, comprising the immune cell according to the above 25 as an active ingredient.
28. The pharmaceutical composition according to the above 27, further comprising an antibody as an active ingredient when the extracellular domain is an Fc receptor.
29. A nucleic acid sequence encoding the chimeric antigen receptor according to any one of the above 1 to 24.
30. The nucleic acid sequence according to the above 29, wherein the nucleic acid sequence encodes one or more amino acid sequences selected from the group consisting of SEQ ID NOs: 33, 41, 43, 45, 47, 49, 51, 53, 55, 69, 71, 77, 81, 83, 85, 87, 89, 91 and 93, or variants thereof having a sequence identity of 80% or more.
31. The nucleic acid sequence according to the above 30, wherein the nucleic acid sequence includes one or more nucleic acid sequence selected from the group consisting of SEQ ID NOs: 32, 40, 42, 44, 46, 48, 50, 52, 54, 68, 70, 76, 80, 82, 84, 86, 88, 90 and 92, or variants thereof having a sequence identity of 80% or more.
32. A method for treatment of tumor, comprising administering the immune cell according to the above 25 to a subject.

Advantageous Effects

The chimeric antigen receptor according to the present invention is excellent in NK cell activation efficiency.

The chimeric antigen receptor according to the present invention may be used along with various cancer-target antibodies depending on cancer types to be targeted.

The chimeric antigen receptor according to the present invention is applicable to diverse cancer types by applying different antigen recognition sites.

The NK cells expressing the chimeric antigen receptor according to the present invention are excellent in cytotoxicity on cancer cells.

The NK cells expressing the chimeric antigen receptor according to the present invention may be usefully used in immune cell treatment.

BBV CAR (2nd generation), CD16V-OX40Z CAR (2nd generation) or CD16V-28OX40LZ CAR (3rd generation), respectively, according to an embodiment of the present invention, when combined with an antibody to Ramos cells.

Figure 1A:
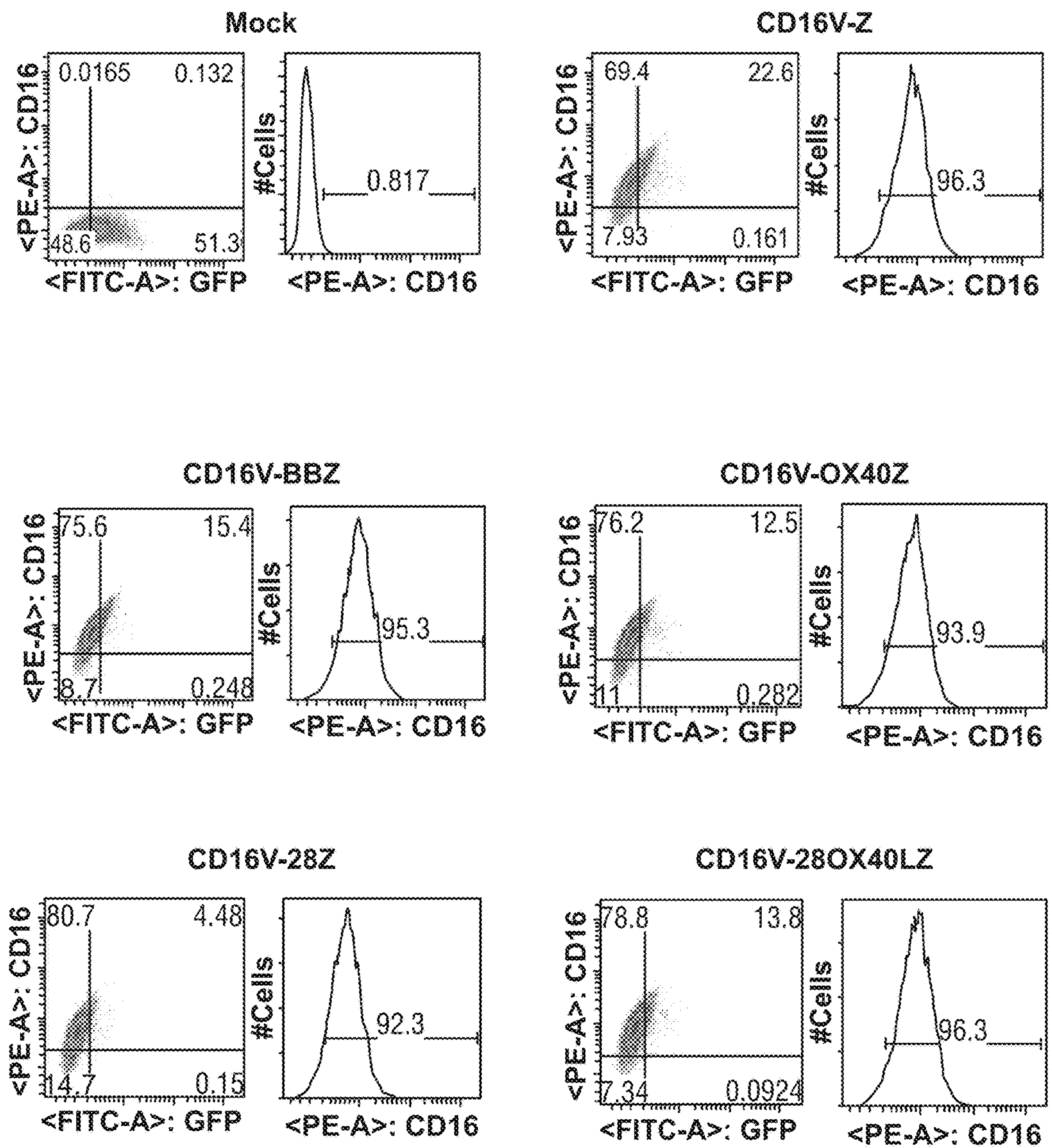
FIG. 1A shows CAR expression levels of NK92MI cells transduced with CD16V-Z CAR ($1^{st}$ generation), CD16V-28Z CAR ($2^{nd}$ generation), CD16V-BBZ CAR ($2^{nd}$ generation), CD16V-OX40Z CAR ($2^{nd}$ generation) or CD16V-28OX40LZ CAR ($3^{rd}$ generation), respectively, according to an embodiment of the present invention.
Figure 1B:
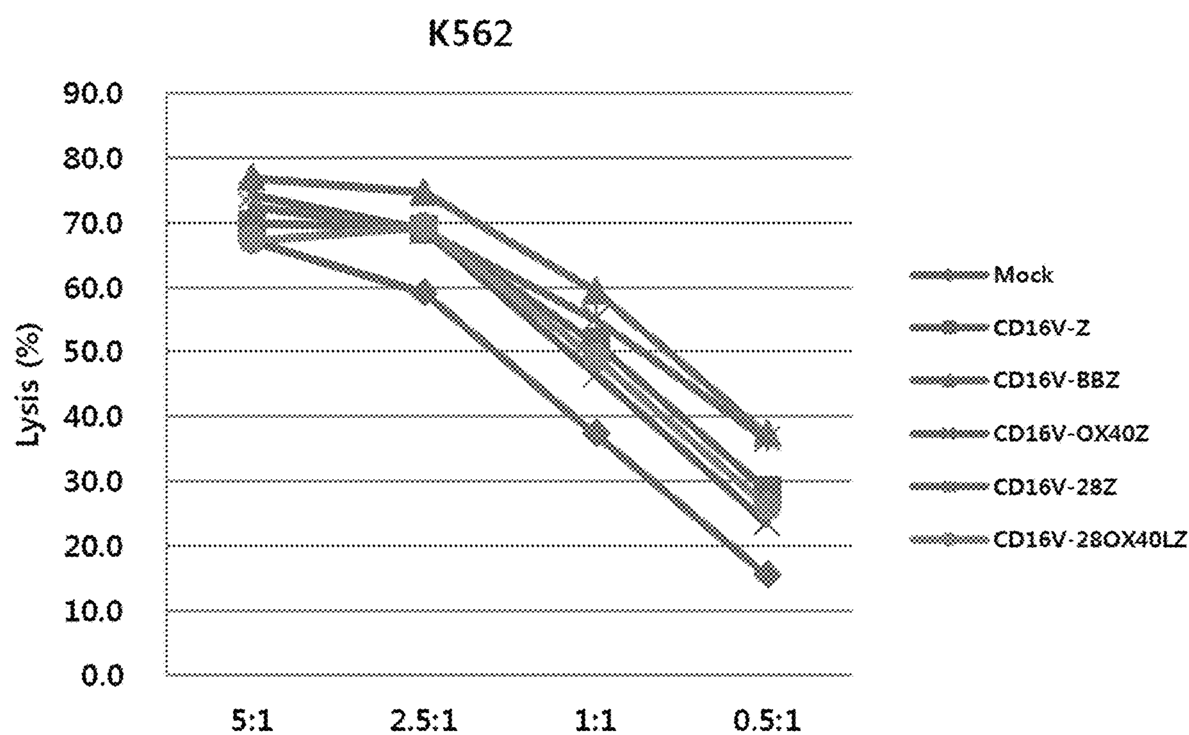
FIG. 1B shows intrinsic cell killing ability (i.e., 'cytotoxicity') of NK92MI cells transduced with CD16V-Z CAR ($1^{st}$ generation), CD16V-28Z CAR ($2^{nd}$ generation), CD16V-BBZ CAR ($2^{nd}$ generation), CD16V-OX40Z CAR ($2^{nd}$ generation) or CD16V-28OX40LZ CAR ($3^{rd}$ generation), respectively, which is obtained through assessment of cytotoxicity on K562 cells.
Figure 1C:
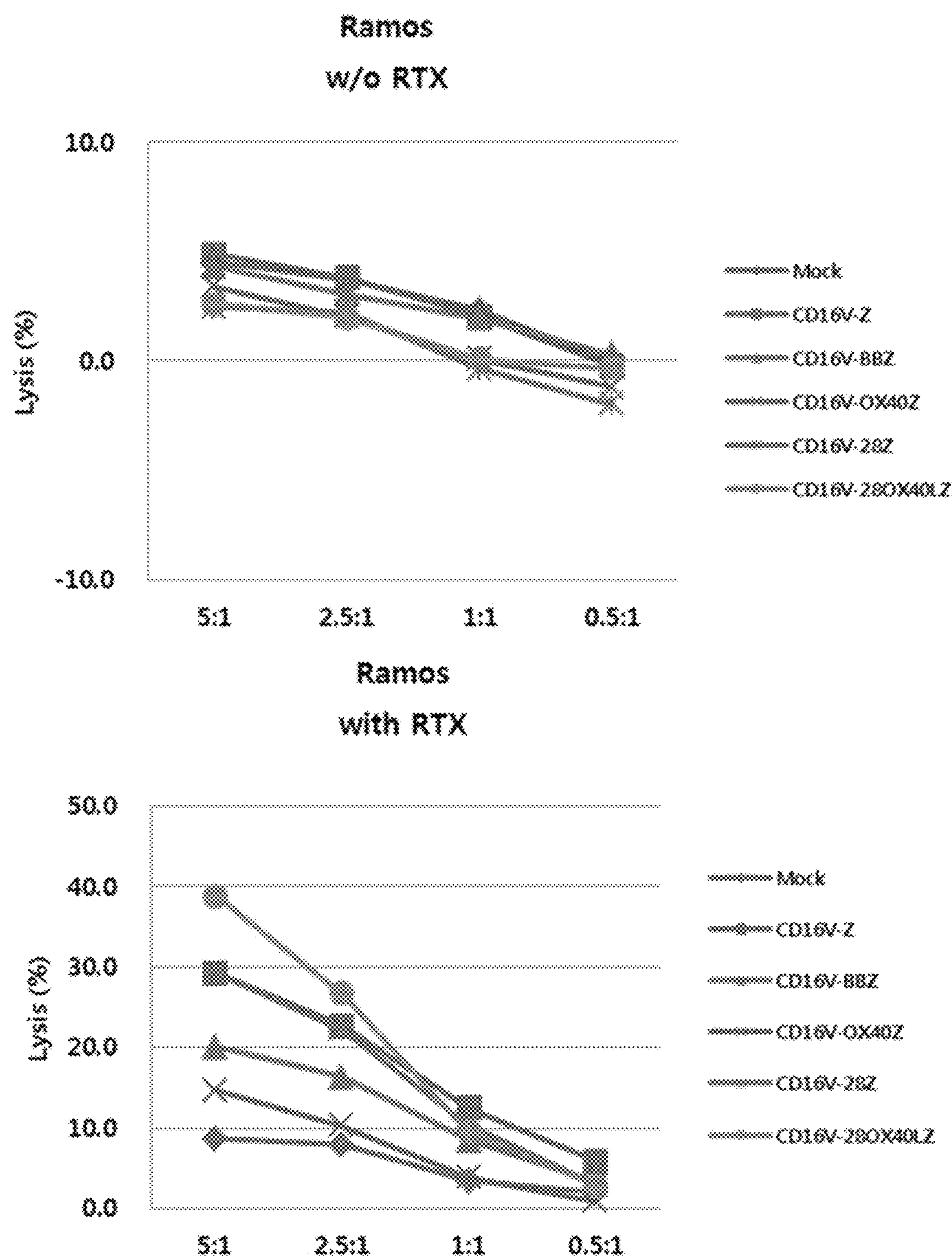
FIG. 1C shows assessment of NK cell-mediated cytotoxicity of NK92MI cells transduced with CD16V-Z CAR ($1^{st}$ generation), CD16V-28Z CAR ($2^{nd}$ generation), CD16V-
Figure 1D:
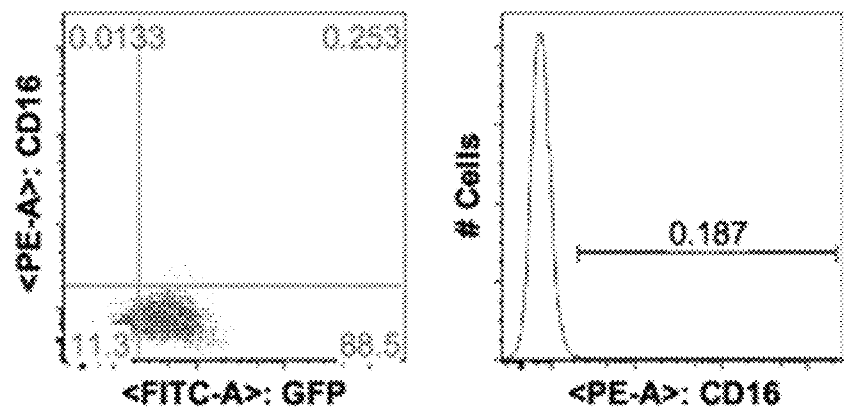
Figure 1D:
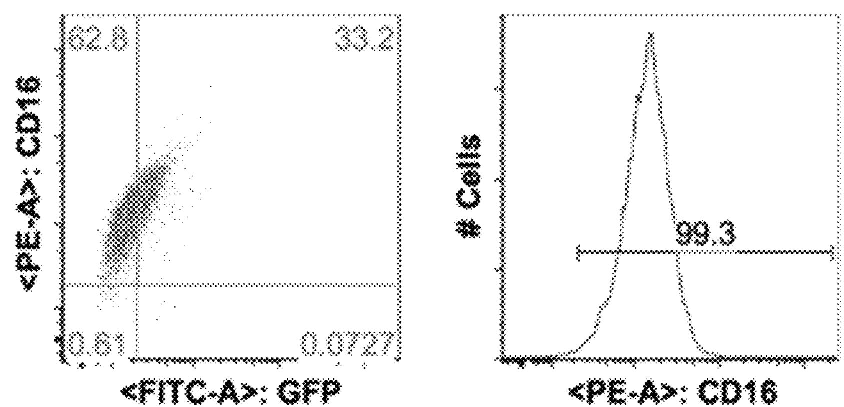
Figure 1D:
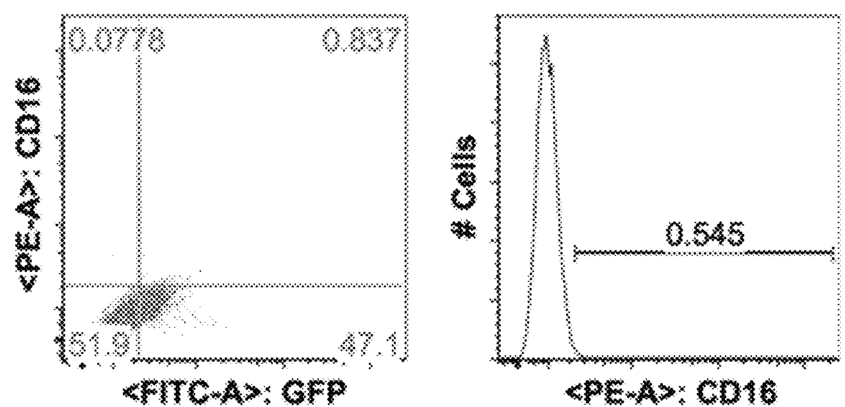

FIG. 1D shows CAR expression levels of NK92MI cells transduced with CD16V-Z CAR (1st generation) and CD16V-OX40LZ CAR (2nd generation), respectively, according to an embodiment of the present invention.

Figure 1E:
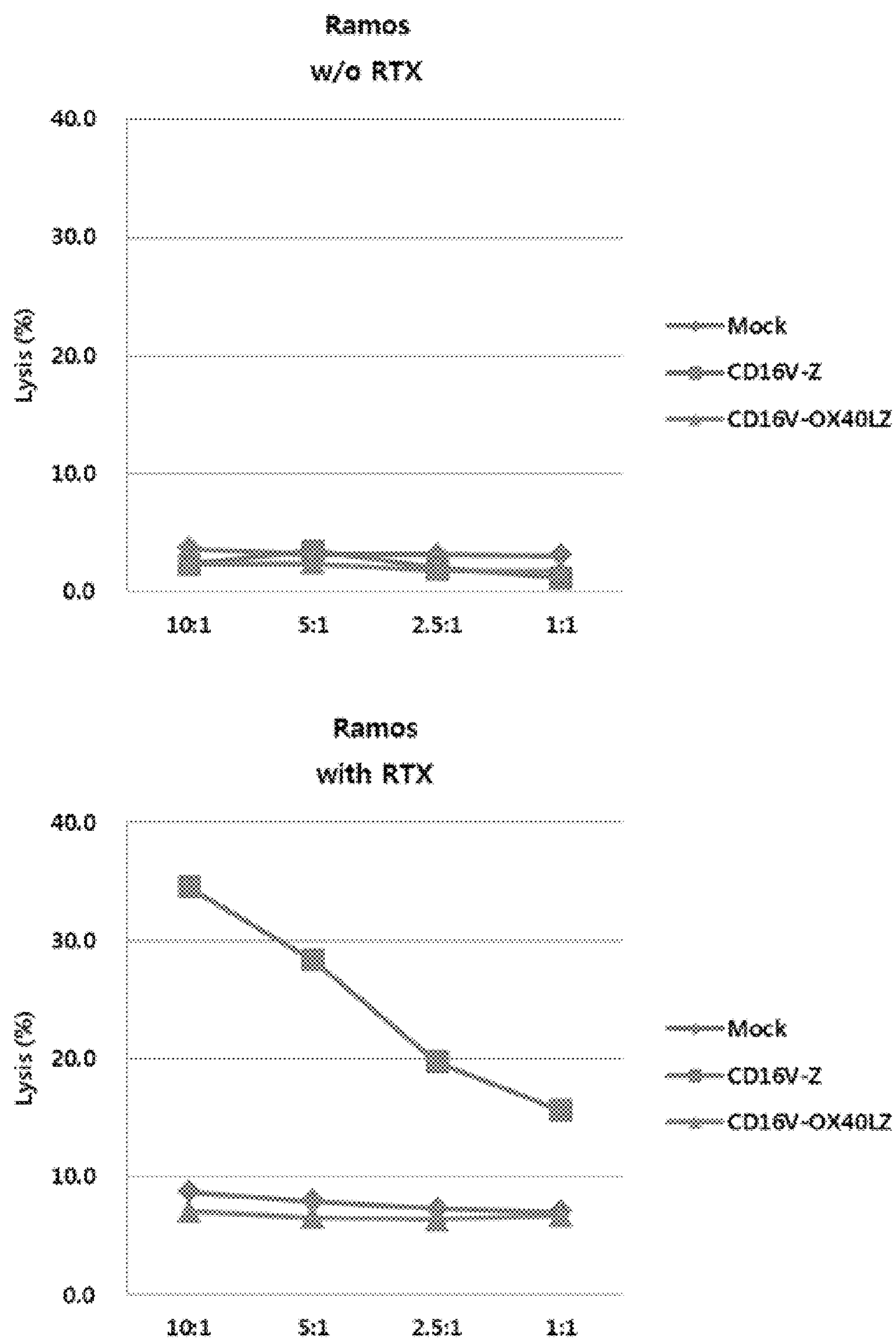

FIG. 1E shows assessment of NK cell-mediated cytotoxicity of NK92MI cells transduced with CD16V-Z CAR (1st generation) and CD16V-OX40LZ CAR (2nd generation), respectively, according to an embodiment of the present invention, when combined with an antibody to Ramos cells.

Figure 1F:
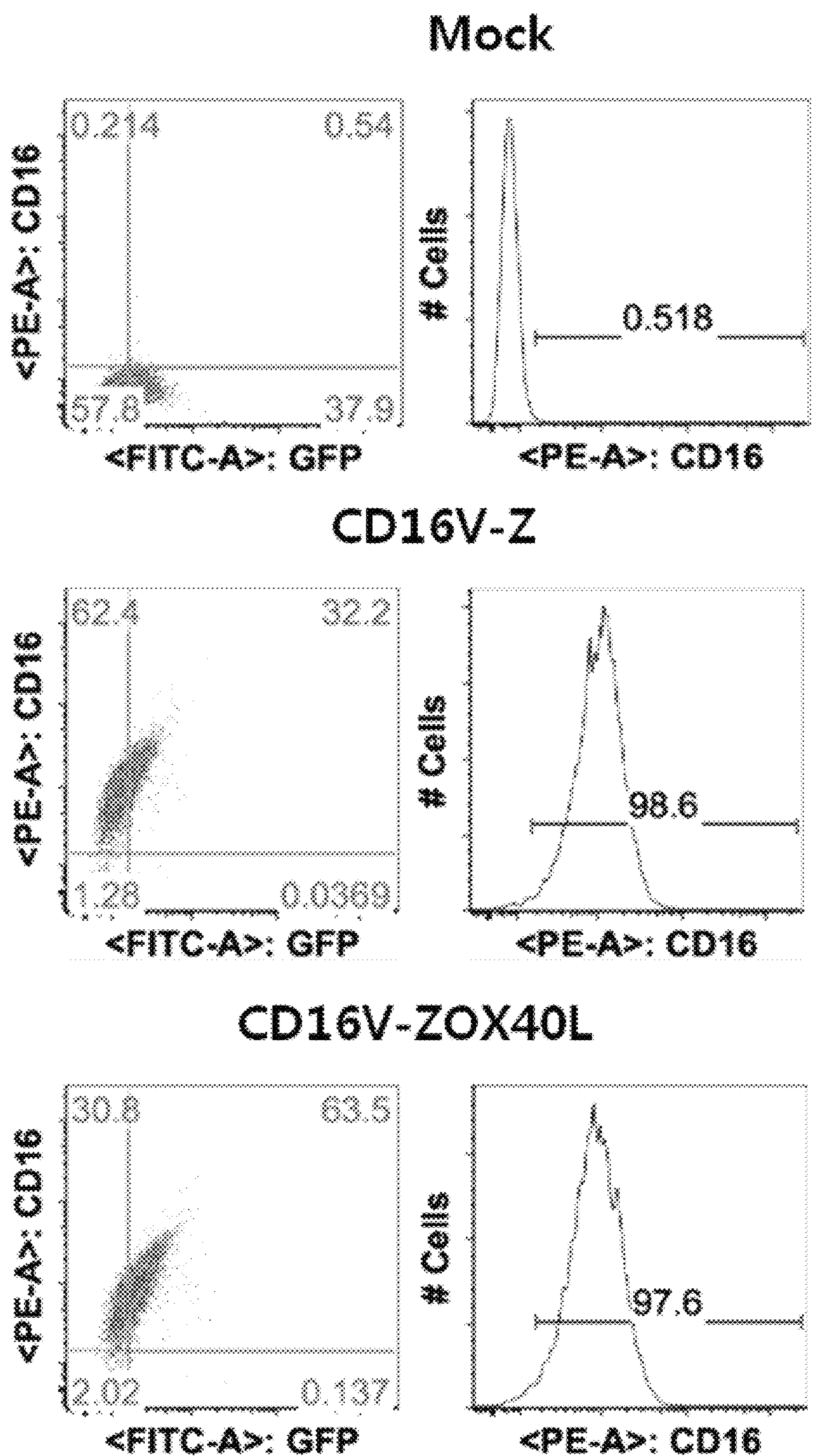

FIG. 1F shows CAR expression levels of NK92MI cells transduced with CD16V-Z CAR (1st generation) and CD16V-ZOX40L CAR (2nd generation), respectively, according to an embodiment of the present invention.

Figure 1G:
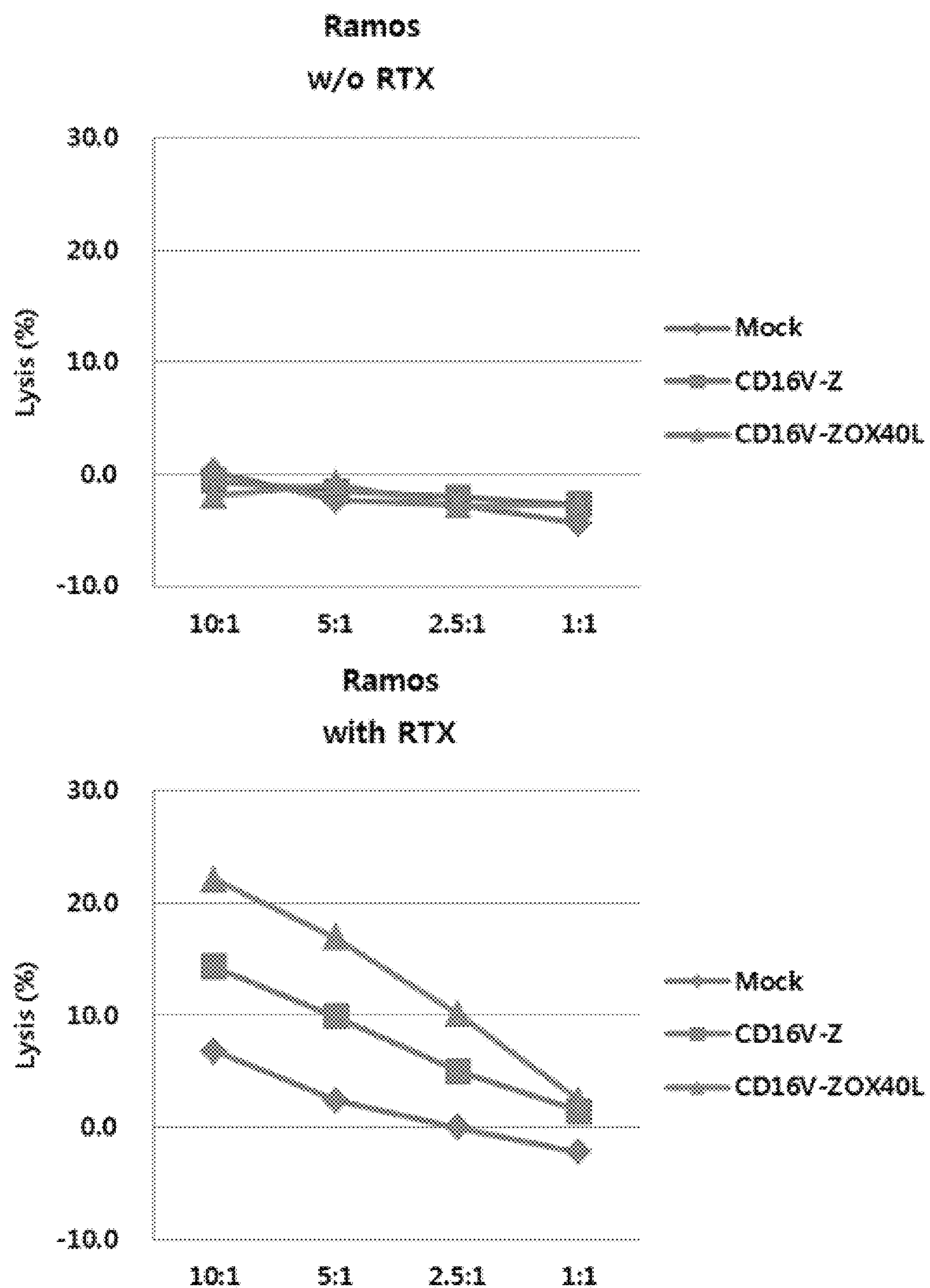

FIG. 1G shows assessment of NK cell-mediated cytotoxicity of NK92MI cells transduced with CD16V-Z CAR (1st generation) or CD16V-ZOX40L CAR (2nd generation), respectively, according to an embodiment of the present invention, when combined with an antibody to Ramos cells.

Figure 2A:
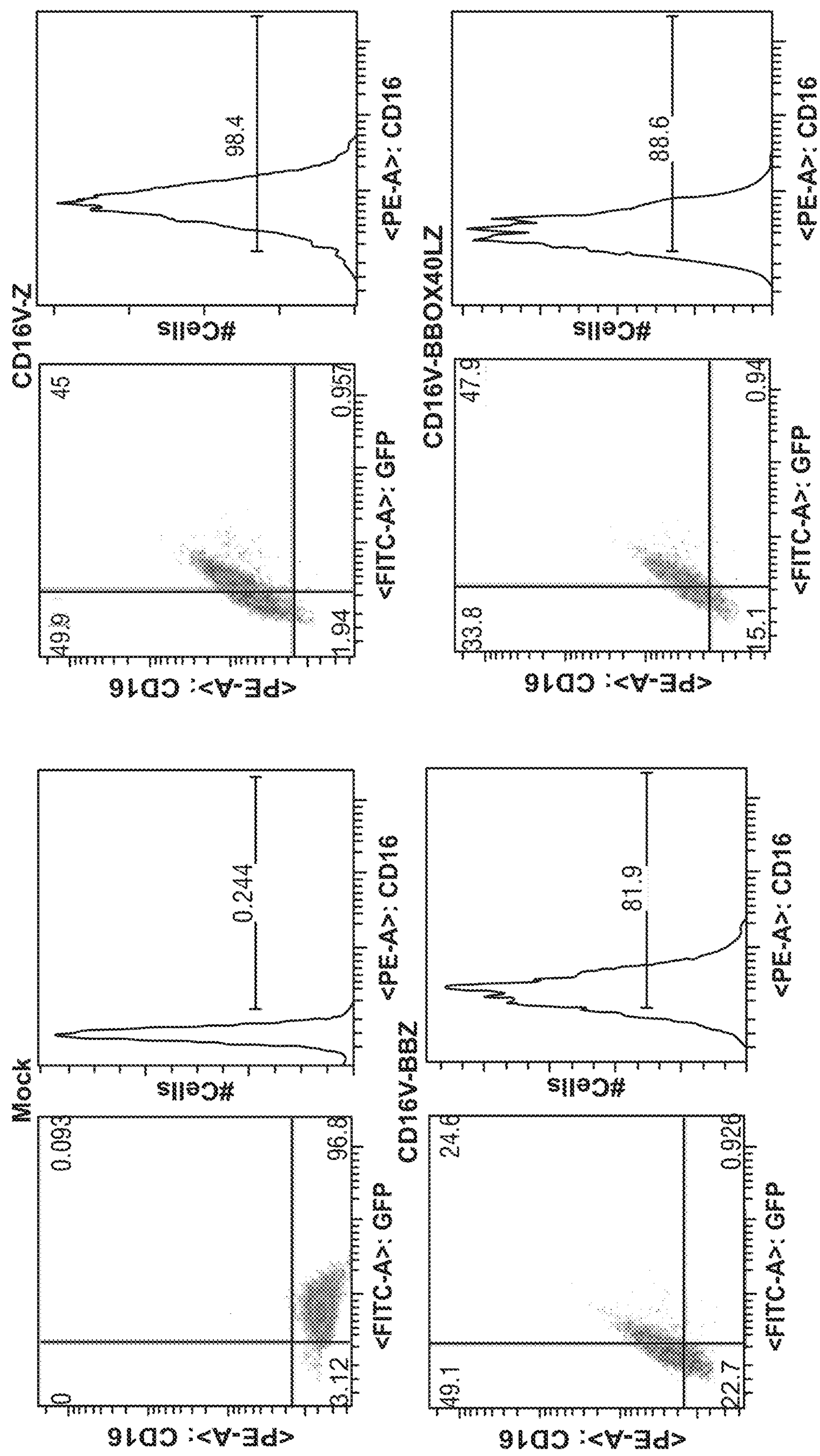

FIG. 2A shows CAR expression levels of NK92MI cells transduced with CD16V-Z CAR (1st generation), CD16V-BBZ CAR (2nd generation) or CD16V-BBOX40LZ CAR (3rd generation), respectively, according to an embodiment of the present invention.

Figure 2B:
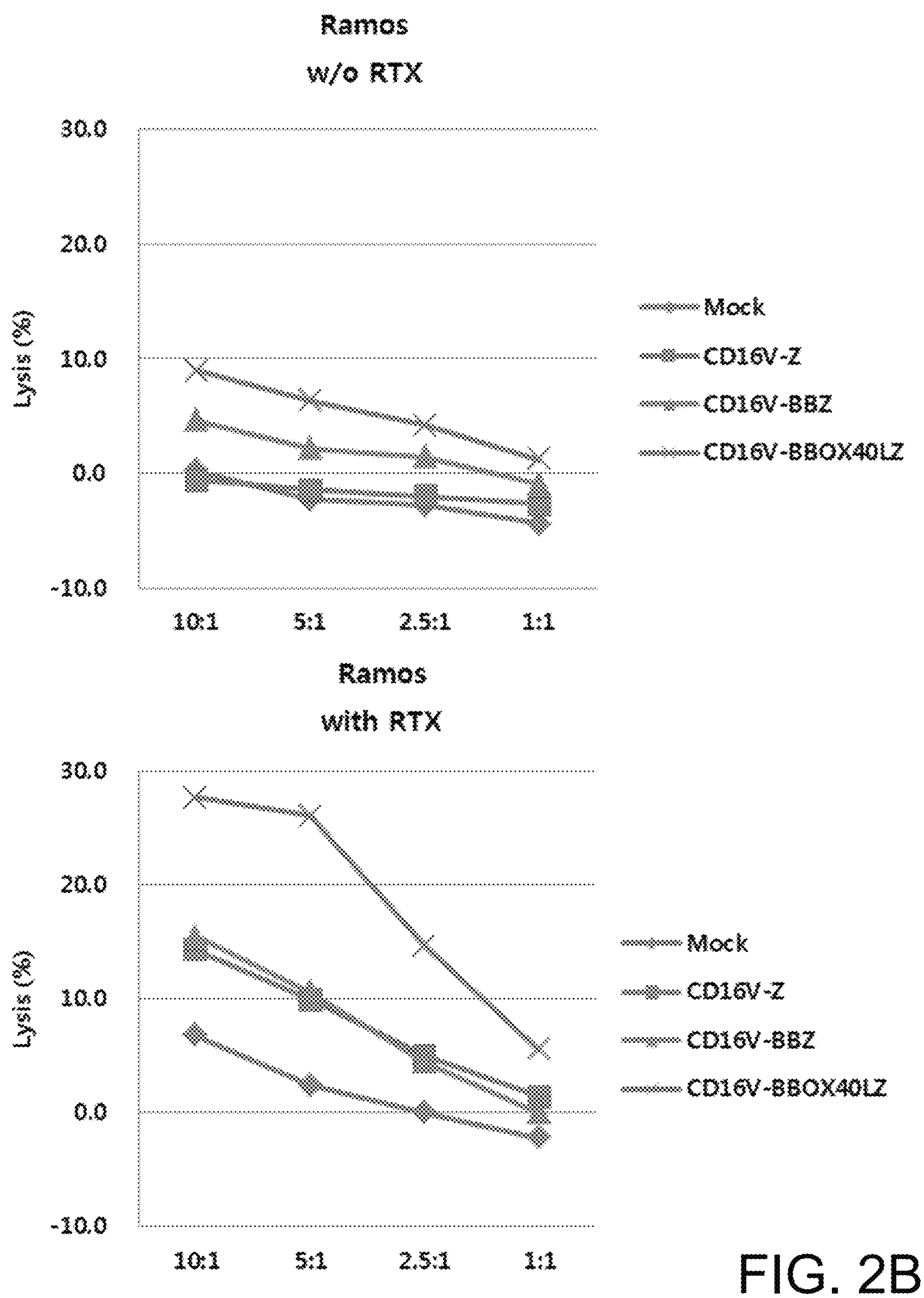

FIG. 2B shows assessment of NK cell-mediated cytotoxicity of NK92MI cells expressing CD16V-Z CAR (1st generation), CD16V-BBZ CAR (2nd generation) or CD16V-BBOX40LZ CAR (3rd generation), respectively, according to an embodiment of the present invention, when combined with an antibody to Ramos cells.

Figure 3A:
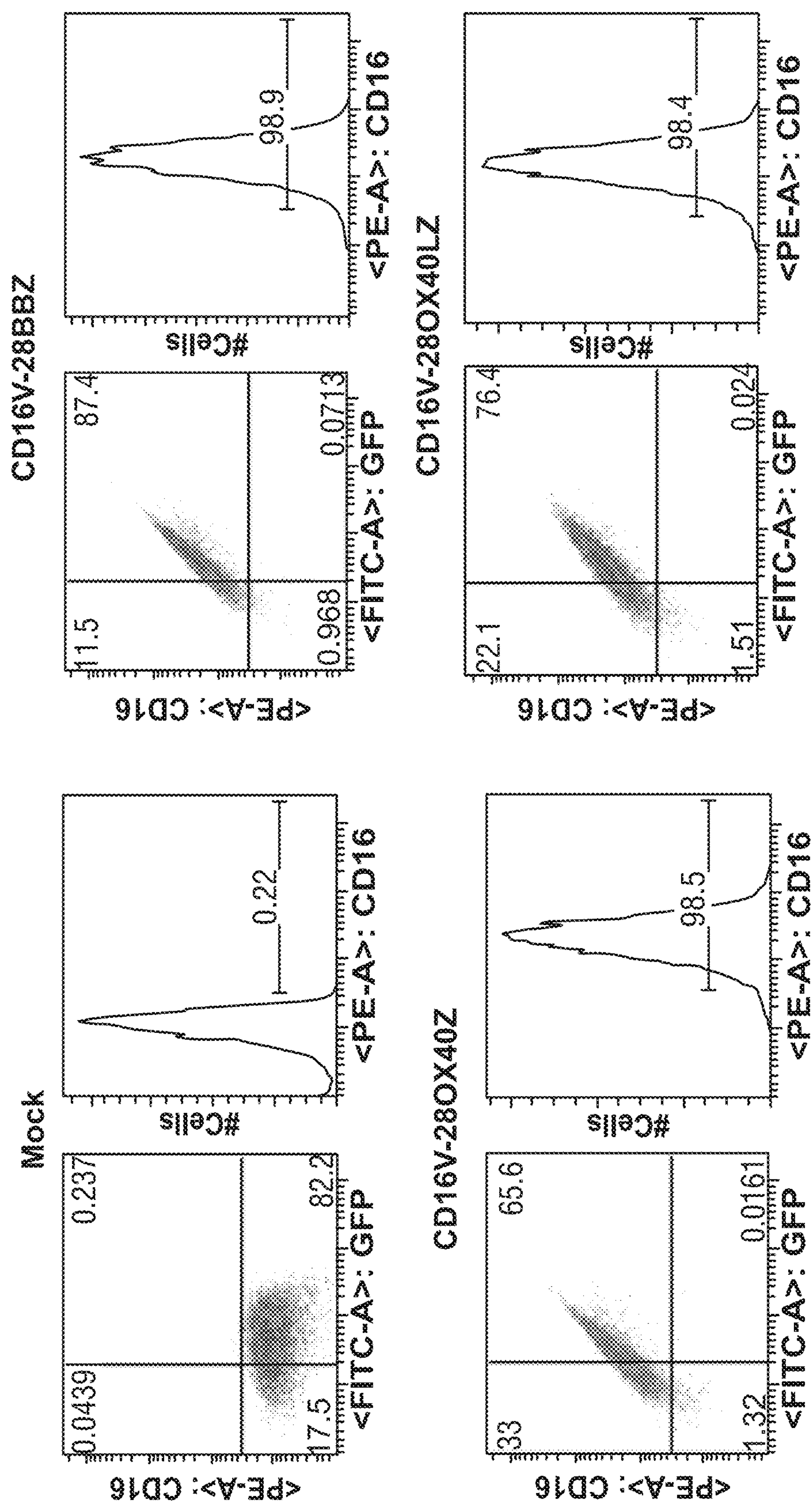

FIG. 3A shows CAR expression levels of NK92MI cells transduced with CD16V-28OX40LZ CAR, CD16V-28OX40Z CAR or CD16V-28BBZ CAR, respectively, all of which are 3rd generation CARs, according to an embodiment of the present invention.

Figure 3B:
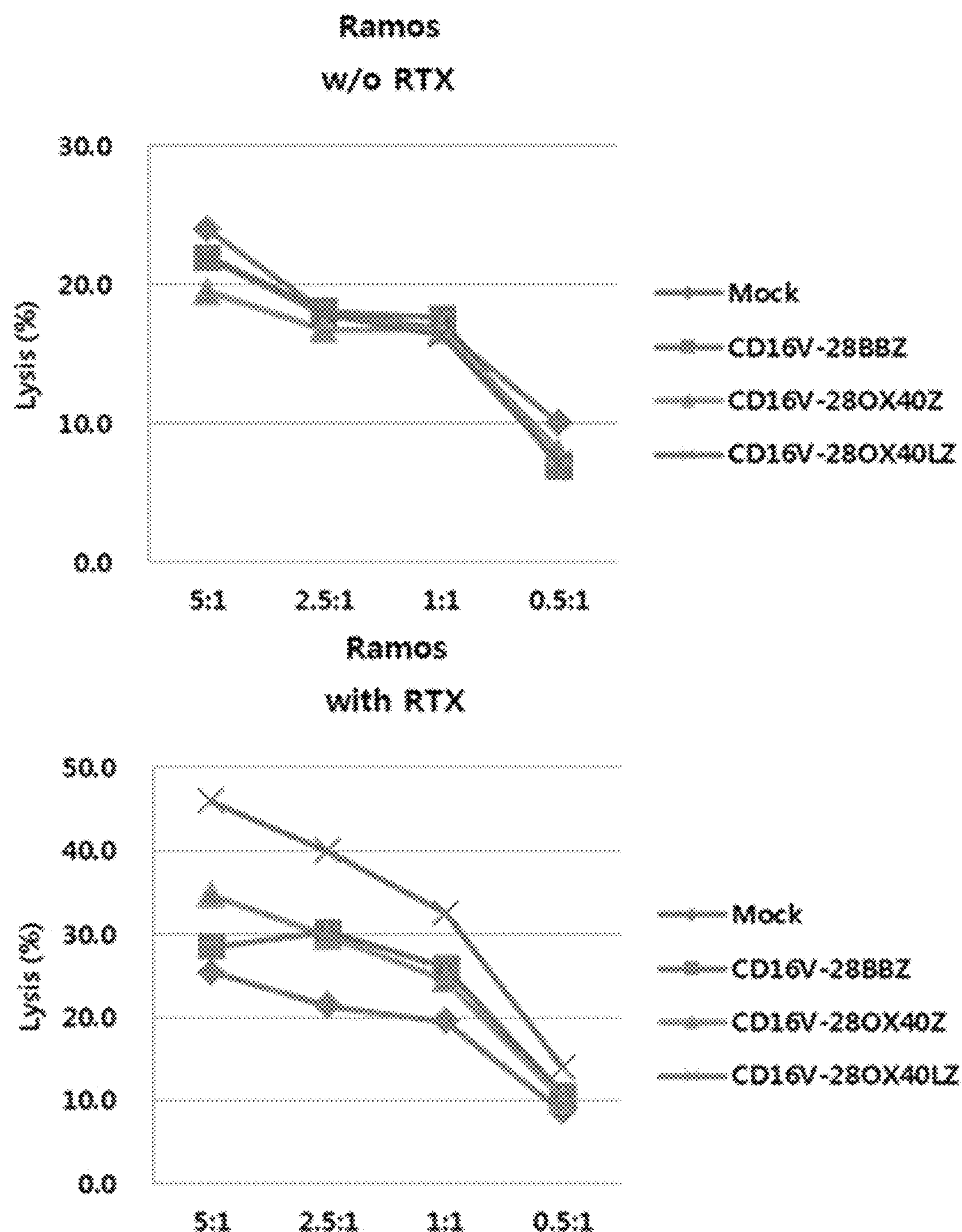

FIG. 3B shows assessment of NK cell-mediated cytotoxicity of NK92MI cells expressing CD16V-28OX40LZ CAR, CD16V-28OX40Z CAR or CD16V-28BBZ CAR, respectively, all of which are 3rd generation CARs, according to an embodiment of the present, when combined with an antibody to Ramos cells.

Figure 4A:
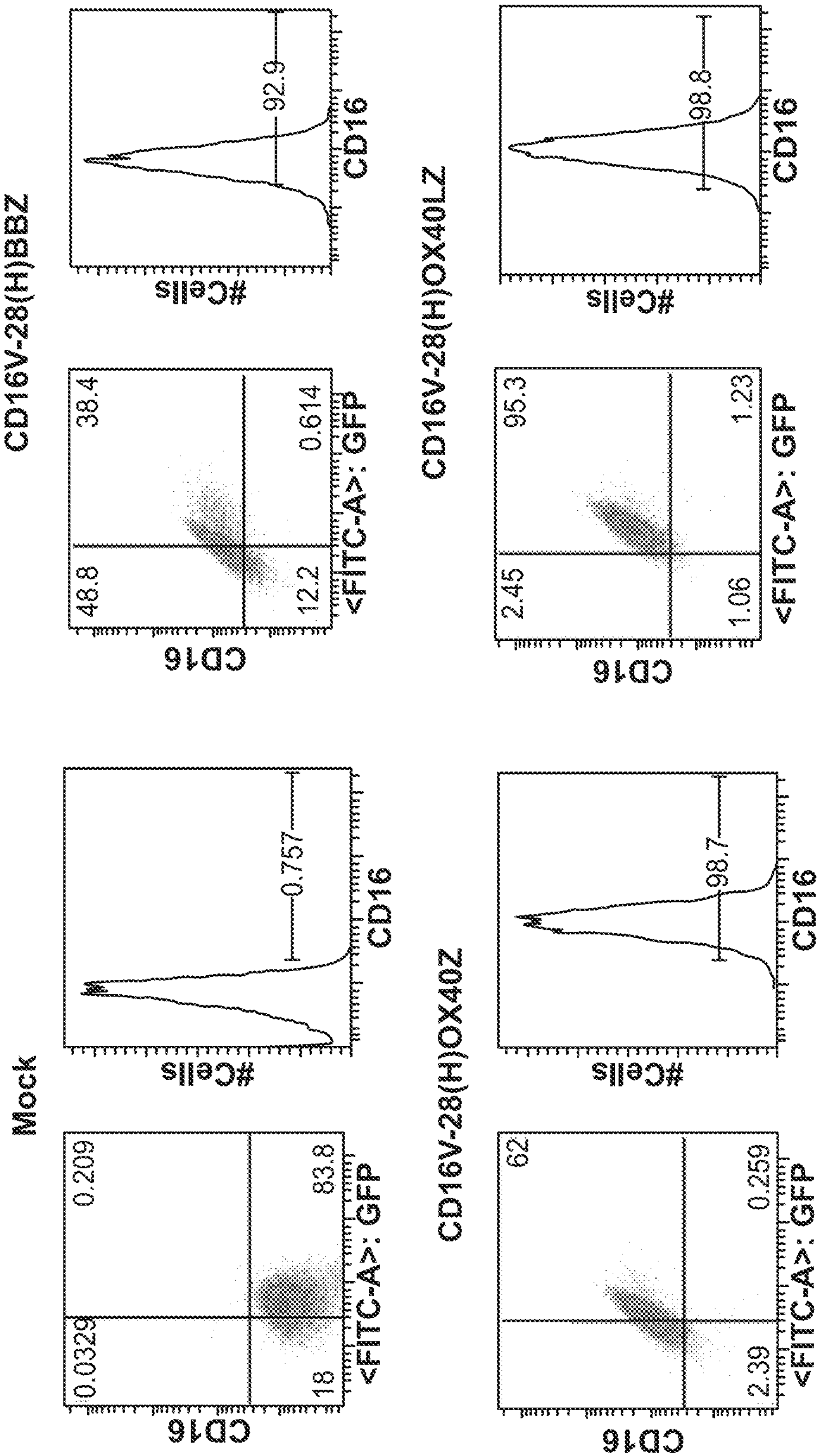

FIG. 4A shows CAR expression levels of NK92MI cells transduced with CD16V-28(H)BBZ CAR, CD16V-28(H)OX40Z CAR, or CD16V-28(H)OX40LZ CAR, respectively, all of which are 3rd generation CARs each containing CD28 at a hinge, according to an embodiment of the present invention.

Figure 4B:
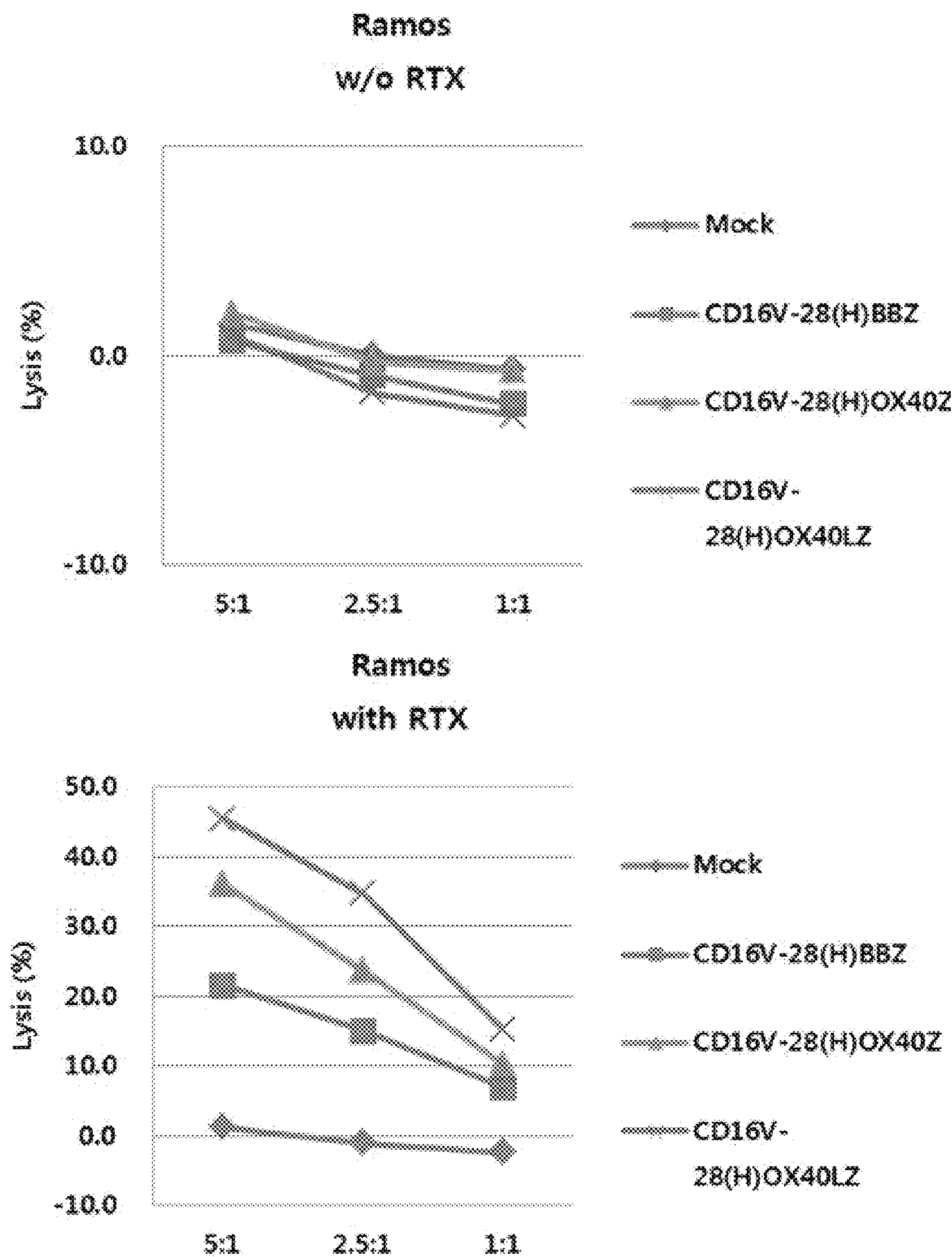

FIG. 4B shows assessment of NK cell-mediated cytotoxicity of NK91MI cells expressing CD16V-28(H)BBZ CAR, CD16V-28(H)OX40Z CAR or CD16V-28(H)OX40LZ CAR, respectively, all of which are 3rd generation CARs each having CD28 at a hinge, according to an embodiment of the present invention, when combined with an antibody to Ramos cells.

Figure 5A:
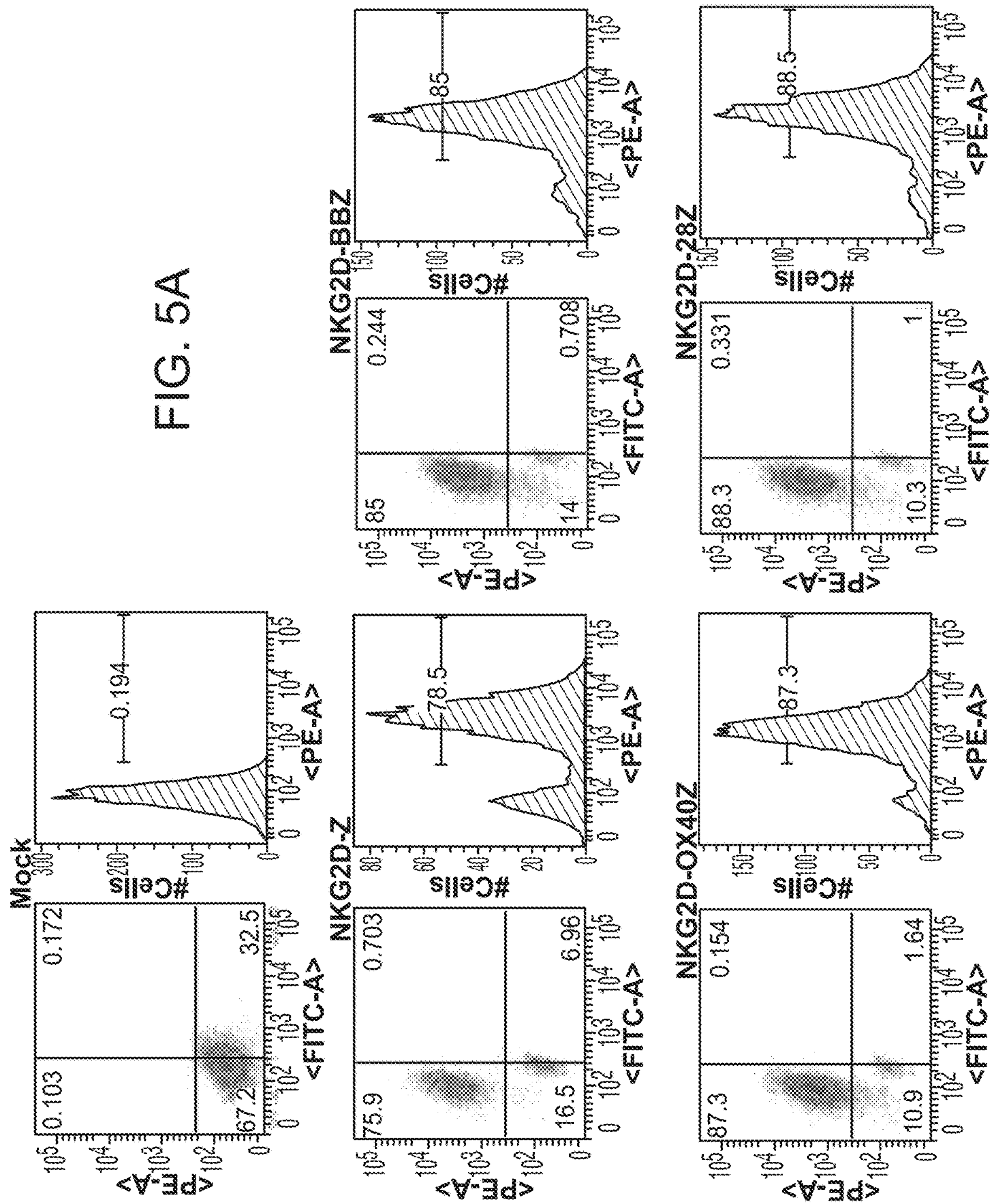

FIG. 5A shows CAR expression levels of NK92MI cells transduced with NKG2D-Z CAR (1st generation), NKG2D-28Z CAR (2nd generation), NKG2D-BBZ CAR (2nd generation) or NKG2D-OX40Z CAR (2nd generation), respectively, according to an embodiment of the present invention.

Figure 5B:
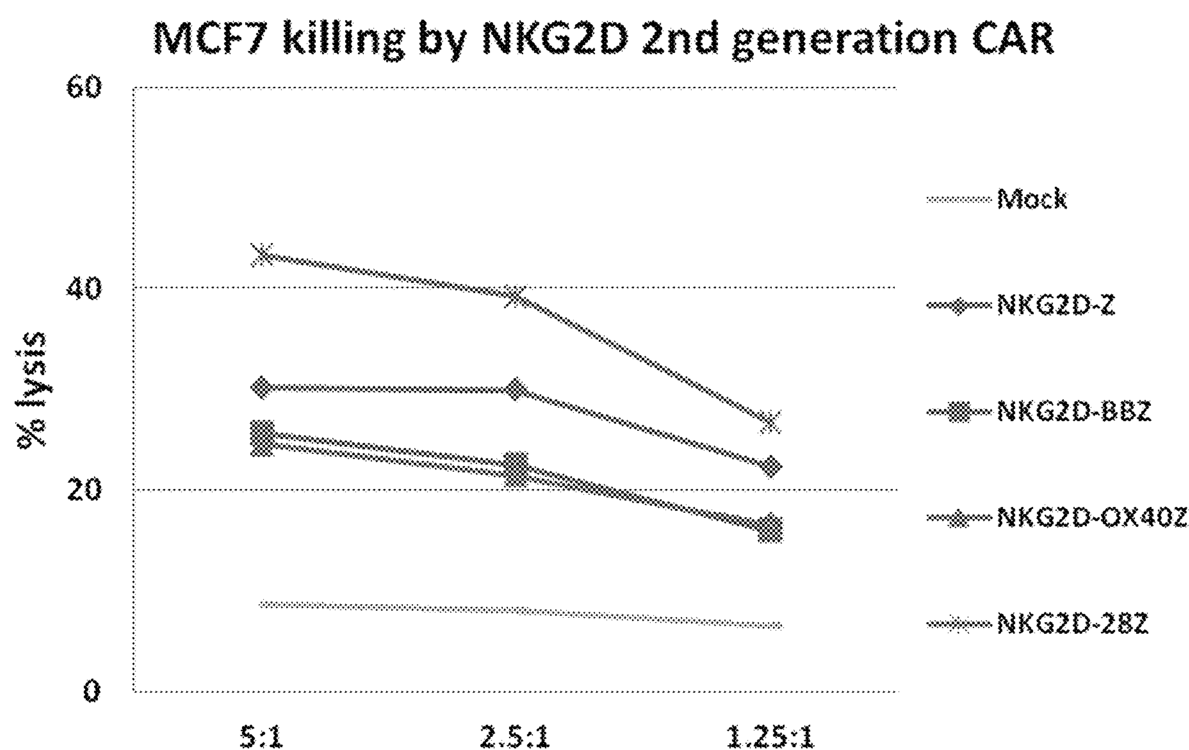

FIG. 5B shows assessment of NK cell-mediated cytotoxicity of NK92MI cells transduced with NKG2D-Z CAR (1st generation), NKG2D-28Z CAR (2nd generation), NKG2D-BBZ CAR (2nd generation) or NKG2D-OX40Z CAR (2nd generation), respectively, against human breast cancer cell lines MCF-7, according to an embodiment of the present invention.

Figure 6A:
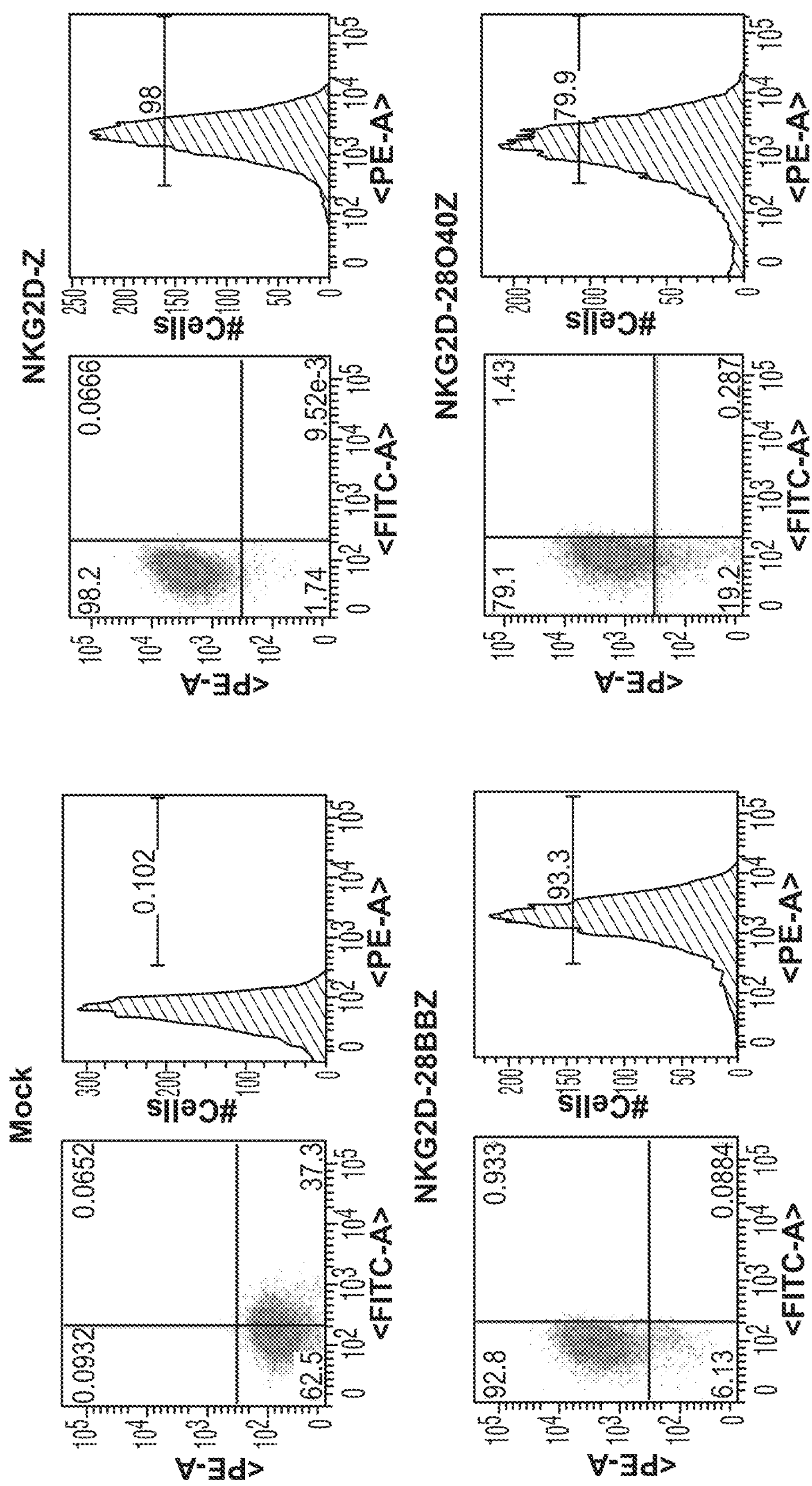

FIG. 6A shows CAR expression levels of NK92MI cells transduced with NKG2D-Z CAR (1st generation), NKG2D-28BBZ CAR (3rd generation) including CD28 signaling domain or NKG2D-28OX40Z CAR (3rd generation), respectively, according to the present invention.

Figure 6B:
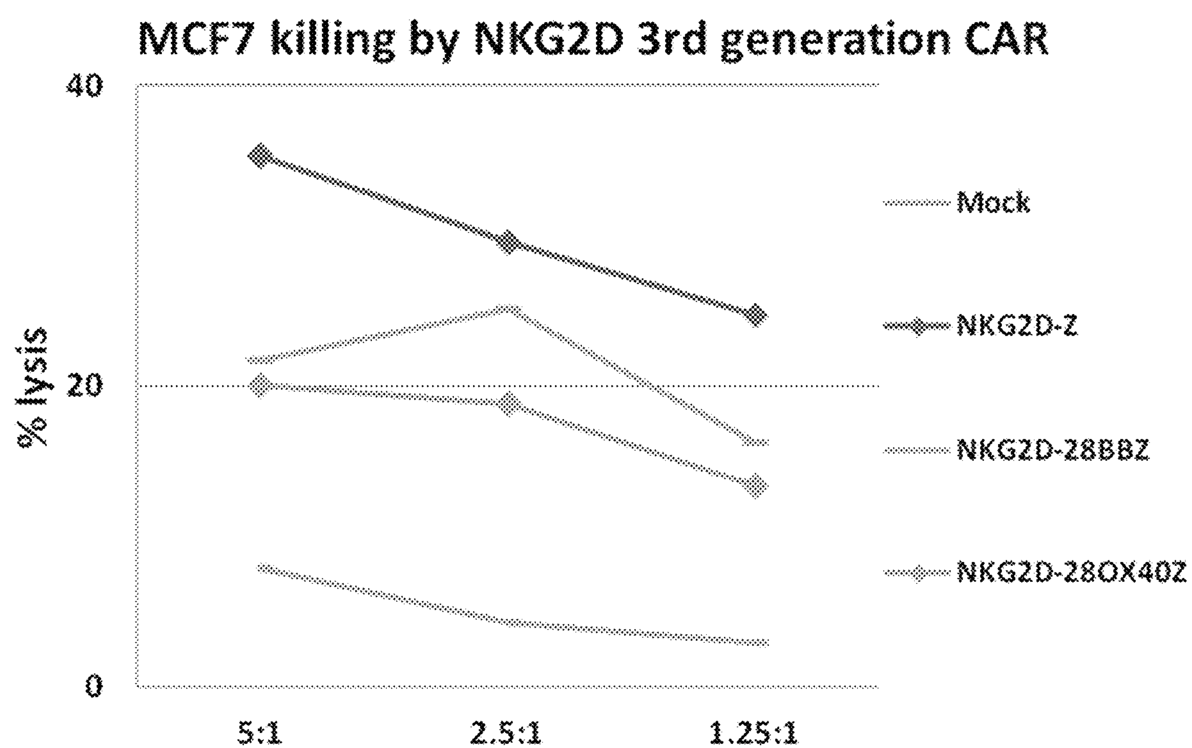

FIG. 6B shows assessment of NK cell-mediated cytotoxicity of NK92MI cells transduced with NKG2D-Z CAR (1st generation), NKG2D-28BBZ CAR including CD28 signaling domain (3rd generation) or NKG2D-28OX40Z CAR (3rd generation), respectively, against human breast cancer cell lines MCF-7, according to an embodiment of the present invention.

Figure 7A:
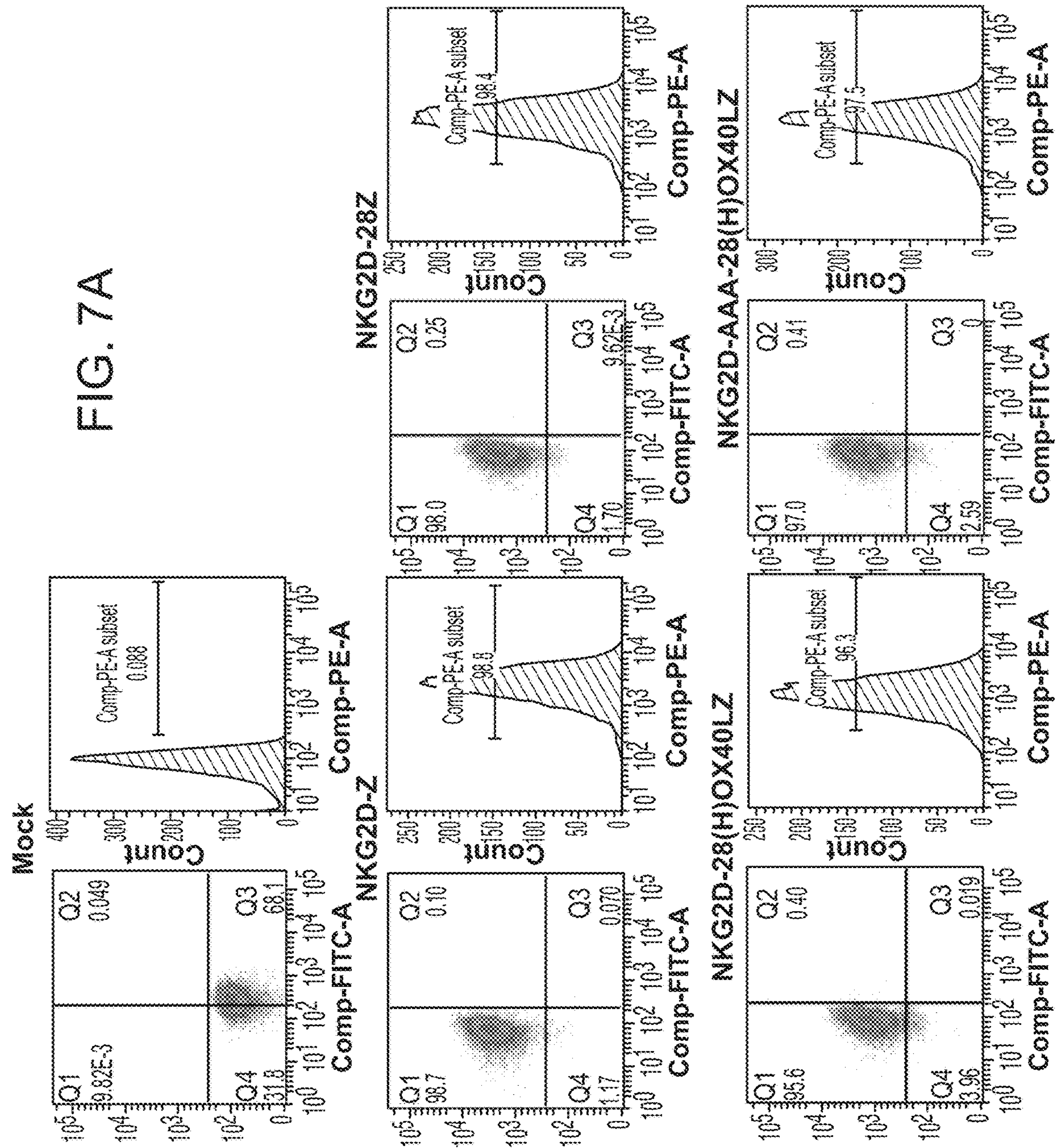

FIG. 7A shows CAR expression levels of NK92MI cells transduced with NKG2D-Z CAR (1st generation), NKG2D-28Z CAR (2nd generation), NKG2D-28(H)OX40LZ CAR (3rd generation) or NKG2D-AAA-28(H)OX40LZ CAR (3rd generation) including AAA sequence between NKG2D extracellular domain and CD28 hinge, respectively, according to an embodiment of the present invention.

Figure 7B:
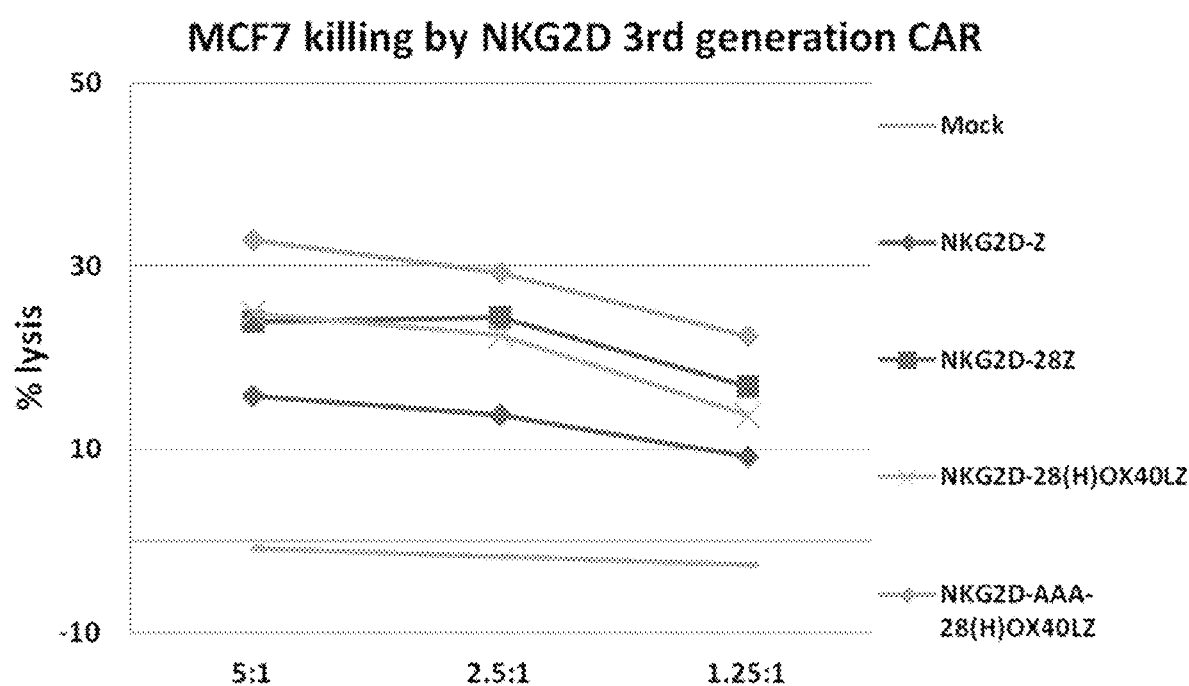

FIG. 7B shows assessment of NK cell-mediated cytotoxicity of NK92MI cells transduced with NKG2D-Z CAR (1st generation), NKG2D-28Z CAR (2nd generation), NKG2D-28(H)OX40LZ CAR (3rd generation) or NKG2D-AAA-28(H)OX40LZ CAR (3rd generation) including AAA sequence between NKG2D extracellular domain and CD28 hinge, respectively, against human breast cell lines MCF-7, according to an embodiment of the present invention.

Figure 8A:
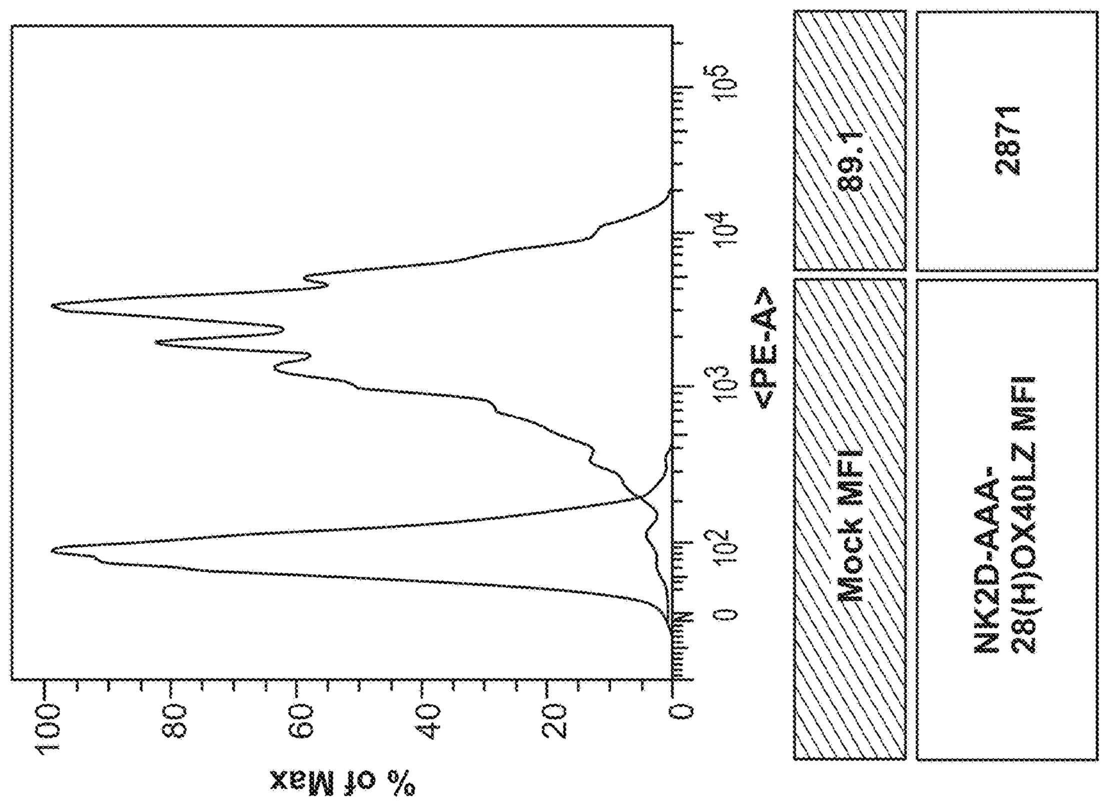
Figure 8A:
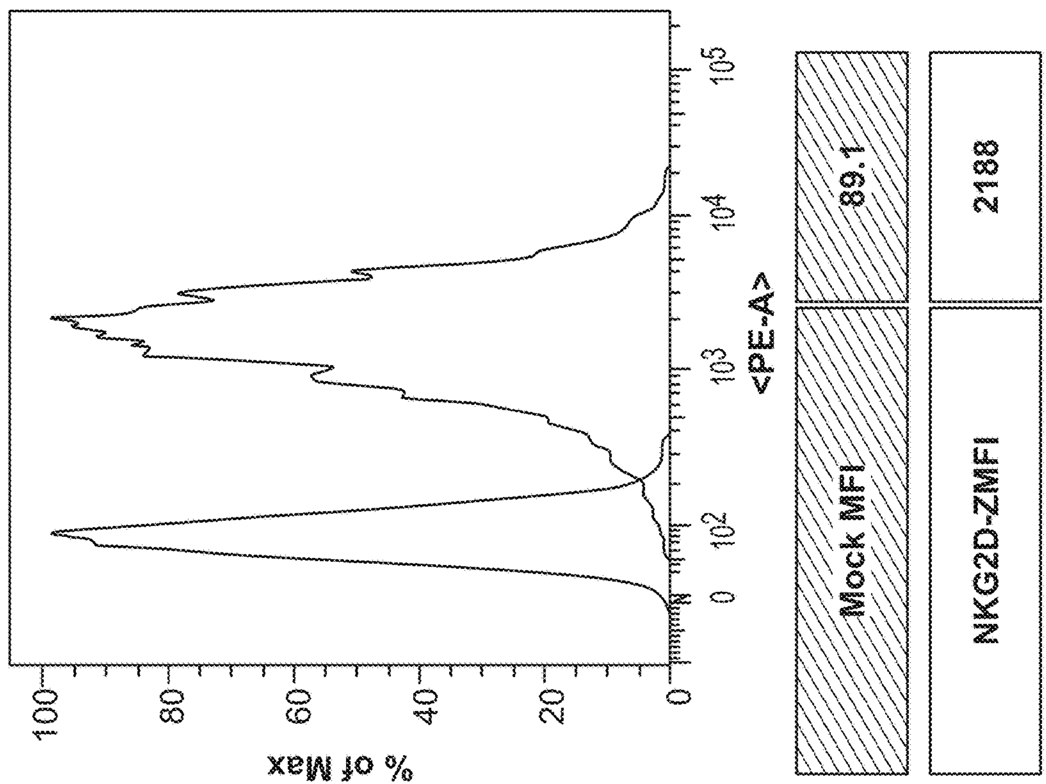

FIG. 8A shows CAR expression levels of NK92MI cells transduced with NKG2D-Z CAR (1st generation) or NKG2D-AAA-28(H)OX40LZ CAR (3rd generation) including AAA sequence between NKG2D extracellular domain and CD28 hinge, respectively, according to an embodiment of the present invention.

Figure 8B:
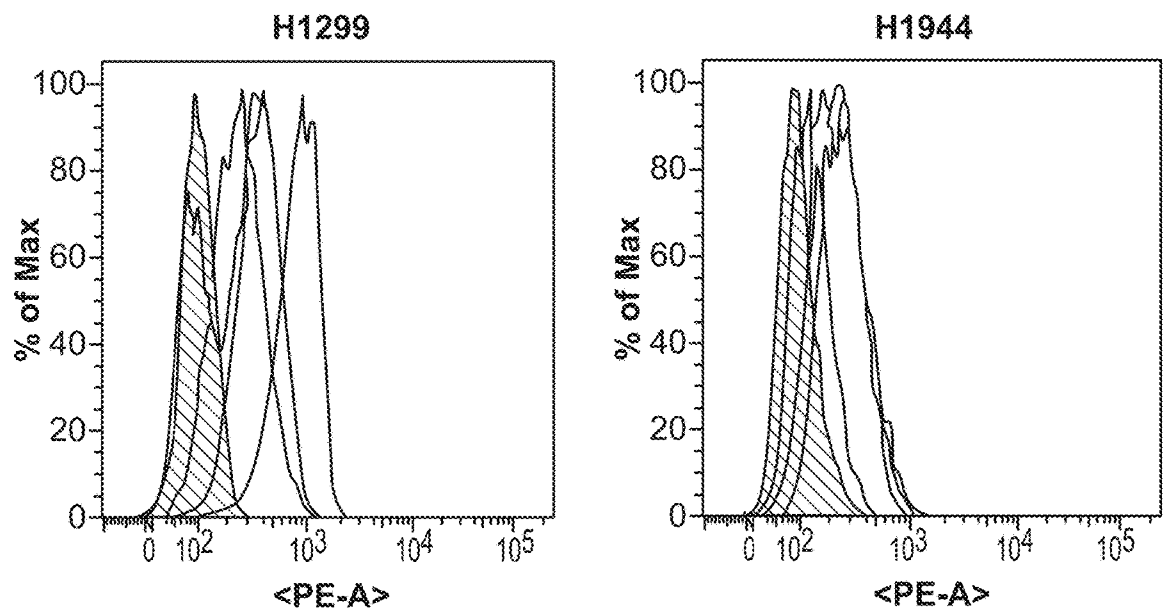

FIG. 8B shows expression levels of different NKG2D ligands in human lung cancer cell lines H1299 and H1944 according to an embodiment of the present invention.

Figure 8C:
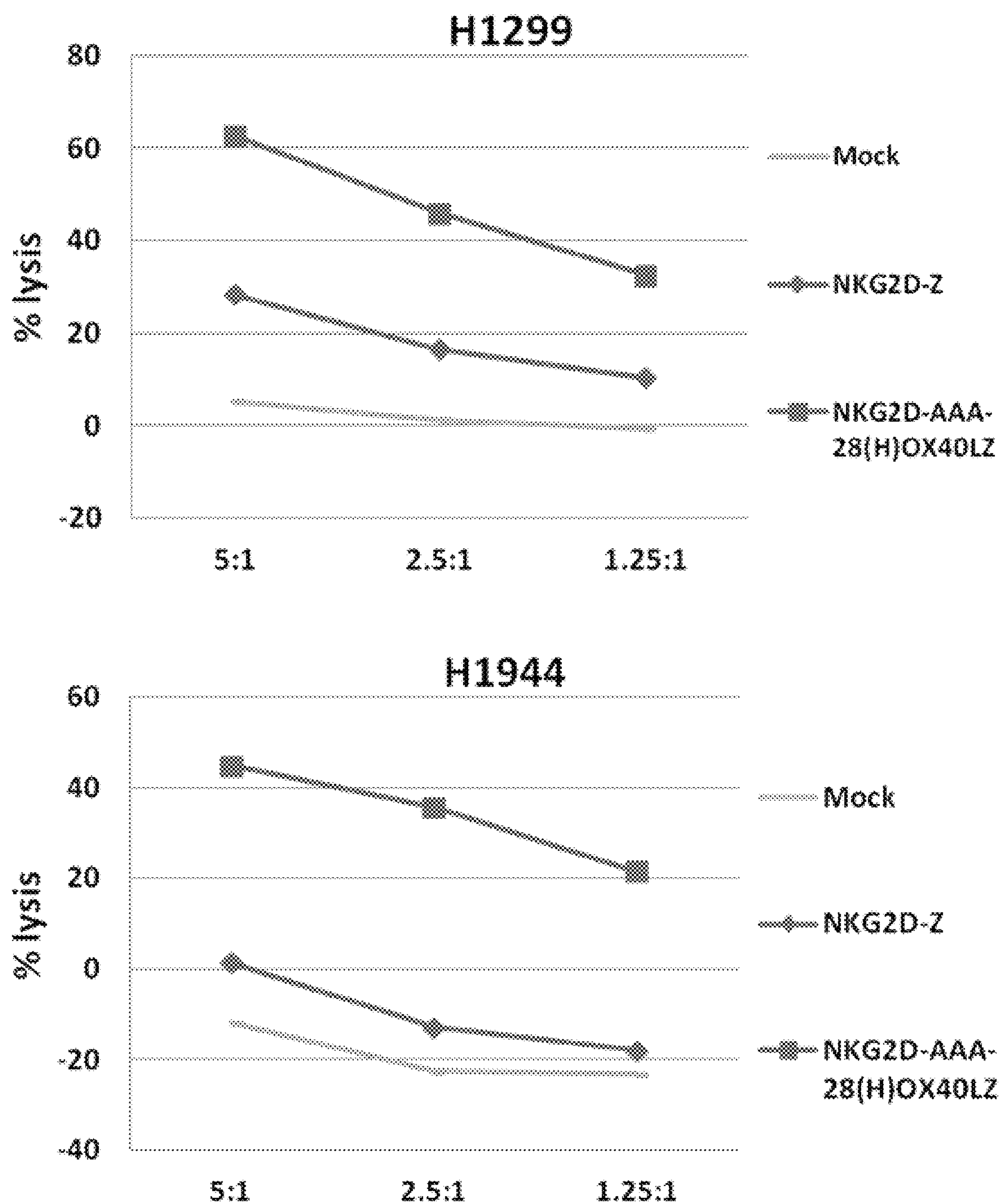

FIG. 8C shows assessment of NK-mediated cytotoxicity of NK92MI cells transduced with NKG2D-Z CAR (1st generation) or NKG2D-AAA-28(H)OX40LZ (3rd generation) including AAA sequence between NKG2D extracellular domain and CD28 hinge, respectively, against human lung cancer cell lines H1299 and H1944, according to an embodiment of the present invention.

BEST MODE

The present invention discloses a chimeric antigen receptor and NK cells expressing the same, and more particularly, a chimeric antigen receptor (CAR) with excellent effects of increasing anticancer activity of immune cells, by including an intracellular signaling domain which contains the whole or a portion of OX40 ligand (CD252), as well as immune cells expressing the same.

Hereinafter, the present invention will be described in detail.

The chimeric antigen receptor of the present invention may include an intracellular signaling domain which contains the whole or a portion of OX40 ligand (CD252).

According to one embodiment of the present invention, the chimeric antigen receptor may be one further including a transmembrane domain linked to the intracellular signaling domain; a spacer domain linked to the transmembrane domain; and an extracellular domain linked to the spacer domain. In addition, according to one embodiment of the present invention, the chimeric antigen receptor may be one further including a signal sequence linked to a terminal of the extracellular domain that is not linked with the spacer domain. According to one embodiment of the present invention, the above-described domains may be directly linked to one another or may be linked by a linker.

According to one embodiment of the present invention, the signal sequence may allow the extracellular domain to be positioned outside a cell membrane of immune cells (e.g., NK cells) when the chimeric antigen receptor is expressed. For example, the signal sequence may include the whole or a portion of CD16.

According to one embodiment of the present invention, the extracellular domain is a domain to be specifically linked to an antibody or to specifically recognize an antigen, and may include, for example, an Fc receptor, an antigen-binding fragment such as a single-chain variable fragment (ScFv) in an antibody, a natural cytotoxicity receptor, NKG2D, 2B4 or DNAM-1. Accordingly, in the present disclosure, the term "extracellular domain" is used with the same meanings as "antigenic recognition site," "antigen-binding fragment" and/or "antibody binding site."

The chimeric antigen receptor according to one embodiment of the present invention may include an Fc receptor as the extracellular domain and thus be used associated with different antibodies depending on cell types of cancer to be treated. According to one embodiment, the Fc receptor may be any one selected from the group consisting of CD16, CD32, CD64, CD23 and CD89. According to a more specific embodiment, the Fc receptor may be one including the whole or a portion of the CD16 V158 variant (CD16V).

According to another embodiment, the chimeric antigen receptor of the present invention may further include an antigen-binding fragment of an antibody, as an extracellular domain, which can directly recognize the antigen without co-administration along with the antibody. According to one embodiment, the antigen-binding fragment may be an Fab fragment, F(ab') fragment, F(ab')2 fragment or Fv fragment. According to one embodiment of the present invention, the antibody may be any one of various types of antibodies capable of binding antigen-specifically, briefly, having antigen-specific binding ability. For example, the antibody may be one in which one light chain and one heavy chain are bonded with each other, or one in which two light chains and two heavy chains are bonded with each other. For example, when two light chains and two heavy chains are bonded with each other, the antibody may be one in which a first unit including a first light chain and a first heavy chain bonded with each other and a second unit including a second light chain and a second heavy chain bonded with each other are combined with each other. Herein, the bond may be a disulfide bond, but it is not limited thereto. According to embodiments of the present invention, the above two units may be the same as or different from each other. For example, the first unit including the first light chain and the first heavy chain and the second unit including the second light chain and the second heavy chain may be the same as or different from each other. As such, an antibody prepared to recognize two different antigens by the first unit and the second unit, respectively, is typically referred to as a 'bispecific antibody.' In addition, for example, the antibody may be one in which three or more of the above-described units are combined with one another. The antigen-binding fragment of the present invention may be derived from various types of antibodies as described above, but it is not limited thereto.

According to another embodiment of the present invention, the extracellular domain used herein may be a natural killer receptor (also referred to as a 'natural cytotoxicity receptor'). According to a specific embodiment, the NK receptor may include NKp46, NKp30, NKp44, NKp80 and NKp65 receptors, but it is not limited thereto.

According to one embodiment of the present invention, the transmembrane domain penetrates through the cell membrane, and may be any one without limitation as long as the domain can penetrate through the cell membrane without interfering with functions of the extracellular domain and the intracellular signaling domain. For example, the transmembrane domain may include the whole or a portion of any one selected from the group consisting of CD8α and CD28.

According to one embodiment of the present invention, the extracellular domain and the transmembrane domain may be linked to each other by a spacer domain. For example, the spacer domain may be a hinge domain. According to a specific embodiment, the spacer domain may include the whole or a portion of any one selected from the group consisting of CD8α and CD28.

According to one embodiment of the present invention, the intracellular signaling domain is a portion located on an inner side of the cell membrane of NK cell, that is, on the cytoplasm thereof, and may include a sequence that can transmit a signal to activate NK cells when an antibody linked to the extracellular domain is combined with a target antigen.

According to one embodiment of the present invention, the chimeric antigen receptor may include one or more intracellular signaling domain(s). When including two or more intracellular signaling domains, the intracellular signaling domains may be linked in series with each other. For example, when including three intracellular signaling domains, a terminal of a first intracellular signaling domain may be linked to a terminal of the transmembrane domain that is not linked with the spacer domain, a terminal of a second intracellular signaling domain may be linked to a terminal of the first intracellular signaling domain that is not linked with the transmembrane domain, and a terminal of a third intracellular signaling domain may be linked to a terminal of the second intracellular signaling domain that is not linked with the first intracellular signaling domain. That is, the first, second and third intracellular signaling domains may be arranged in order from a cell membrane toward an inside of the cell. Further, even when including two, four or more intracellular signaling domains, these domains may be linked to one another in the same manner as described above. According to one embodiment of the present invention, such the respective domains may be directly linked to one another or may be linked by a linker.

According to one embodiment of the present invention, the chimeric antigen receptor may include two intracellular signaling domains. For example, the chimeric antigen receptor may include a first intracellular signaling domain linked to the transmembrane domain and a second intracellular signaling domain linked to a terminal of the first intracellular signaling domain that is not linked with the transmembrane domain. According to a more specific embodiment, the first intracellular signaling domain may include the whole or a portion of any one selected from the group consisting of OX40 (CD134), OX40 ligand (OX40L, CD252), 4-1BB (CD137), CD28, DAP10, CD3-zeta (CD3ζ) and DAP12, and the second intracellular signaling domain may include the whole or a portion of any one selected from the group consisting of OX40 ligand, CD3-zeta and DAP12. In this case, at least one of the first intracellular signaling domain and the second intracellular signaling domain includes the whole or a portion of OX40 ligand. For example, the chimeric antigen receptor may include a first intracellular signaling domain containing the whole or a portion of OX40 ligand and a second intracellular signaling domain containing the whole or a portion of any one selected from CD3-zeta and DAP12. Further, for example, the chimeric antigen receptor may include a first intracellular signaling domain containing the whole or a portion of any one selected from the group consisting of CD3-zeta and DAP12 and a second intracellular signaling domain containing the whole or a portion of OX40 ligand.

According to another embodiment of the present invention, the chimeric antigen receptor may include three intracellular signaling domains. For example, the chimeric antigen receptor may include: a first intracellular signaling domain linked to the transmembrane domain; a second intracellular signaling domain linked to a terminal of the first intracellular signaling domain that is not linked with the transmembrane domain; and a third intracellular signaling domain linked to a terminal of the second intracellular signaling domain that is not linked with the first intracellular signaling domain. According to a more specific embodiment, the first intracellular signaling domain may include the whole or a portion of any one selected from the group consisting of 4-1BB, OX40, OX40 ligand, CD28 and DAP10, the second intracellular signaling domain may include the whole or a portion of any one selected from the group consisting of OX40 ligand, OX40 and 4-1BB, and the third intracellular signaling domain may include the whole or a portion of any one selected from the group consisting of OX40 ligand, CD3-zeta and DAP12. In such a case, at least one of the first intracellular signaling domain, the second intracellular signaling domain and the third intracellular signaling domain may include the whole or a portion of OX40 ligand.

In another aspect, the present invention may provide a chimeric antigen receptor, which includes: a first intracellular signaling domain containing the whole or a portion of any one selected from the group consisting of CD28 and 4-1BB; a second intracellular signaling domain containing the whole or a portion of any one selected from the group consisting of OX40 ligand, OX40 and 4-1BB; and a third intracellular signaling domain containing the whole or a portion of CD3-zeta, wherein the first, second and third intracellular signaling domains are arranged in order from the cell membrane toward the inside of the cell. According to one embodiment of the present invention, the above respective domains may be directly linked to one another or may be linked by a linker.

According to one embodiment of the present invention, the chimeric antigen receptor may further include: a transmembrane domain linked to the first intracellular signaling domain; a spacer domain linked to the transmembrane domain; and an extracellular domain linked to the spacer domain. In addition, the chimeric antigen receptor may further include a signal sequence linked to the extracellular domain. According to one embodiment of the present invention, the above respective domains may be directly linked to one another or may be linked by a linker.

According to one embodiment of the present invention, the extracellular domain is a domain for specifically binding with an antibody or specifically recognizing an antigen, for example, an Fc receptor, an antigen-binding fragment of an antibody such as a single-chain variable fragment (ScFv), NK receptor (natural cytotoxicity receptor), NKG2D, 2B4 or DNAM-1, etc. Thus, in the present disclosure, the term "extracellular domain" is used with the same meanings as the "antigenic recognition site", "antigen-binding fragment" and/or "antibody binding site."

The chimeric antigen receptor according to an embodiment of the present invention may include an Fc receptor as the extracellular domain, and therefore, can be used along with a variety of antibodies depending on cell types of cancer to be treated. According to one embodiment, the Fc receptor may include any one selected from the group consisting of CD16, CD32, CD64, CD23 and CD89, and variants thereof. According to a more specific embodiment, the Fc receptor may include CD16 or variants thereof, and most specifically, may include the whole or a portion of CD16 V158 variant (CD16V).

According to another embodiment, the chimeric antigen receptor of the present invention may include, as the extracellular domain, an antigen-binding fragment of an antibody which directly recognizes the antigen without co-administration along with the antibody. According to one embodiment, the antigen-binding fragment may be an Fab fragment, F(ab') fragment, F(ab')2 fragment or Fv fragment. According to one embodiment of the present invention, the antibody may be any one of various types of antibodies capable of binding antigen-specifically. For example, the antibody may be one in which one light chain and one heavy chain are bonded with each other, or one in which two light chains and two heavy chains are bonded with each other. For example, when two light chains and two heavy chains are bonded with each other, the antibody may be one in which the first unit including the first light chain and the first heavy chain bonded with each other and the second unit including the second light chain and the second heavy chain bonded with each other are combined with each other. The bond may be a disulfide bond, but it is not limited thereto. According to an embodiment of the present invention, the above two units may be the same as or different from each other. For example, the first unit including the first light chain and the first heavy chain and the second unit including the second light chain and the second heavy chain may be the same as or different from each other. As such, an antibody prepared to recognize two different antigens by the first unit and the second unit, respectively, is commonly referred to as a 'bispecific antibody' in the related art. In addition, for example, the antibody may be one in which the above three or more units are combined with one another. The antigen-binding fragment of the present invention may be derived from various types of antibodies as described above, but it is not limited thereto.

According to another embodiment of the present invention, the extracellular domain used herein may be a NK receptor (natural cytotoxicity receptor). According to a specific embodiment, the NK receptor may include NKp46, NKp30, NKp44, NKp80 and NKp65 receptors, but it is not limited thereto.

According to one embodiment, the signal sequence may include the whole or a portion of CD16. According to another embodiment, the extracellular domain may include the whole or a portion of CD16 V158 variant (CD16V). According to another embodiment, the spacer domain may include the whole or a portion of any one selected from the group consisting of CD8α (CD8-alpha) and CD28. According to another embodiment, the transmembrane domain may include the whole or a portion of any one selected from the group consisting of CD8α and CD28.

According to a specific embodiment, the chimeric antigen receptor may include one or more amino acid sequence selected from the group consisting of SEQ ID NOs: 33, 41, 43, 45, 47, 49, 51, 53, 55, 69, 71, 77, 81, 83, 85, 87, 89, 91 and 93 or variants thereof having a sequence identity of 80% or more.

According to another aspect, the present invention provides immune cells (e.g., NK cells) to express the above-described chimeric antigen receptor according to the present invention.

The immune cells of the present invention may exhibit toxicity to tumor cells. It is determined that the chimeric antigen receptor according to the invention exhibits specific toxicity to what types of tumor cells depending on what types of antibodies are combined with the extracellular domains. Therefore, the types of tumor cells, to which the immune cells expressing the chimeric antigen receptor according to the present invention may exhibit specific toxicity, are not particularly limited. According to one embodiment, when the immune cells (e.g., NK cells) of the present invention are used along with rituximab, the cells may exhibit toxicity to malignant lymphoma cells. For example, the malignant lymphoma cells may express CD20. Further, for example, the malignant lymphoma may be B-cell lymphoma.

According to another aspect, the invention further provides a pharmaceutical composition for prevention or treatment of tumor or tumor metastasis, which includes the immune cells (e.g., NK cells) expressing the above-described chimeric antigen receptor according to the present invention, in the number of 2 to 7.5 times the number of tumor cells (e.g., malignant lymphoma cells) in a subject to be treated ('treatment target').

According to one embodiment of the present invention, the number of immune cells (e.g., NK cells) included in the pharmaceutical composition of the present invention in a single dose may range from 0.75 to 10 times the number of tumor cells (e.g., malignant lymphoma cells) in the treatment target. For example, the number of the immune cells (e.g., NK cells) in a single dose may range from 2 to 7.5 times the number of tumor cells (e.g., malignant lymphoma cells) in the treatment target.

According to another aspect, the present invention further provides a nucleic acid sequence encoding the above-described chimeric antigen receptor according to the present invention.

According to one embodiment of the present invention, the nucleic acid sequence may include one or more nucleotide sequences selected from the group consisting of SEQ ID NOs: 32, 40, 42, 44, 46, 48, 50, 52, 54, 68, 70, 76, 80, 82, 84, 86, 88, 90 and 92 or variants thereof having a sequence identity of 80% or more.

According to another aspect, the present invention further provides a vector including the above-described nucleic acid sequence according to the present invention.

According to another aspect, the present invention further provides a method of treating tumor which includes administering the above-described immune cells to a subject.

According to another aspect, the present invention further provides a method of preventing tumor metastases which includes administering the above-described immune cells to a subject.

The subject may be a mammal having a tumor, specifically, a human, but it is not limited thereto.

Administration may be performed in such a way that the number of immune cells (e.g., NK cells) expressing the chimeric antigen receptor according to the present invention may be in a range of 2 to 7.5 times the number of tumor cells (e.g., malignant lymphoma cells) in the treatment target.

An administration method is not particularly limited and, for example, may include administration through an oral or parenteral route.

Tumor is not particularly limited but may include, for example, malignant lymphoma, leukemia, breast cancer, lung cancer, etc., and more specifically, B-cell lymphoma.

Hereinafter, the present invention will be described in more detail by way of the following examples. These examples are proposed only for describing the present invention in detail and the scope of the present invention is not limited to the contents illustrated in the examples.

Example 1: Methods and Reagents

Cell Lines

The human B-series cell line Ramos, human erythroleukemic cell line K562, human breast cancer cell line MCF-7, H1299 and H1944 of human lung cancer cell lines, as well as NK-92MI are supplied from American Type Culture Collection (ATCC, Manassas, VA, USA). K562 was maintained in RPMI-1640 containing 10% FBS (Gibco, Grand Island, NY, USA). Ramos was maintained in RPMI-1640 (ATCC) (Manassas, VA) containing 10% FBS (fetal bovine serum; Gibco, Grand Island, NY, USA). MCF-7 was maintained in EMEM (ATCC)+10% FBS (Gibco) medium, while H1299 and H1944 cell lines were maintained in RPMI-1640 (ATCC)+10% FBS (Gibco). In addition, NK-92MI and transduced NK-92MI cells were maintained in CellGro® serum-free medium containing 1% human plasma. The human embryonic kidney fibroblast, that is, 293T cell line was supplied from the ATCC. This cell line was maintained in DMEM (Gibco, Grand Island, NY, USA) containing 10% FBS (Gibco, Grand Island, NY, USA).

Plasmid

The signal sequence and the extracellular domain of the FCRG3A V158 mutant (CD16V); the extracellular domain of NKG2D; the signal sequence of CD8α, the hinge and transmembrane domains of CD8α; the hinge and transmembrane domains of CD28; and the intracellular signaling domains of 4-1BB, OX40, OX40 ligand (OX40L) and CD3ζ, respectively, were synthesized artificially. The above listed materials were assembled in various combinations through splicing by overlapping extension by PCR ('SOE-PCR'). The PCR products were confirmed by direct sequencing. Each PCR product was cut into Nhe1 and EcoRI, and then inserted into (i.e., ligated to) Nhe1 and EcoRI sites of a $3^{rd}$ generation self-inactivating lentiviral expression vector such as MSCV-EF1α-GFP vector or EF1a-MCS vector.

Chimeric antigen receptors (CAR) according to embodiments of the present invention have been summarized in Table 1 below. The domains of all CARs according to the embodiments of the present invention have been linked in series (in tandem) to one another and also linked in frame.

TABLE 1

| Type of CAR (generation) | Serial No. | Abbreviation | Signal sequence | ECD | Hinge | TM | Signal-1 | Signal-2 | Signal-3 |
|---|---|---|---|---|---|---|---|---|---|
| — | C1 | NC | CD16 | CD16V | CD8α | CD8α | | | |
| 1st | C2 | CD16V-Z | CD16 | CD16V | CD8α | CD8α | CD3ζ | | |
| 2nd | C3 | CD16V-BBZ | CD16 | CD16V | CD8α | CD8α | 4-1BB | CD3ζ | |
| 2nd | C4 | CD16V-OX40Z | CD16 | CD16V | CD8α | CD8α | OX40 | CD3ζ | |
| 2nd | C5 | CD16V-OX40LZ | CD16 | CD16V | CD8α | CD8α | OX40L | CD3ζ | |
| 2nd | C5-1 | CD16V-ZOX40L | CD16 | CD16V | CD8α | CD8α | CD3ζ | OX40L | |
| 2nd | C6 | CD16V-28Z | CD16 | CD16V | CD8α | CD28 | CD28 | CD3ζ | |
| 2nd | C7 | CD16V-28(H)Z | CD16 | CD16V | CD28 | CD28 | CD28 | CD3ζ | |
| 3rd | C8 | CD16V-BBOX40Z | CD16 | CD16V | CD8α | CD8α | 4-1BB | OX40 | CD3ζ |
| 3rd | C9 | CD16V-OX40BBZ | CD16 | CD16V | CD8α | CD8α | OX40 | 4-1BB | CD3ζ |
| 3rd | C10 | CD16V-28BBZ | CD16 | CD16V | CD8α | CD28 | CD28 | 4-1BB | CD3ζ |
| 3rd | C11 | CD16V-28OX40Z | CD16 | CD16V | CD8α | CD28 | CD28 | OX40 | CD3ζ |
| 3rd | C12 | CD16V-28OX40LZ | CD16 | CD16V | CD8α | CD28 | CD28 | OX40L | CD3ζ |
| 3rd | C13 | CD16V-28(H)BBZ | CD16 | CD16V | CD28 | CD28 | CD28 | 4-1BB | CD3ζ |
| 3rd | C14 | CD16V-28(H)OX40Z | CD16 | CD16V | CD28 | CD28 | CD28 | OX40 | CD3ζ |
| 3rd | C15 | CD16V-28(H)OX40LZ | CD16 | CD16V | CD28 | CD28 | CD28 | OX40L | CD3ζ |
| 3rd | C16 | CD16V-BBOX40LZ | CD16 | CD16V | CD8α | CD8α | 41BB | OX40L | CD3ζ |

CD16V-Z CAR (1st generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD3ζ-derived intracellular signaling domain (nucleotides 299-634, GenBank NM 000734.3); and stop codon TGA.

CD16V-BBZ CAR (2nd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

CD16V-OX40Z CAR (2nd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD134-derived intracellular signaling domain (nucleotides 733-840, GenBank AB590584.1); CD3ζ-derived intracellular signaling domain (nucleotides 299-634, GenBank NM 000734.3); and stop codon TGA.

CD16V-OX40LZ CAR (2nd generation) is provided by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

CD16V-ZOX40L CAR (2nd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD3ζ-derived intracellular signaling domain (nucleotides 299-634, GenBank NM 000734.3); CD252-derived intracellular signaling domain (nucleotides 141-206, GenBank NM 003326.4); and stop codon TGA.

CD16V-28Z CAR (2nd generation) is produced by connecting: the signal sequence domain of CD16 (34-84 nucleotides, GenBank Accession No. X52645); the extracellular domain of CD16V (FCRG3A V158) (nucleotides 85-651, G mutation of nucleotide No. 559 in GenBank Accession No. X52645); human CD8α-derived hinge domain (nucleotides 1292-1435, GenBank NM 001768.6); CD28-derived transmembrane and intracellular signaling domains (nucleotides 679-882, GenBank NM 006139.3); CD3ζ-derived intracellular signaling domain (nucleotides 299-634, GenBank NM 000734.3); and stop codon TGA.

CD16V-28(H)Z CAR (2nd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); CD28-derived hinge, transmembrane and intracellular signaling domains (nucleotides 562-882, GenBank NM 006139.3); CD3ζ-derived intracellular signaling domain (nucleotides 299-634, GenBank NM 000734.3); and stop codon TGA.

CD16V-BBOX40Z CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD137-derived intracellular signaling domain (nucleotides 901-1026, GenBank NM 001561.5); CD134-derived intracellular signaling domain (nucleotides 733-840, GenBank AB590584.1); CD3ζ-derived intracellular signaling domain (nucleotides 299-634, GenBank NM 000734.3); and stop codon TGA.

CD16V-OX40BBZ CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD134-derived intracellular signaling domain (nucleotides 733-840, GenBank AB590584.1); CD137-derived intracellular signaling domain (nucleotides 901-1026, GenBank NM 001561.5); CD3-derived intracellular signaling domain (nucleotides 299-634, GenBank NM 000734.3); and stop codon TGA.

CD16V-28BBZ CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); CD8α-derived hinge domain (nucleotides 1292-1435, GenBank NM 001768.6); CD28-derived transmembrane and intracellular signaling domains (nucleotides 679-882, GenBank NM 006139.3); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

CD16V-28OX40Z CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); CD8α-derived hinge domain (nucleotides 1292-1435, GenBank NM 001768.6); CD28-derived transmembrane and intracellular signaling domains (nucleotides 679-882, GenBank NM 006139.3); CD134-derived intracellular signaling domain (nucleotides 733-840, GenBank AB590584.1); CD3ζ-derived intracellular signaling domain (nucleotides 299-634, GenBank NM 000734.3); and stop codon TGA.

CD16V-28OX40LZ CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); CD8α-derived hinge domain (nucleotides 1292-1435, GenBank NM 001768.6); CD28-derived transmembrane and intracellular signaling domains (nucleotides 679-882, GenBank NM 006139.3); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

CD16V-28(H)BBZ CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); CD28-derived hinge, transmembrane and intracellular signaling domains (nucleotides 562-882, GenBank NM 006139.3); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

CD16V-28(H)OX40Z CAR (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); CD28-derived hinge, transmembrane and intracellular signaling domains (nucleotides 562-882, GenBank NM 006139.3); CD134-derived intracellular signaling domain (nucleotides 733-840, GenBank AB590584.1); CD3ζ-derived intracellular signaling domain (nucleotides 299-634, GenBank NM 000734.3); and stop codon TGA.

CD16V-28(H)OX40LZ CAR (3rd generation) is produced by connecting: the signal sequence domain of CD16 (nucleotides 34-84, GenBank Accession No. X52645); the extracellular domain of CD16V (nucleotides 85-651, G mutation of nucleotide No. 559 in GenBank Accession No. X52645); CD28-derived hinge, transmembrane and intracellular signaling domains (nucleotides 562-882, GenBank NM 006139.3); CD252-derived intracellular signaling domain (nucleotides 141-206, GenBank NM 003326.4); and CD3ζ-derived intracellular signaling domain (nucleotides 299-634, GenBank NM 000734.3) and stop codon TGA.

CD16V-BBOX40LZ (3rd generation) is produced by connecting: the signal sequence domain of CD16 (nucleotides 34-84, GenBank Accession No. X52645); the extracellular domain of CD16V (FCRG3A V158) (nucleotides 85-651, G mutation of nucleotide No. 559 in GenBank Accession No. X52645); human CD8α-derived hinge and transmembrane domains (nucleotides 1292-1507, GenBank NM 001768.6); CD137-derived intracellular signaling domain (nucleotides 901-1026, GenBank NM 001561.5); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

The sequence listings of the domains used for the chimeric antigen receptors (CARs) and a preparation method thereof according to the embodiments of the present invention are summarized in Table 2 below.

TABLE 2

| Sequence No. | Name of sequence | Details of sequence |
|---|---|---|
| 1 | CD16 nucleotide | Signal sequence and extracellular domain of CD16 (34-651 nucleotides, GenBank Accession No. X52645) |
| 2 | CD16 amino acid | Amino acid sequence corresponding to SEQ ID NO. 1 |

TABLE 2-continued

| Sequence No. | Name of sequence | Details of sequence |
|---|---|---|
| 3 | CD16V nucleotide | G mutation of nucleotide No. 559 among signal sequence and extracellular domain of CD16V (34-651 nucleotides, GenBank Accession No. X52645) |
| 4 | CD16V nucleotide codon optimization | Codon optimized sequence of SEQ ID NO. 3 |
| 5 | CD16V amino acid | Amino acid sequence corresponding to SEQ ID NOs. 3 and 4 |
| 6 | CD8α nucleotide | Human CD8α-derived hinge and transmembrane domains (1292-1507 nucleotides, GenBank NM 001768.6) |
| 7 | CD8α nucleotide codon optimization | Codon optimized sequence of SEQ ID NO. 6 |
| 8 | CD8α amino acid | Amino acid sequence corresponding to SEQ ID NOs. 6 and 7 |
| 9 | CD28 nucleotide | CD28-derived hinge, transmembrane and intracellular signaling domains (562-882 nucleotides, GenBank MM 006139.3) |
| 10 | CD28 nucleotide codon optimization | Codon optimized sequence of SEQ ID NO. 9 |
| 11 | CD28 amino acid | Amino acid sequence corresponding to SEQ ID NOs. 9 and 10 |
| 12 | CD3ζ nucleotide | CDζ-derived intracellular signaling domain (299-634 nucleotides, GenBank NM 000734.3) |
| 13 | CD3ζ nucleotide codon optimization | Codon optimized sequence of SEQ ID NO. 12 |
| 14 | CD3ζ amino acid | Amino acid sequence corresponding to SEQ ID NOs. 12 and 13 |
| 15 | OX40L (CD252) nucleotide | OX40L (CD252)-derived intracellular signaling domain (141-206 nucleotides, GenBank NM 003326.4) |
| 16 | OX40L (CD252) nucleotide codon optimization | Codon optimized sequence of SEQ ID NO. 15 |
| 17 | OX40L (CD252) amino acid | Amino acid sequence corresponding to SEQ ID NOs. 15 and 16 |
| 18 | OX40 (CD134) nucleotide | OX40 (CD134)-derived intracellular signaling domain (733-840 nucleotides, GenBank AB 590584.1) |
| 19 | OX40 (CD134) nucleotide codon optimization | Codon optimized sequence of SEQ ID NO. 18 |
| 20 | OX40 (CD134) amino acid | Amino acid sequence corresponding to SEQ ID NOs. 18 and 19 |
| 21 | 4-1BB (CD137) nucleotide | 4-1BB (CD137)-derived intracellular signaling domain (901-1026 nucleotides, GenBank NM 001561.5) |
| 22 | 4-1BB (CD137) nucleotide codon optimization | Codon optimized sequence of SEQ ID NO. 21 |
| 23 | 4-1BB (CD137) amino acid | Amino acid sequence corresponding to SEQ ID NOs. 21 and 22 |
| 24 | CD16V-Z nucleotide | Codon optimized nucleotide sequence of CD16V-Z CAR |
| 25 | CD16V-Z amino acid | Amino acid sequence corresponding to SEQ ID NO. 24 |
| 26 | CD16V-BBZ nucleotide | Codon optimized nucleotide sequence of CD16V-BBZ CAR |
| 27 | CD16V-BBZ amino acid | Amino acid sequence corresponding to SEQ ID NO. 26 |
| 28 | CD16V-OX40Z nucleotide | Codon optimized nucleotide sequence Of CD16V-OX40Z CAR |
| 29 | CD16V-OX40Z amino acid | Amino acid sequence corresponding to SEQ ID NO. 28 |
| 30 | CD16V-OX40LZ nucleotide | Codon optimized nucleotide sequence of CD16V-OX30LZ CAR |
| 31 | CD16V-OX40LZ amino acid | Amino acid sequence corresponding to SEQ ID NO. 30 |
| 32 | CD16V-28Z nucleotide | Codon optimized nucleotide sequence of CD16V-28Z CAR |
| 33 | CD16V-28Z amino acid | Amino acid sequence corresponding to SEQ ID NO. 32 |
| 34 | CD16V-28(H)Z nucleotide | Codon optimized nucleotide sequence of CD16V-28(H)Z CAR |
| 35 | CD16V-28(H)Z amino acid | Amino acid sequence corresponding to SEQ ID NO. 34 |
| 36 | CD16V-BBOX40Z nucleotide | Codon optimized nucleotide sequence of CD16V-BBOX40Z CAR |
| 37 | CD16V-BBOX40Z amino acid | Amino acid sequence corresponding to SEQ ID NO. 36 |
| 38 | CD16V-OX40BBZ nucleotide | Codon optimized nucleotide sequence of CD16V-OX40BBZ CAR |
| 39 | CD16V-OX40BBZ amino acid | Amino acid sequence corresponding to SEQ ID NO. 38 |
| 40 | CD16V-28BBZ nucleotide | Codon optimized nucleotide sequence of CD16V-28BBZ CAR |
| 41 | CD16V-28BBZ amino acid | Amino acid sequence corresponding to SEQ ID NO. 40 |
| 42 | CD16V-28OX40Z nucleotide | Codon optimized nucleotide sequence of CD16V-28OX40Z CAR |
| 43 | CD16V-28OX40Z amino acid | Amino acid sequence corresponding to SEQ ID NO. 42 |
| 44 | CD16V-28OX40LZ nucleotide | Codon optimized nucleotide sequence of CD16V-28OX40LZ CAR |
| 45 | CD16V-28OX40LZ amino acid | Amino acid sequence corresponding to SEQ ID NO. 44 |
| 46 | CD16V-28(H)BBZ nucleotide | Codon optimized nucleotide sequence of CD16V-28(H)BBZ CAR |
| 47 | CD16V-28(H)BBZ amino acid | Amino acid sequence corresponding to SEQ ID NO. 46 |
| 48 | CD16V-28(H)OX40Z nucleotide | Codon optimized nucleotide sequence of CD16V-28(H)OX40Z CAR |

TABLE 2-continued

| Sequence No. | Name of sequence | Details of sequence |
|---|---|---|
| 49 | CD16V-28(H)OX40Z amino acid | Amino acid sequence corresponding to SEQ ID NO. 48 |
| 50 | CD16V-28(H)OX40LZ nucleotide | Codon optimized nucleotide sequence of CD16V-28(H)OX40LZ CAR |
| 51 | CD16V-28(H)OX40LZ amino acid | Amino acid sequence corresponding to SEQ ID NO. 50 |
| 52 | CD16V-BBOX40LZ nucleotide | Codon optimized nucleotide sequence of CD16V-BBOX40LZ CAR |
| 53 | CD16V-BBOX40LZ amino acid | Amino acid sequence corresponding to SEQ ID NO. 52 |
| 54 | CD16V-ZOX40L nucleotide | Codon optimized nucleotide sequence of CD16V-ZOX40L CAR |
| 55 | CD16V-ZOX40L amino acid | Amino acid sequence corresponding to SEQ ID NO. 54 |

In addition, the chimeric antigen receptors (CARs) according to the embodiments of the present invention are summarized in Table 3 below. Domains of each of all CARs according to the embodiments of the present invention are linked in series (in tandem) to one other and also linked in the frame.

TABLE 3

| Type of CAR (generation) | Serial No. | Abbreviation | Signal sequence | ECD | Hinge | TM | Signal-1 | Signal-2 | Signal-3 |
|---|---|---|---|---|---|---|---|---|---|
| — | C17 | NC | CD8α | NKG2D | CD8α | CD8α | | | |
| 1st | C18 | NKG2D-Z | CD8α | NKG2D | CD8α | CD8α | CD3ζ | | |
| 2nd | C19 | NKG2D-BBZ | CD8α | NKG2D | CD8α | CD8α | 4-1BB | CD3ζ | |
| 2nd | C20 | NKG2D-OX40Z | CD8α | NKG2D | CD8α | CD8α | OX40 | CD3ζ | |
| 2nd | C21 | NKG2D-OX40L | CD8α | NKG2D | CD8α | CD8α | CD3ζ | OX40L | |
| 2nd | C22 | NKG2D-28Z | CD8α | NKG2D | CD8α | CD28 | CD28 | CD3ζ | |
| 2nd | C23 | NKG2D-28(H)Z | CD8α | NKG2D | CD28 | CD28 | CD28 | CD3ζ | |
| 3rd | C24 | NKG2D-BBOX40Z | CD8α | NKG2D | CD8α | CD8α | 4-1BB | OX40 | CD3ζ |
| 3rd | C25 | NKG2D-BBOX40LZ | CD8α | NKG2D | CD8α | CD8α | 4-1BB | OX40L | CD3ζ |
| 3rd | C26 | NKG2D-OX40BBZ | CD8α | NKG2D | CD8α | CD8α | OX40 | 4-1BB | CD3ζ |
| 3rd | C27 | NKG2D-28BBZ | CD8α | NKG2D | CD8α | CD28 | CD28 | 4-1BB | CD3ζ |
| 3rd | C28 | NKG2D-28OX40Z | CD8α | NKG2D | CD8α | CD28 | CD28 | OX40 | CD3ζ |
| 3rd | C29 | NKG2D-28OX40LZ | CD8α | NKG2D | CD8α | CD28 | CD28 | OX40L | CD3ζ |
| 3rd | C30 | NKG2D-28(H)BBZ | CD8α | NKG2D | CD28 | CD28 | CD28 | 4-1BB | CD3ζ |
| 3rd | C31 | NKG2D-28(H)OX40Z | CD8α | NKG2D | CD28 | CD28 | CD28 | OX40 | CD3ζ |
| 3rd | C32 | NKG2D-28(H)OX40LZ | CD8α | NKG2D | CD28 | CD28 | CD28 | OX40L | CD3ζ |
| 3rd | C33 | NKG2D-AAA-28(H)OX40LZ | CD8α | NKG2D-AAA | CD28 | CD28 | CD28 | OX40L | CD3ζ |

NKG2D-Z CAR ($1^{st}$ generat4ion) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge and transmembrane domains (nucleotides 1292-1507, GenBank NM 001768.6); CD3ζ-derived intracellular signaling domain (nucleotides 299-634, GenBank NM 000734.3); and stop codon TGA.

NKG2D-BBZ CAR ($2^{nd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge and transmembrane domains (nucleotides 1292-1507, GenBank NM 001768.6); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

NKG2D-OX40Z CAR ($2^{nd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge and transmembrane domains (nucleotides 1292-1507, GenBank NM 001768.6); CD134-derived intracellular signaling domain (nucleotides 733-840, GenBank AB590584.1); CD3ζ-derived intracellular signaling domain (nucleotides 299-634, GenBank NM 000734.3); and stop codon TGA.

NKG2D-ZOX40L CAR ($2^{nd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge and transmembrane domains (nucleotides 1292-1507, GenBank NM 001768.6); CD3ζ-derived intracellular signaling domain (nucleotides 299-634, GenBank NM 000734.3); CD252-derived intracellular signaling domain (nucleotides 141-206, GenBank NM 003326.4); and CD3ζ stop codon TGA.

NKG2D-28Z CAR ($2^{nd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge domain (nucleotides 1292-1435, GenBank NM 001768.6); CD28-derived transmembrane and intracellular signaling domains (nucleotides 679-882, GenBank NM 006139.3); CD3ζ-derived intracellular signaling domain (nucleotides 299-634, GenBank NM 000734.3); and stop codon TGA.

NKG2D-28(H)Z CAR ($2^{nd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD28-derived hinge, transmembrane and intracellular signaling domains (nucleotides 562-882, GenBank NM 006139.3); CD3ζ-derived intracellular signaling domain (nucleotides 299-634, GenBank NM 000734.3); and stop codon TGA.

NKG2D-BBOX40Z CAR ($3^{rd}$ generation) is produced by connecting: the signal sequence domain of CD8α (nucleotides 890-952, GenBank NM 001768.6); the extracellular domain ofNKG2D (nucleotides 788-1192, GenBank ID: AF461811.1); human CD8α-derived hinge and transmembrane domains (nucleotides 1292-1507, GenBank NM 001768.6); CD137-derived intracellular signaling domain (nucleotides 901-1026, GenBank NM 001561.5); CD134-derived intracellular signaling domain (nucleotides 733-840, GenBank AB590584.1); CD3ζ-derived intracellular signaling domain (nucleotides 299-634, GenBank NM 000734.3); and stop codon TGA.

NKG2D-BBOX40LZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge and transmembrane domains (nucleotides 1292-1507, GenBank NM 001768.6); CD137-derived intracellular signaling domain (nucleotides 901-1026, GenBank NM 001561.5); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

NKG2D-OX40BBZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); human CD8α-derived hinge and transmembrane domains (nucleotides 1292-1507, GenBank NM 001768.6); CD134-derived intracellular signaling domain (nucleotides 733-840, GenBank AB590584.1); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

NKG2D-28BBZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD8α-derived hinge domain (nucleotides 1292-1435, GenBank NM 001768.6); CD28-derived transmembrane and intracellular signaling domains (nucleotides 679-882, GenBank NM 006139.3); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

NKG2D-28OX40Z CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD8α-derived hinge domain (nucleotides 1292-1435, GenBank NM 001768.6); CD28-derived transmembrane and intracellular signaling domains (nucleotides 679-882, GenBank NM 006139.3); CD134-derived intracellular signaling domain (nucleotides 733-840, GenBank AB590584.1); CD3ζ-derived intracellular signaling domain (nucleotides 299-634, GenBank NM 000734.3); and stop codon TGA.

NKG2D-28OX40LZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD8α-derived hinge domain (nucleotides 1292-1435, GenBank NM 001768.6); CD28-derived transmembrane and intracellular signaling domains (nucleotides 679-882, GenBank NM 006139.3); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

NKG2D-28(H)BBZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD28-derived hinge, transmembrane and intracellular signaling domains (nucleotides 562-882, GenBank NM 006139.3); CD137-derived intracellular signaling domain (nucleotides 901-1026, GenBank NM 001561.5); CD3ζ-derived intracellular signaling domain (nucleotides 299-634, GenBank NM 000734.3); and stop codon TGA.

NKG2D-28(H)OX40Z CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD28-derived hinge, transmembrane and intracellular signaling domains (nucleotides 562-882, GenBank NM 006139.3); CD134-derived intracellular signaling domain (nucleotides 733-840, GenBank AB590584.1); CD3ζ-derived intracellular signaling domain (nucleotides 299-634, GenBank NM 000734.3); and stop codon TGA.

NKG2D-28(H)OX40LZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); CD28-derived hinge, transmembrane and intracellular signaling domains (nucleotides 562-882, GenBank NM 006139.3); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

NKG2D-AAA-28(H)OX40LZ CAR ($3^{rd}$ generation) is produced by connecting: the signal sequence domain of CD8α (nucleotides 890-952, GenBank NM 001768.6); the extracellular domain of NKG2D (nucleotides 788-1192, GenBank ID: AF461811.1); AAA (Triple alanine); CD28-derived hinge, transmembrane and intracellular signaling domains (nucleotides 562-882, GenBank NM 006139.3); CD252-derived intracellular signaling domain (nucleotides 141-206, GenBank NM 003326.4); CD3ζ-derived intracellular signaling domain (nucleotides 299-634, GenBank NM 000734.3); and stop codon TGA.

The sequence listings of the domains used for the chimeric antigen receptors (CARs) and a method for preparation thereof according to the embodiments of the present invention are summarized in Table 4 below.

TABLE 4

| Sequence No. | Name of sequence | Details of sequence |
|---|---|---|
| 56 | CD8α nucleotide | Signal sequence domain of CD8α (890-952 nucleotides, GenBank NM 001768.6) |
| 57 | CD8α nucleotide codon optimization | Codon optimized sequence of SEQ ID NO. 56 |
| 58 | CD8α amino acid | Amino acid sequence corresponding to SEQ ID NOs. 56 and 57 |
| 59 | NKG2D nucleotide | Extracellular domain of NKG2D (788-1192 nucleotides, GenBank ID: AF 461811.1) |
| 60 | NKG2D nucleotide codon optimization | Codon optimized sequence of SEQ ID NO. 59 |
| 61 | NKG2D amino acid | Amino acid sequence corresponding to SEQ ID NOs. 59 and 60 |
| 62 | NKG2D-Z nucleotide | Codon optimized nucleotide sequence of NKG2D-Z CAR |
| 63 | NKG2D-Z amino acid | Amino acid sequence corresponding to SEQ ID NO. 62 |
| 64 | NKG2D-BBZ nucleotide | Codon optimized nucleotide sequence of NKG2D-BBZ CAR |
| 65 | NKG2D-BBZ amino acid | Amino acid sequence corresponding to SEQ ID NO. 64 |
| 66 | NKG2D-OX40Z nucleotide | Codon optimized nucleotide sequence of NKG2D-OX40Z CAR |
| 67 | NKG2D-OX40Z amino acid | Amino acid sequence corresponding to SEQ ID NO. 66 |
| 68 | NKG2D-ZOX40L nucleotide | Codon optimized nucleotide sequence of NKG2D-ZOX40L CAR |
| 69 | NKG2D-ZOX40L amino acid | Amino acid sequence corresponding to SEQ ID NO. 68 |
| 70 | NKG2D-28Z nucleotide | Codon optimized nucleotide sequence of NKG2D-28Z CAR |
| 71 | NKG2D-28Z amino acid | Amino acid sequence corresponding to SEQ ID NO. 70 |
| 72 | NKG2D-28(H)Z nucleotide | Codon optimized nucleotide sequence of NKG2D-28(H)Z CAR |
| 73 | NKG2D-28(H)Z amino acid | Amino acid sequence corresponding to SEQ ID NO. 72 |
| 74 | NKG2D-BBOX40Z nucleotide | Codon optimized nucleotide sequence of NKG2D-BBOX40Z CAR |
| 75 | NKG2D-BBOX40Z amino acid | Amino acid sequence corresponding to SEQ ID NO. 74 |
| 76 | NKG2D-BBOX40LZ nucleotide | Codon optimized nucleotide sequence of NKG2D-BBOX40LZ CAR |
| 77 | NKG2D-BBOX40LZ amino acid | Amino acid sequence corresponding to SEQ ID NO. 76 |
| 78 | NKG2D-OX40BBZ nucleotide | Codon optimized nucleotide sequence of NKG2D-OX40BBZ CAR |
| 79 | NKG2D-OX40BBZ amino acid | Amino acid sequence corresponding to SEQ ID NO. 78 |
| 80 | NKG2D-28BBZ nucleotide | Codon optimized nucleotide sequence of NKG2D-28BBZ CAR |
| 81 | NKG2D-28BBZ amino acid | Amino acid sequence corresponding to SEQ ID NO. 80 |
| 82 | NKG2D-280X40Z nucleotide | Codon optimized nucleotide sequence of NKG2D-28OX40Z CAR |
| 83 | NKG2D-280X40Z amino acid | Amino acid sequence corresponding to SEQ ID NO. 82 |
| 84 | NKG2D-280X40LZ nucleotide | Codon optimized nucleotide sequence of NKG2D-28OX40LZ CAR |
| 85 | NKG2D-280X40LZ amino acid | Amino acid sequence corresponding to SEQ ID NO. 84 |
| 86 | NKG2D-28(H)BBZ nucleotide | Codon optimized nucleotide sequence of NKG2D-28(H)BBZ CAR |
| 87 | NKG2D-28(H)BBZ amino acid | Amino acid sequence corresponding to SEQ ID NO. 86 |
| 88 | NKG2D-28(H)OX40Z nucleotide | Codon optimized nucleotide sequence of NKG2D-28(H)OX40Z CAR |
| 89 | NKG2D-28(H)OX40Z amino acid | Amino acid sequence corresponding to SEQ ID NO. 88 |
| 90 | NKG2D-28(H)OX40LZ nucleotide | Codon optimized nucleotide sequence of NKG2D-28(H)OX40LZ CAR |
| 91 | NKG2D-28(H)OX40LZ amino acid | Amino acid sequence corresponding to SEQ ID NO. 90 |
| 92 | NKG2D-AAA-28(H)OX40LZ Nucleotide | Codon optimized nucleotide sequence of NKG2D-AAA-28(H)OX40LZ CAR |
| 93 | NKG2D-AAA-28(H)OX40LZ amino acid | Amino acid sequence corresponding to SEQ ID NO. 92 |

Virus Production and Gene Transfer

In order to prepare VSVG-pseudotyped lentivirus, 293T cells cultured in a DMEM medium were co-transfected with various types of vectors such as PCDH1-MSCV-CD16-construct-EF1-copGFP vector, EF1a-NKG2D-construct vector, PCDH1-MSCV-EF1-copGFP control vector, or EF1a-GFP control vector (for production of Mock infection virus using empty vector) together with HIV-based pPACKH1 lentivirus Package Kit (System Biosciences). For this purpose, Lipofectamine 2000 reagent (Invitrogen, Carlsbad, CA) was used. Various types of CD16V constructs are as follows; CD16V-Z CAR, CD16V-BBZ CAR, CD16V-OX40Z CAR, CD16V-OX40LZ CAR, CD16V-ZOX40L, CD16V-28Z CAR, CD16V-28(H)Z CAR, CD16V-BBOX40Z CAR, CD16V-BBOX40LZ CAR, CD16V-OX40BBZ CAR, CD16V-28BBZ CAR, CD16V-28OX40Z CAR, CD16V-28OX40LZ CAR, CD16V-28(H)BBZ CAR, CD16V-28(H)OX40Z CAR, CD16V-28(H)OX40LZ CAR. Further, various types of NKG2D constructs are as follows; NKG2D-Z CAR, NKG2D-BBZ CAR, NKG2D-OX40Z CAR, NKG2D-ZOX40L CAR, NKG2D-28Z CAR, NKG2D-28(H)Z CAR, NKG2D-BBOX40Z CAR, NKG2D-BBOX40LZ CAR, NKG2D-OX40BBZ CAR, NKG2D-28BBZ CAR, NKG2D-28OX40Z CAR, NKG2D-28OX40LZ CAR, NKG2D-28(H)BBZ CAR, NKG2D-28(H)OX40Z CAR, NKG2D-28(H)OX40LZ CAR, NKG2D-AAA-28(H)OX40LZ. Each lentivirus was prepared by transfection of 80% dense HEK293T cells in a flask with: various types of CD16V construct expression vectors, various types of NKG2D construct expression vectors or a control plasmid together with pPACKH1 lentivirus packaging plasmids. After 6 hours, the medium was replaced by a DMEM medium containing 10% FBS. The conditioned medium containing lentivirus was collected after 48 hours of transfection, followed by filtering with a 0.45 μm filter unit (Milliopore, Billerica, MA, USA) in order to remove cell debris. A viral supernatant containing the virus was concentrated about 50 times by centrifugation at 3000 rpm and 4° C. for 20 minutes using Amicon Filter (Millipore). The concentrated virus was stored at −80° C.

For the lentiviral infection, NK92MI cells in an exponential growth phase was adjusted to a concentration of 1×106 cells/ml using Cellgro (Cellgenix) including 1% human plasma, and then a lentiviral supernatant in 50 to 100 MOI was added in the presence of 8 μg/ml polybrene, followed by centrifugation at 1800 g for 90 minutes. After centrifugation, the cells were left in a humidified incubator at 37° C. and 5% CO2 conditions for 48 hours. Thereafter, the cells were washed twice with RPMI-1640, and then left in RPMI-1640 including 10% FBS for future use. Control cells were transduced with a vector only.

Detection of Expression of Receptor Including CD16V or NKG2D

CD16V CAR-transduced NK92MI cells, NKG2D CAR-transduced NK92MI cells, the control vector-transduced NK92MI (NK92MI-Mock) or NK-92MI parent cells were washed twice with FACS buffer, and the washed cells were stained using 7-AAD (Beckman coulter), anti-CD3, anti-CD56 and anti-CD16 (BD Biosciences) mAbs. An expression ratio and a mean fluorescence intensity (MFI) of the stained cells were measured using a BD LSRFortessa.

The transduction efficiency using the NKG2D construct was determined by flow cytometric analysis of cells expressing NKG2D among CD3-CD56+ cells. First, NK92MI cells were gated in regard to singlet, and then gated in regard to 7AAD- and CD3-CD56+. The transformation efficiency using the CD16 constructs was determined by flow cytometric analysis of cells expressing GFP and CD16 among CD3-CD56+ cells.

Calcein Releasing Cytotoxicity Assay

Target cells were labeled at 37° C. for 1 hour with 30 μM calcein-acetoxymethyl ester (Calcein-AM; Molecular probes). After washing, the labeled target cells were dispensed to $1\times10^4$ cells per well in 96-well plates. NK92MI cells were harvested, washed, and then were added at different E/T (effector-to-target) ratios under conditions with or without rituximab at various concentrations. As a control group independent of the rituximab, an anti-human antibody (Sigma aldrich) was used. After 2 hours, the plates were centrifuged at 2000 rpm for 3 minutes, and a supernatant of 100 μL was collected and subjected to measurement of calcein release using a fluorescence microplate reader (Victor3, PerkinElmer) at an excitation wavelength of 485 nm and an emission wavelength of 535 nm. Specific calcein release amount was calculated by the following equation: percent specific lysis=(test release−spontaneous release)×100/(maximal release−spontaneous release). For maximal lysis, a 1% Triton X-100 was used.

Example 2: Assessment of Cytotoxicity of NK92MI Cells Expressing OX40 Ligand (CD252)-Containing Chimeric Antigen Receptor (CAR) Against CD20-Positive Lymphoma Cells Transduction and Expression of Chimeric Antigen Receptor Containing CD16V Associated with the Co-Stimulating Motif V158 variant (polymorphism) of FCRG3A (CD16) is a high affinity immunoglobulin Fc receptor and is considered to exhibit good effects in antibody treatment. The present inventors have prepared the V158 variant of FCRG3A (CD16) and combined the prepared variant with: the hinge and transmembrane domains of CD8α; a T cell stimulatory molecule, that is, CD3ζ; and intracellular domains of different costimulatory molecules such as CD28, 4-1BB, OX-40 and OX-40 ligand in various combinations thereof (Table 1). The prepared CD16V-containing chimeric antigen receptors (e.g., CD16V-Z CAR ($1^{st}$ generation), CD16V-28Z CAR ($2^{nd}$ generation), CD16V-BBZ CAR ($2^{nd}$ generation), CD16V-OX40Z CAR ($2^{nd}$ generation) or CD16V-28OX40LZ CAR ($3^{rd}$ generation)) were expressed in NK92MI cells by a lentiviral vector including a MSCV promoter. We confirmed surface expression of each CAR on NK92MI cells by detection of the human CD16, using a monoclonal mouse anti-human antibody. By repetitive experiments involving flow cytometric analysis, it was demonstrated that CARs were transduced with efficiency more than 90% in NK92MI cells (FIG. 1A). An amount of lentivirus used herein is equal to the multiple of infection (MOI) of 50 or more.

Increase of Tumor Killing Effect of NK92MI Cells Expressing CD16V Receptor Combined with CD252 (OX40 Ligand) Against CD20-Positive Lymphoma In order to determine whether genetic modification according to the invention induces an increase in cancer cell death, cytotoxicity of NK92MI cells transduced with an empty vector and NK92MI cells expressing a CD16-containing receptor on CD20-positive lymphoma cells (Ramos cells) was evaluated by calcein-AM release assay.

Before test for lymphoma cells, K562, a human erythroleukemic cell line, was used as a standard control to assess intrinsic cell killing ability (i.e., cytotoxicity) of the transduced NK92MI cells. By transduction using lentivirus having multiple of infection (MOI) of 50 or more, each of CARs according to the present invention (CD16V-Z CAR ($1^{st}$ generation), CD16V-28Z CAR ($2^{nd}$ generation), CD16V-BBZ CAR ($2^{nd}$ generation), CD16V-OX40Z CAR ($2^{nd}$ generation) or CD16V-28OX40LZ CAR ($3^{rd}$ generation)) was expressed at a high level in 90% or more NK92MI cells (FIG. 1A).

It was demonstrated that cytotoxicity of NK92MI cells expressing CARs according to the invention on K562 was similar to cytotoxicity of a control group (Mock) transduced with an empty vector. This means that the intrinsic cytotoxicity of NK92MI cells on a target was not increased by side effects due to the genetic modification itself (FIG. 1B). In FIG. 1B, a ratio of the number of NK92MI cells as effector cells to the number of K562 cells as target cells is indicated by 5:1, 2.5:1, 1:1 and 0.5:1.

In order to assess how diverse co-stimulatory molecules affect in vitro on antigen-specific antitumor activity of NK92MI cells expressing CD16V-containing receptor, transduced NK92MI cells and cancer cells (B-cell lymphoma cell line, that is, Ramos) were subjected to co-incubation, followed by assessment of lysis of the cancer cells according to calcein-AM release assay (FIG. 1C). In FIG. 1C, ratios of the number of NK92MI cells (effector cells) to the number of Ramos cells (target cells) are indicated by 5:1, 2.5:1, 1:1 and 0.5:1. It has been shown that rituximab does not increase NK-92MI mediated cytotoxicity significantly because NK92MI does not express CD16.

As shown in FIG. 1C, we found that expression of various CARs according to the present invention without rituximab did not increase significantly NK-92MI mediated cytotoxicity over that cytotoxicity induced by the control (Mock), NK-92MI cells transduced with the vector containing only GFP.

CD16V-Z CAR (first generation), which was previously shown to enhance cytotoxicity in various CAR applications, served as positive control. In order to increase cytotoxicity of the CD16V-containing receptor, the present inventors have introduced CD28, CD134 (OX40), CD137 (4-1BB) or CD252 (OX40 ligand) into CD16V-Z-CAR. In 2 hour in vitro cytotoxicity assays, NK-92MI cells expressing CD16V-Z CAR ($1^{st}$ generation), CD16V-28Z CAR ($2^{nd}$ generation), CD16V-BBZ CAR ($2^{nd}$ generation), CD16V-OX40Z CAR ($2^{nd}$ generation) or CD16V-28OX40LZ CAR ($3^{rd}$ generation) exhibited high cytotoxicity in the presence of rituximab at effector cells to target cells ratio of 5:1 and 2.5:1. Among them, in particular, $3^{rd}$ generation CAR including OX40 ligand, that is, CD16V-28OX40LZ CAR exhibited the highest cytotoxicity, compared to the other CARs (FIG. 1C).

In order to investigate whether $2^{nd}$ generation CAR containing OX40 ligand can enhance anticancer activity of NK92MI cells, CD16V-OX40LZ CAR was prepared and subjected to evaluation of cytotoxicity. When NK92MI cells were transduced with CD16-OX40LZ using a lentiviral vector, CD16V-OX40LZ CAR was not expressed (FIG. 1D). Even in the presence of rituximab, cytotoxicity on Ramos cells mediated by CD16V-OX40LZ CAR was not exhibited (FIG. 1E). Accordingly, the present inventors noticed a fact that OX40 ligand is type II protein and CD3ζ linked to the OX40 ligand is type I protein, and has prepared CD16V-ZOX40L CAR having CD3ζ at N-terminal and OX40 ligand at C-terminal by changing the order of the above two domains. When NK92MI cells were transduced with CD16V-ZOX40L using a lentiviral vector having an MSCV promoter, NK92MI cells effectively expressed CD16V-OX40LZ CAR compared with CD16V-OX40LZ (FIG. 1F). Further, as a result of assessing anticancer activity of $2^{nd}$ generation CAR having CD16V-ZOX40L introduced therein, high cytotoxicity on Ramos cells was demonstrated at ratios of effector cells to target cells of 10:1, 5:1 and 2.5:1 in the presence of rituximab (FIG. 1G). It was determined that, in addition to CD16V-28OX40LZ CAR ($3^{rd}$ generation) containing OX40 ligand, CD16V-ZOX40L CAR ($2^{nd}$ generation) also has anticancer activity superior to CD16V-Z CAR used as a positive control.

Assessment of Efficacy of CD16V-BBOX40LZ CAR

By introducing OX40 ligand into CD137 (41BB) signaling domain-based CAR, NK92MI cells were subjected to assessment of expression and cytotoxicity. Both of CD16V-BBZ CAR ($2^{nd}$ generation) and CD16V-BBOX40LZ CAR ($3^{rd}$ generation) were expressed at high levels in NK92MI cells (FIG. 2A). When rituximab is not present in an in vitro test for cytotoxicity, all of CD16V-Z, CD16V-BBZ and CD16V-BBOX40LZ exhibited low cytotoxicity to Ramos cells. On the other hand, in the presence of rituximab, CD16V-BBOX40LZ in combination with OX40 ligand exhibited highest cytotoxicity at even any ratio of effector cells to target cells (FIG. 2B).

Comparison of Efficacies Between CD16V-28OX40LZ CAR and Other CARs

Next, the present inventors have compared the cytotoxicity of NK92MI cells expressing CD16V-28OX40LZ CAR and the cytotoxicity of NK92MI cells expressing $3^{rd}$ generation CAR that has other intracellular signaling domains. The $3^{rd}$ generation CARs used in the present experiment (CD16V-28OX40LZ CAR, CD16V-28OX40Z CAR and CD16V-28BBZ CAR) were all proven to be expressed at high levels in NK92MI cells (FIG. 3A).

After comparing NK cell activating efficacies of various $3^{rd}$ generation CARs (that is, $3^{rd}$ generation chimeric antigen receptors) according to the present invention, results thereof are summarized in FIG. 3B. As shown in FIG. 3B, all of these CARs show low cytotoxicity to Ramos cells when rituximab is not present, and an extent of the cytotoxicity is all similar. On the other hand, in the presence of rituximab, all of CD16V-28OX40LZ CAR, CD16V-28OX40Z CAR and CAR CD16V-28BBZ showed high cytotoxicity to Ramos cells. Among them, in particular, CD16V-28OX40LZ CAR containing OX40 ligand exhibited the most excellent cytotoxicity (FIG. 3B).

Assessment of Efficacy of $3^{rd}$ Generation CAR Including OX40 Ligand having CD28 at Hinge In order for the CAR expressing NK cells to recognize a cancer cell antigen in an optimized condition, not only cancer cell antigen-recognizing receptor itself, but also hinge sequence and composition between an antigen-specific receptor and a cell membrane are also important. The hinge sequence and composition may need to be designed differently depending on target molecules.

The CARs used in the experiments described above use the fragment of CD8α as spacer domains ('hinge'). As compared to this, variation of cytotoxicity of CARs when the fragment of CD28 is used at the hinge, was assessed and results thereof are summarized in FIG. 4. The present inventors have produced a lentiviral vector including an extracellular domain (ectodomain) of CD16V and the hinge of CD28. In 3rd generation CARs containing CD28 fragment as spacer, CD28-derived hinge, transmembrane and intracellular signaling domains were linked to a signaling module of CD134 (OX40), CD137 (4-1BB) or OX40 ligand (CD252). Such produced 3rd generation CARs were expressed on NK92MI cells using the lentiviral vector. It was demonstrated that the transduced NK92MI cells could express the above 3rd generation CARs, that is, CD16V-28(H)BBZ CAR, CD16V-28(H)OX40Z CAR or CD16V-28(H)OX40LZ CAR) at high levels, respectively (FIG. 4A).

As shown in FIG. 4B, when rituximab is not present, all of CD16V-28(H)BBZ CAR, CD16V-28(H)OX40Z CAR and CD16V-28(H)OX40LZ CAR do not exhibit cytotoxicity. On the other hand, in the presence of rituximab, all of CD16V-28(H)BBZ CAR, CD16V-28(H)OX4OZ CAR and CD16V-28(H)OX40LZ CAR exhibit high cytotoxicity. Among them, in particular, CD16V-28(H)OX40LZ CAR including OX40 ligand has the highest cytotoxicity.

The experimental results described above demonstrate that, when a novel CAR particularly including OX40 ligand as an intracellular signaling domain discovered by the present inventors is expressed in natural killer cells, excellent antitumor effects may be attained.

Example 3: Assessment of Cytotoxicity of NK92MI Cells Expressing OX40 Ligand (CD252)-Containing NKG2D Chimeric Antigen Receptor (NKG2D-CAR) on Human Breast Cancer Cells and Lung Cancer Cells

Transduction and Expression of a Chimeric Antigen Receptor Including NKG2D Associated with Co-Stimulatory Motif The present inventors synthesized a human NKG2D gene and combined the same with diverse combinations of: hinge and transmembrane domains of CD8α; and intracellular domains of T-cell stimulatory molecules CD3ζ and cofactors including CD28, 4-1BB, OX-40 and OX-40 ligand to significantly enhance activity of T or NK cells (Table 3). Such NKG2D CAR constructs were expressed in NK92MI cells using a lentiviral vector. The present inventors have identified surface expression of each NKG2D CAR in NK92MI cells by means of detection of human NKG2D using a monoclonal mouse anti-human antibody. By repetitive experiments involving flow cytometric analysis, it was demonstrated that CARs were transduced with 70% or more efficiency in NK92MI cells.

Increase of Tumor Killing Effect of NK92MI Cells Expressing NKG2D Receptor, Which Contains Various Co-Stimulatory Signaling Domains, Against MCF7 Breast Cancer Cell Line In order to investigate variation in killing activity due to genetic modification, cytotoxicity of NK-92MI cells, which express NKG2D CAR, on MCF7 breast cancer cells was compared by calcein-AM release assay.

In order to assess in vitro effects of various co-stimulatory signaling domains on antigen-specific antitumor functions of NK-92MI cells expressing NKG2D CAR, transduced NK-92MI cells and cancer cells were co-cultured, followed by measuring lysis of tumor cells through calcein-AM release. According to previous studies, it was known that adding the co-stimulatory signaling domains to the chimeric receptor exhibits increased cytotoxicity of T and NK lymphocytes. In order to increase the cytotoxicity of NKG2D CAR, the present inventors have introduced signaling domains of the most well-known three cofactors, that is, CD28, CD134 (OX-40) and CD137 (4-1BB) into the NKG2D CAR. The NK92MI cells containing the introduced NKG2D-Z CAR (1st generation), NKG2D-28Z CAR, NKG2D-BBZ CAR, NKG2D-OX40Z CAR (2nd generation) showed efficient expression of NKG2D (FIG. 5A). In vitro cytotoxicity analysis for two hours, it was demonstrated that NK-92MI cells expressing NKG2D-Z CAR (1st generation), NKG2D-28Z CAR, NKG2D-BBZ CAR and NKG2D-OX40Z CAR (2nd generation) exhibited cytotoxicity to MCF7 breast cancer cells. However, addition of CD134 (OX-40) or CD137 (4-1BB) signaling domain to a backbone of NKG2D-Z 1st generation CAR did not exhibit higher cytotoxicity than the cytotoxicity of NKG2D-Z CAR (1st generation). Cancer cell killing by NK-92MI cells including NKG2D-28Z CAR (2nd generation) was superior to the positive control, NK-92MI cells expressing NKG2D-Z CAR 1st generation) (FIG. 5B).

Increase of Tumor Killing Effect of NK92MI Cells Expressing NKG2D Receptor, Which Contains CD28 Intracellular Domain, Against MCF7 Breast Cancer Cell Line 3rd generation CAR is known to increase antitumor activity. In physiological T cell response, the optimal lymphocyte activation needs one or more cofactor receptors combined with a co-stimulatory molecule such as CD28. Among the cofactor receptors, the most important receptors are CD137 (4-1BB) and OX40 (CD134) which are members of tumor necrosis factor (TNFR).

In order to investigate effects of different cofactors in NK-92MI cells expressing NKG2D CAR (3rd generation), the present inventors have produced NKG2D-28OX40Z CAR (3rd generation) and NKG2D-28BBZ CAR (3rd generation). The NKG2D CAR (3rd generation) constructs were expressed in NK92MI cells using a lentiviral vector. The transduced NK92MI cells efficiently expressed various NKG2D receptors containing 3rd generation CAR (FIG. 6A). As compared to NK92MI cells transduced with a control vector, NK92MI cells expressing various NKG2D CARs (3rd generation) have efficiently killed MCF7 cells in vitro. However, 3rd generation NKG2D-28OX40Z CAR and NKG2D-28BBZ CAR, each of which includes CD134 or CD137 co-stimulatory signaling domain in a backbone of NKG2D-28Z CAR (2nd generation), did not exhibit higher cytotoxicity than NKG2D-Z CAR (1st generation) (FIG. 6B).

Comparison of NKG2D-AAA-28(H)OX40LZ CAR (3rd Generation) and Other Receptors In order to assess CD252 (OX40 ligand) co-stimulatory signaling domain effects, the signaling domain of the OX40 ligand was fused to the backbone of NKG2D-28Z CAR (2nd generation), so as to build NKG2D-28(H)OX40LZ CAR (3rd generation). In the tumor killing assay, tumor specific cytotoxicity to MCF7 cells, which was induced by NKG2D-28(H)OX40LZ CAR ($3^{rd}$ generation), is greatly enhanced compared to NKG2D-Z CAR ($1^{st}$ generation), however, is substantially similar to NKG2D-28Z CAR ($2^{nd}$ generation) (FIG. 7B).

For optimal CAR T-cell recognition, it was determined that, not only tumor antigen recognition receptor itself, but also hinge and linker sequences between the antigen-specific receptor and the cell membrane are also important. In the present experiment, additional effects of the spacer to the function of NKG2D-28(H)OX40LZ CAR ($3^{rd}$ generation) were analyzed. The present inventors have introduced an AAA (triple alanine) linker between the NKG2D extracellular domain and CD28 hinge. NKG2D-AAA-28(H)OX40LZ CAR ($3^{rd}$ generation) containing AAA linker introduced therein was expressed in NK92MI cells using a lentiviral vector (FIG. 7A). In the present experiment, MCF7 cell killing by NK-92MI cells expressing NKG2D-AAA-28(H)OX40LZ CAR ($3^{rd}$ generation) was compared with MCF7 cell killing by NK-92MI cells expressing NKG2D-Z CAR ($1^{st}$ generation), NKG2D-28Z CAR ($2^{nd}$ generation) or NKG2D-28(H)OX40LZ CAR ($3^{rd}$ generation). In particular, introduction of the AAA linker between NKG2D extracellular domain and CD28 hinge of NKG2D-28(H)OX40LZ CAR ($3^{rd}$ generation) has resulted in better target cell killing than parental NKG2D-28(H)OX40LZ CAR ($3^{rd}$ generation) without AAA, NKG2D-Z CAR ($1^{st}$ generation) and/or NKG2D-28Z CAR ($2^{nd}$ generation) (FIG. 7B).

Increase of Tumor Killing Effect of NK92MI Cells Expressing NKG2D-AAA-28(H)OX40LZ CAR ($3^{rd}$ Generation) Against the Lung Cancer Cell Line In order to assess whether NK92MI cells transduced with NKG2D-AAA-28(H)OX40LZ CAR ($3^{rd}$ generation) can recognize NKG2D ligand in the lung cancer cells, NKG2D ligand-positive tumor cells (H1299 and H1944) were used as a target of NK92MI cells including NKG2D-AAA-28(H)OX40L CAR ($3^{rd}$ generation). The transduced NK92MI cells efficiently expressed NKG2D-Z CAR ($1^{st}$ generation) or NKG2D-AAA-28(H)OX40L CAR ($3^{rd}$ generation) (FIG. 8A). Next, the NKG2D ligand expression in H1299 and H1944 cells was assessed. The present inventors have identified that the NKG2D ligand expression was detected in H1299 and H1944 cells by a flow cytometric analysis (FIG. 8B). As shown in FIG. 8C, NK92MI cells including NKG2D-AAA-28(H)OX40L CAR ($3^{rd}$ generation) could more efficiently killed the target cells expressing NKG2D ligand in vitro than the NK92MI cells as a control group and NK92MI cells expressing NKG2D-Z CAR ($1^{st}$ generation). Furthermore, specificity of target cell killing was obviously confirmed because H1299 and H1944 cells are not killed by NKG2D non-expressing NK92MI cells transduced by a control empty vector.

The invention claimed is:

1. A chimeric antigen receptor comprising, in order:

(A) an intracellular signaling domain comprising;

(i) a first domain comprising the amino acid sequence of SEQ ID NO:14; and (ii) a second domain comprising the amino acid sequence of SEQ ID NO: 17;

(B) a transmembrane domain;

(C) a hinge domain; and (D) an extracellular domain, wherein the second domain is between the first domain and the transmembrane domain.

2. A nucleic acid sequence encoding the chimeric antigen receptor according to claim 1.

3. An immune cell expressing the chimeric antigen receptor according to claim 1.

4. The immune cell of claim 3, wherein the immune cell is a natural killer cell.

5. A method of treating cancer, the method comprising: administering the immune cell according to claim 4 to a subject in need thereof.

* * * * *

SEQUENCE LISTING

<160> NUMBER OF SEQ ID NOS: 93

<210> SEQ ID NO 1
<211> LENGTH: 618
<212> TYPE: DNA
<213> ORGANISM: Artificial Sequence
<220> FEATURE:
<223> OTHER INFORMATION: CD16 nucleotide

<400> SEQUENCE: 1
atgtggcagc tgctcctccc aactgctctg ctacttctag tttcagctgg catgcggact 60
gaagatctcc caaaggctgt ggtgttcctg gagcctcaat ggtacagggt gctcgagaag 120
gacagtgtga ctctgaagtg ccagggagcc tactcccctg aggacaattc cacacagtgg 180
tttcacaatg agagcctcat ctcaagccag gcctcgagct acttcattga cgctgccaca 240
gtcgacgaca gtggagagta caggtgccag acaaacctct ccaccctcag tgacccggtg 300
cagctagaag tccatatcgg ctggctgttg ctccaggccc ctcggtgggt gttcaaggag 360
gaagacccta ttcacctgag gtgtcacagc tggaagaaca ctgctctgca taaggtcaca 420
tatttacaga atggcaaagg caggaagtat tttcatcata attctgactt ctacattcca 480
aaagccacac tcaaagacag cggctcctac ttctgcaggg ggctttttgg gagtaaaaat 540
gtgtcttcag agactgtgaa catcaccatc actcaaggtt tggcagtgtc aaccatctca 600
tcattctttc cacctggg 618

<210> SEQ ID NO 2
<211> LENGTH: 206
<212> TYPE: PRT
<213> ORGANISM: Artificial Sequence
<220> FEATURE:
<223> OTHER INFORMATION: CD16 amino acid

```
<400> SEQUENCE: 2

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Phe
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly
        195                 200                 205


<210> SEQ ID NO 3
<211> LENGTH: 618
<212> TYPE: DNA
<213> ORGANISM: Artificial Sequence
<220> FEATURE:
<223> OTHER INFORMATION: CD16V nucleotide

<400> SEQUENCE: 3

atgtggcagc tgctcctccc aactgctctg ctacttctag tttcagctgg catgcggact      60

gaagatctcc caaaggctgt ggtgttcctg gagcctcaat ggtacagggt gctcgagaag     120

gacagtgtga ctctgaagtg ccagggagcc tactcccctg aggacaattc cacacagtgg     180

tttcacaatg agagcctcat ctcaagccag gcctcgagct acttcattga cgctgccaca     240

gtcgacgaca gtggagagta caggtgccag acaaacctct ccaccctcag tgacccggtg     300

cagctagaag tccatatcgg ctggctgttg ctccaggccc ctcggtgggt gttcaaggag     360

gaagacccta ttcacctgag gtgtcacagc tggaagaaca ctgctctgca taaggtcaca     420

tatttacaga atggcaaagg caggaagtat tttcatcata attctgactt ctacattcca     480

aaagccacac tcaaagacag cggctcctac ttctgcaggg ggcttgttgg gagtaaaaat     540

gtgtcttcag agactgtgaa catcaccatc actcaaggtt tggcagtgtc aaccatctca     600

tcattctttc cacctggg                                                   618


<210> SEQ ID NO 4
<211> LENGTH: 618
<212> TYPE: DNA
<213> ORGANISM: Artificial Sequence
<220> FEATURE:
```

<223> OTHER INFORMATION: CD16V nucleotide codon optimization

<400> SEQUENCE: 4

```
atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggg                                                  618
```

<210> SEQ ID NO 5
<211> LENGTH: 206
<212> TYPE: PRT
<213> ORGANISM: Artificial Sequence
<220> FEATURE:
<223> OTHER INFORMATION: CD16V amino acid

<400> SEQUENCE: 5

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly
        195                 200                 205
```

<210> SEQ ID NO 6
<211> LENGTH: 216
<212> TYPE: DNA

```
<213> ORGANISM: Artificial Sequence
<220> FEATURE:
<223> OTHER INFORMATION: CD8a nucleotide

<400> SEQUENCE: 6

gcgaagccca ccacgacgcc agcgccgcga ccaccaacac cggcgcccac catcgcgtcg     60

cagcccctgt ccctgcgccc agaggcgtgc cggccagcgg cggggggcgc agtgcacacg    120

agggggctgg acttcgcctg tgatatctac atctgggcgc ccttggccgg gacttgtggg    180

gtccttctcc tgtcactggt tatcaccctt tactgc                              216


<210> SEQ ID NO 7
<211> LENGTH: 216
<212> TYPE: DNA
<213> ORGANISM: Artificial Sequence
<220> FEATURE:
<223> OTHER INFORMATION: CD8a nucleotide codon optimization

<400> SEQUENCE: 7

gccaaaccta ccacaactcc tgctccaaga ccacccacac ccgctcctac tattgcatct     60

cagccactga gtctgcgacc agaggcctgc cggcccgccg ccggcggggc cgtgcatacc    120

aggggcctgg acttcgcctg tgatatctac atttgggctc cactggctgg gacttgcggc    180

gtgctgctgc tgtctctggt catcactctg tattgt                              216


<210> SEQ ID NO 8
<211> LENGTH: 72
<212> TYPE: PRT
<213> ORGANISM: Artificial Sequence
<220> FEATURE:
<223> OTHER INFORMATION: CD8a amino acid

<400> SEQUENCE: 8

Ala Lys Pro Thr Thr Thr Pro Ala Pro Arg Pro Pro Thr Pro Ala Pro
1               5                   10                  15

Thr Ile Ala Ser Gln Pro Leu Ser Leu Arg Pro Glu Ala Cys Arg Pro
            20                  25                  30

Ala Ala Gly Gly Ala Val His Thr Arg Gly Leu Asp Phe Ala Cys Asp
        35                  40                  45

Ile Tyr Ile Trp Ala Pro Leu Ala Gly Thr Cys Gly Val Leu Leu Leu
    50                  55                  60

Ser Leu Val Ile Thr Leu Tyr Cys
65                  70


<210> SEQ ID NO 9
<211> LENGTH: 321
<212> TYPE: DNA
<213> ORGANISM: Artificial Sequence
<220> FEATURE:
<223> OTHER INFORMATION: CD28 nucleotide

<400> SEQUENCE: 9

attgaagtta tgtatcctcc tccttaccta gacaatgaga agagcaatgg aaccattatc     60

catgtgaaag ggaaacacct ttgtccaagt cccctatttc ccggaccttc taagcccttt    120

tgggtgctgg tggtggttgg tggagtcctg gcttgctata gcttgctagt aacagtggcc    180

tttattattt tctgggtgag gagtaagagg agcaggctcc tgcacagtga ctacatgaac    240

atgactcccc gccgccccgg gcccacccgc aagcattacc agccctatgc cccaccacgc    300

gacttcgcag cctatcgctc c                                              321
```

```
<210> SEQ ID NO 10
<211> LENGTH: 321
<212> TYPE: DNA
<213> ORGANISM: Artificial Sequence
<220> FEATURE:
<223> OTHER INFORMATION: CD28 nucleotide codon optimization

<400> SEQUENCE: 10

atcgaggtca tgtacccccc tccatatctg gacaacgaaa agtccaatgg aactatcatt     60

cacgtgaagg gcaaacatct gtgcccatct cccctgttcc ctgggccaag taaacctttt    120

tgggtcctgg tggtcgtggg aggggtgctg gcatgttact cactgctggt caccgtggcc    180

ttcatcatct tctgggtgcg gagcaagagg tcccgcctgc tgcacagcga ctatatgaac    240

atgaccccac ggagacccgg ccctacacgg aaacattacc agccctatgc tccaccccgg    300

gacttcgcag cttacagaag t                                              321


<210> SEQ ID NO 11
<211> LENGTH: 107
<212> TYPE: PRT
<213> ORGANISM: Artificial Sequence
<220> FEATURE:
<223> OTHER INFORMATION: CD28 amino acid

<400> SEQUENCE: 11

Ile Glu Val Met Tyr Pro Pro Pro Tyr Leu Asp Asn Glu Lys Ser Asn
1               5                   10                  15

Gly Thr Ile Ile His Val Lys Gly Lys His Leu Cys Pro Ser Pro Leu
            20                  25                  30

Phe Pro Gly Pro Ser Lys Pro Phe Trp Val Leu Val Val Val Gly Gly
        35                  40                  45

Val Leu Ala Cys Tyr Ser Leu Leu Val Thr Val Ala Phe Ile Ile Phe
    50                  55                  60

Trp Val Arg Ser Lys Arg Ser Arg Leu Leu His Ser Asp Tyr Met Asn
65                  70                  75                  80

Met Thr Pro Arg Arg Pro Gly Pro Thr Arg Lys His Tyr Gln Pro Tyr
                85                  90                  95

Ala Pro Pro Arg Asp Phe Ala Ala Tyr Arg Ser
            100                 105


<210> SEQ ID NO 12
<211> LENGTH: 336
<212> TYPE: DNA
<213> ORGANISM: Artificial Sequence
<220> FEATURE:
<223> OTHER INFORMATION: CD3z nucleotide

<400> SEQUENCE: 12

agagtgaagt tcagcaggag cgcagacgcc cccgcgtacc agcagggcca gaaccagctc     60

tataacgagc tcaatctagg acgaagagag gagtacgatg ttttggacaa gagacgtggc    120

cgggaccctg agatgggggg aaagccgaga aggaagaacc ctcaggaagg cctgtacaat    180

gaactgcaga aagataagat ggcggaggcc tacagtgaga ttgggatgaa aggcgagcgc    240

cggaggggca aggggcacga tggcctttac cagggtctca gtacagccac caaggacacc    300

tacgacgccc ttcacatgca ggccctgccc cctcgc                              336


<210> SEQ ID NO 13
<211> LENGTH: 336
<212> TYPE: DNA
```

```
<213> ORGANISM: Artificial Sequence
<220> FEATURE:
<223> OTHER INFORMATION: CD3z nucleotide codon optimization

<400> SEQUENCE: 13

cgagtgaagt tcagcaggtc cgccgacgct cctgcatacc agcagggaca gaaccagctg     60

tataacgagc tgaatctggg ccggagagag gaatacgacg tgctggacaa aaggcggggc    120

cgggaccccg aaatgggagg gaagccacga cggaaaaacc cccaggaggg cctgtacaat    180

gagctgcaaa aggacaaaat ggccgaggct tattctgaaa tcgggatgaa gggagagaga    240

aggcgcggaa aaggccacga tggcctgtac caggggctga gcaccgctac aaaggacacc    300

tatgatgcac tgcacatgca ggccctgccc cctcgg                              336


<210> SEQ ID NO 14
<211> LENGTH: 112
<212> TYPE: PRT
<213> ORGANISM: Artificial Sequence
<220> FEATURE:
<223> OTHER INFORMATION: CD3z amino acid

<400> SEQUENCE: 14

Arg Val Lys Phe Ser Arg Ser Ala Asp Ala Pro Ala Tyr Gln Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
    50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110


<210> SEQ ID NO 15
<211> LENGTH: 66
<212> TYPE: DNA
<213> ORGANISM: Artificial Sequence
<220> FEATURE:
<223> OTHER INFORMATION: OX40L (CD252) nucleotide

<400> SEQUENCE: 15

gaaagggtcc aacccctgga agagaatgtg ggaaatgcag ccaggccaag attcgagagg     60

aacaag                                                                66


<210> SEQ ID NO 16
<211> LENGTH: 66
<212> TYPE: DNA
<213> ORGANISM: Artificial Sequence
<220> FEATURE:
<223> OTHER INFORMATION: OX40L (CD252) nucleotide codon optimization

<400> SEQUENCE: 16

gaaagagtgc agcccctgga agagaatgtc gggaatgccg ctcgcccaag atttgaaagg     60

aacaaa                                                                66


<210> SEQ ID NO 17
```

<211> LENGTH: 22
<212> TYPE: PRT
<213> ORGANISM: Artificial Sequence
<220> FEATURE:
<223> OTHER INFORMATION: OX40L (CD252) amino acid

<400> SEQUENCE: 17

Glu Arg Val Gln Pro Leu Glu Glu Asn Val Gly Asn Ala Ala Arg Pro
1               5                   10                  15

Arg Phe Glu Arg Asn Lys
            20

<210> SEQ ID NO 18
<211> LENGTH: 108
<212> TYPE: DNA
<213> ORGANISM: Artificial Sequence
<220> FEATURE:
<223> OTHER INFORMATION: OX40 (CD134) nucleotide

<400> SEQUENCE: 18
agggaccaga ggctgccccc cgatgcccac aagccccctg ggggaggcag tttccggacc     60
cccatccaag aggagcaggc cgacgcccac tccaccctgg ccaagatc                 108

<210> SEQ ID NO 19
<211> LENGTH: 108
<212> TYPE: DNA
<213> ORGANISM: Artificial Sequence
<220> FEATURE:
<223> OTHER INFORMATION: OX40 (CD134) nucleotide codon optimization

<400> SEQUENCE: 19
cgggaccaga gactgccacc tgatgcacac aagccaccag gaggaggcag cttcaggacc     60
cccatccagg aggaacaggc cgacgctcat tccacactgg ccaaaatt                 108

<210> SEQ ID NO 20
<211> LENGTH: 36
<212> TYPE: PRT
<213> ORGANISM: Artificial Sequence
<220> FEATURE:
<223> OTHER INFORMATION: OX40 (CD134) amino acid

<400> SEQUENCE: 20

Arg Asp Gln Arg Leu Pro Pro Asp Ala His Lys Pro Pro Gly Gly Gly
1               5                   10                  15

Ser Phe Arg Thr Pro Ile Gln Glu Glu Gln Ala Asp Ala His Ser Thr
            20                  25                  30

Leu Ala Lys Ile
        35

<210> SEQ ID NO 21
<211> LENGTH: 126
<212> TYPE: DNA
<213> ORGANISM: Artificial Sequence
<220> FEATURE:
<223> OTHER INFORMATION: 4-1BB (CD137) nucleotide

<400> SEQUENCE: 21
aaacggggca gaaagaaact cctgtatata ttcaaacaac catttatgag accagtacaa     60
actactcaag aggaagatgg ctgtagctgc cgatttccag aagaagaaga aggaggatgt    120
gaactg                                                               126

<210> SEQ ID NO 22

<211> LENGTH: 126
<212> TYPE: DNA
<213> ORGANISM: Artificial Sequence
<220> FEATURE:
<223> OTHER INFORMATION: 4-1BB (CD137) nucleotide codon optimization

<400> SEQUENCE: 22

```
aagcggggaa gaaagaaact gctgtacatc ttcaaacagc cctttatgag gcctgtgcag     60

accacacagg aggaagacgg ctgctcctgc cggttccccg aggaagagga aggcgggtgc    120

gagctg                                                               126
```

<210> SEQ ID NO 23
<211> LENGTH: 42
<212> TYPE: PRT
<213> ORGANISM: Artificial Sequence
<220> FEATURE:
<223> OTHER INFORMATION: 4-1BB (CD137) amino acid

<400> SEQUENCE: 23

```
Lys Arg Gly Arg Lys Lys Leu Leu Tyr Ile Phe Lys Gln Pro Phe Met
1               5                   10                  15

Arg Pro Val Gln Thr Thr Gln Glu Glu Asp Gly Cys Ser Cys Arg Phe
            20                  25                  30

Pro Glu Glu Glu Glu Gly Gly Cys Glu Leu
        35                  40
```

<210> SEQ ID NO 24
<211> LENGTH: 1173
<212> TYPE: DNA
<213> ORGANISM: Artificial Sequence
<220> FEATURE:
<223> OTHER INFORMATION: CD16V-Z nucleotide

<400> SEQUENCE: 24

```
atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag gggcctggac ttcgcctgtg atatctacat ttgggctcca    780

ctggctggga cttgcggcgt gctgctgctg tctctggtca ttactctgta ttgtcgagtg    840

aagttcagca ggtccgccga cgctcctgca taccagcagg gacagaacca gctgtataac    900

gagctgaatc tgggccggag agaggaatac gacgtgctgg acaaaaggcg gggccgggac    960

cccgaaatgg gagggaagcc acgacggaaa aacccccagg agggcctgta caatgagctg   1020

caaaaggaca aaatggccga ggcttattct gaaatcggga tgaagggaga gagaaggcgc   1080
```

```
ggaaaaggcc acgatggcct gtaccagggg ctgagcaccg ctacaaagga cacctatgat   1140

gcactgcaca tgcaggccct gccccctcgg tga                                 1173


<210> SEQ ID NO 25
<211> LENGTH: 390
<212> TYPE: PRT
<213> ORGANISM: Artificial Sequence
<220> FEATURE:
<223> OTHER INFORMATION: CD16V-Z amino acid

<400> SEQUENCE: 25

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Arg Val Lys Phe Ser Arg Ser Ala Asp Ala
        275                 280                 285

Pro Ala Tyr Gln Gln Gly Gln Asn Gln Leu Tyr Asn Glu Leu Asn Leu
    290                 295                 300

Gly Arg Arg Glu Glu Tyr Asp Val Leu Asp Lys Arg Arg Gly Arg Asp
305                 310                 315                 320

Pro Glu Met Gly Gly Lys Pro Arg Arg Lys Asn Pro Gln Glu Gly Leu
                325                 330                 335

Tyr Asn Glu Leu Gln Lys Asp Lys Met Ala Glu Ala Tyr Ser Glu Ile
            340                 345                 350
```

```
Gly Met Lys Gly Glu Arg Arg Arg Gly Lys Gly His Asp Gly Leu Tyr
        355                 360                 365

Gln Gly Leu Ser Thr Ala Thr Lys Asp Thr Tyr Asp Ala Leu His Met
    370                 375                 380

Gln Ala Leu Pro Pro Arg
385                 390


<210> SEQ ID NO 26
<211> LENGTH: 1299
<212> TYPE: DNA
<213> ORGANISM: Artificial Sequence
<220> FEATURE:
<223> OTHER INFORMATION: CD16V-BBZ nucleotide

<400> SEQUENCE: 26

atgtggcagc tgctgctgcc taccgctctg ctgctgctgg tctccgctgg gatgcgaacc      60

gaggatctgc ctaaagccgt ggtcttcctg gagcctcagt ggtacagagt gctggagaag     120

gactctgtga cactgaaatg ccagggcgct tattcaccag aggataacag cactcagtgg     180

ttccacaatg aatccctgat cagctcccag gcatctagtt actttattga cgccgctaca     240

gtggacgatt ctggagagta tcgatgccag actaacctga gcaccctgtc cgatcccgtg     300

cagctggaag tccacatcgg atggctgctg ctccaggcac caagatgggt cttcaaggag     360

gaagacccca ttcacctgcg ctgtcatagc tggaagaata ccgctctgca taaagtgaca     420

tacctccaga acggaaaggg ccgaaaatac ttccaccata attccgactt ttatatcccc     480

aaggcaaccc tgaaagatag tgggtcatat ttttgtcggg ggctggtggg aagtaaaaac     540

gtctcaagcg agactgtgaa tatcaccatt acacagggcc tggctgtcag caccatctcc     600

tctttctttc cccctggggc caaacctacc acaactcctg ctccaagacc acccacaccc     660

gctcctacta ttgcatctca gccactgagt ctgcgaccag aggcctgccg gcccgccgcc     720

ggcggggccg tgcataccag ggggcctggac ttcgcctgtg atatctacat ttgggctcca     780

ctggctggga cttgcggcgt gctgctgctg tctctggtca ttactctgta ttgtaagcgg     840

ggaagaaaga aactgctgta catcttcaaa cagcccttta tgaggcctgt gcagaccaca     900

caggaggaag acggctgctc ctgccggttc cccgaggaag aggaaggcgg gtgcgagctg     960

cgagtgaagt tcagcaggtc cgccgacgct cctgcatacc agcagggaca gaaccagctg    1020

tataacgagc tgaatctggg ccggagagag gaatacgacg tgctggacaa aaggcggggc    1080

cgggaccccg aaatgggagg gaagccacga cggaaaaacc cccaggaggg cctgtacaat    1140

gagctgcaaa aggacaaaat ggccgaggct tattctgaaa tcgggatgaa gggagagaga    1200

aggcgcggaa aaggccacga tggcctgtac caggggctga gcaccgctac aaaggacacc    1260

tatgatgcac tgcacatgca ggccctgccc cctcggtga                           1299


<210> SEQ ID NO 27
<211> LENGTH: 432
<212> TYPE: PRT
<213> ORGANISM: Artificial Sequence
<220> FEATURE:
<223> OTHER INFORMATION: CD16V-BBZ amino acid

<400> SEQUENCE: 27

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30
```

```
Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Lys Arg Gly Arg Lys Lys Leu Leu Tyr Ile
        275                 280                 285

Phe Lys Gln Pro Phe Met Arg Pro Val Gln Thr Thr Gln Glu Glu Asp
    290                 295                 300

Gly Cys Ser Cys Arg Phe Pro Glu Glu Glu Glu Gly Gly Cys Glu Leu
305                 310                 315                 320

Arg Val Lys Phe Ser Arg Ser Ala Asp Ala Pro Ala Tyr Gln Gln Gly
                325                 330                 335

Gln Asn Gln Leu Tyr Asn Glu Leu Asn Leu Gly Arg Arg Glu Glu Tyr
            340                 345                 350

Asp Val Leu Asp Lys Arg Arg Gly Arg Asp Pro Glu Met Gly Gly Lys
        355                 360                 365

Pro Arg Arg Lys Asn Pro Gln Glu Gly Leu Tyr Asn Glu Leu Gln Lys
    370                 375                 380

Asp Lys Met Ala Glu Ala Tyr Ser Glu Ile Gly Met Lys Gly Glu Arg
385                 390                 395                 400

Arg Arg Gly Lys Gly His Asp Gly Leu Tyr Gln Gly Leu Ser Thr Ala
                405                 410                 415

Thr Lys Asp Thr Tyr Asp Ala Leu His Met Gln Ala Leu Pro Pro Arg
            420                 425                 430
```

<210> SEQ ID NO 28
<211> LENGTH: 1281

```
<212> TYPE: DNA
<213> ORGANISM: Artificial Sequence
<220> FEATURE:
<223> OTHER INFORMATION: CD16V-OX40Z nucleotide

<400> SEQUENCE: 28

atgtggcagc tgctgctgcc taccgctctg ctgctgctgg tctccgctgg gatgcgaacc      60

gaggatctgc ctaaagccgt ggtcttcctg gagcctcagt ggtacagagt gctggagaag     120

gactctgtga cactgaaatg ccagggcgct tattcaccag aggataacag cactcagtgg     180

ttccacaatg aatccctgat cagctcccag gcatctagtt actttattga cgccgctaca     240

gtggacgatt ctggagagta tcgatgccag actaacctga gcaccctgtc cgatcccgtg     300

cagctggaag tccacatcgg atggctgctg ctccaggcac caagatgggt cttcaaggag     360

gaagacccca ttcacctgcg ctgtcatagc tggaagaata ccgctctgca taaagtgaca     420

tacctccaga acggaaaggg ccgaaaatac ttccaccata attccgactt ttatatcccc     480

aaggcaaccc tgaaagatag tggtcatat ttttgtcggg ggctggtggg aagtaaaaac     540

gtctcaagcg agactgtgaa tatcaccatt acacagggcc tggctgtcag caccatctcc     600

tctttctttc cccctggggc caaacctacc acaactcctg ctccaagacc acccacaccc     660

gctcctacta ttgcatctca gccactgagt ctgcgaccag aggcctgccg gcccgccgcc     720

ggcggggccg tgcataccag ggcctggac ttcgcctgtg atatctacat ttgggctcca     780

ctggctggga cttgcggcgt gctgctgctg tccctggtca tcactctgta ttgtcgggac     840

cagagactgc cacctgatgc acacaagcca ccaggaggag gcagcttcag gacccccatc     900

caggaggaac aggccgacgc tcattccaca ctggccaaaa ttcgagtgaa gttcagcagg     960

tccgccgacg ctcctgcata ccagcaggga cagaaccagc tgtataacga gctgaatctg    1020

ggccggagag aggaatacga cgtgctggac aaaaggcggg gccgggaccc cgaaatggga    1080

gggaagccac gacggaaaaa cccccaggag ggcctgtaca atgagctgca aaaggacaaa    1140

atggccgagg cttattctga aatcgggatg aagggagaga gaaggcgcgg aaaaggccac    1200

gatggcctgt accaggggct gagcaccgct acaaaggaca cctatgatgc actgcacatg    1260

caggccctgc cccctcggtg a                                               1281


<210> SEQ ID NO 29
<211> LENGTH: 426
<212> TYPE: PRT
<213> ORGANISM: Artificial Sequence
<220> FEATURE:
<223> OTHER INFORMATION: CD16V-OX40Z amino acid

<400> SEQUENCE: 29

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95
```

```
Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Arg Asp Gln Arg Leu Pro Pro Asp Ala His
        275                 280                 285

Lys Pro Pro Gly Gly Gly Ser Phe Arg Thr Pro Ile Gln Glu Glu Gln
    290                 295                 300

Ala Asp Ala His Ser Thr Leu Ala Lys Ile Arg Val Lys Phe Ser Arg
305                 310                 315                 320

Ser Ala Asp Ala Pro Ala Tyr Gln Gln Gly Gln Asn Gln Leu Tyr Asn
                325                 330                 335

Glu Leu Asn Leu Gly Arg Arg Glu Glu Tyr Asp Val Leu Asp Lys Arg
            340                 345                 350

Arg Gly Arg Asp Pro Glu Met Gly Gly Lys Pro Arg Arg Lys Asn Pro
        355                 360                 365

Gln Glu Gly Leu Tyr Asn Glu Leu Gln Lys Asp Lys Met Ala Glu Ala
    370                 375                 380

Tyr Ser Glu Ile Gly Met Lys Gly Glu Arg Arg Arg Gly Lys Gly His
385                 390                 395                 400

Asp Gly Leu Tyr Gln Gly Leu Ser Thr Ala Thr Lys Asp Thr Tyr Asp
                405                 410                 415

Ala Leu His Met Gln Ala Leu Pro Pro Arg
            420                 425
```

```
<210> SEQ ID NO 30
<211> LENGTH: 1239
<212> TYPE: DNA
<213> ORGANISM: Artificial Sequence
<220> FEATURE:
<223> OTHER INFORMATION: CD16V-OX40LZ nucleotide

<400> SEQUENCE: 30

atgtggcagc tgctgctgcc taccgctctg ctgctgctgg tctccgctgg gatgcgaacc      60

gaggatctgc ctaaagccgt ggtcttcctg gagcctcagt ggtacagagt gctggagaag     120

gactctgtga cactgaaatg ccagggcgct tattcaccag aggataacag cactcagtgg     180
```

```
ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag ggcctggac ttcgcctgtg atatctacat ttggctcca    780

ctggctggga cttgcggcgt gctgctgctg tctctggtca ttactctgta ttgtgaaaga    840

gtgcagcccc tggaagagaa tgtcgggaat gccgctcgcc caagatttga aaggaacaaa    900

cgagtgaagt tcagcaggtc cgccgacgct cctgcatacc agcagggaca gaaccagctg    960

tataacgagc tgaatctggg ccggagagag gaatacgacg tgctggacaa aaggcggggc   1020

cgggaccccg aaatgggagg gaagccacga cggaaaaacc cccaggaggg cctgtacaat   1080

gagctgcaaa aggacaaaat ggccgaggct tattctgaaa tcgggatgaa gggagagaga   1140

aggcgcggaa aaggccacga tggcctgtac caggggctga gcaccgctac aaaggacacc   1200

tatgatgcac tgcacatgca ggccctgccc cctcggtga                          1239
```

```
<210> SEQ ID NO 31
<211> LENGTH: 412
<212> TYPE: PRT
<213> ORGANISM: Artificial Sequence
<220> FEATURE:
<223> OTHER INFORMATION: CD16V-OX40LZ amino acid

<400> SEQUENCE: 31

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175
```

```
Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Glu Arg Val Gln Pro Leu Glu Glu Asn Val
        275                 280                 285

Gly Asn Ala Ala Arg Pro Arg Phe Glu Arg Asn Lys Arg Val Lys Phe
    290                 295                 300

Ser Arg Ser Ala Asp Ala Pro Ala Tyr Gln Gln Gly Gln Asn Gln Leu
305                 310                 315                 320

Tyr Asn Glu Leu Asn Leu Gly Arg Arg Glu Glu Tyr Asp Val Leu Asp
                325                 330                 335

Lys Arg Arg Gly Arg Asp Pro Glu Met Gly Gly Lys Pro Arg Arg Lys
            340                 345                 350

Asn Pro Gln Glu Gly Leu Tyr Asn Glu Leu Gln Lys Asp Lys Met Ala
        355                 360                 365

Glu Ala Tyr Ser Glu Ile Gly Met Lys Gly Glu Arg Arg Arg Gly Lys
    370                 375                 380

Gly His Asp Gly Leu Tyr Gln Gly Leu Ser Thr Ala Thr Lys Asp Thr
385                 390                 395                 400

Tyr Asp Ala Leu His Met Gln Ala Leu Pro Pro Arg
                405                 410
```

<210> SEQ ID NO 32
<211> LENGTH: 1305
<212> TYPE: DNA
<213> ORGANISM: Artificial Sequence
<220> FEATURE:
<223> OTHER INFORMATION: CD16V-28Z nucleotide

<400> SEQUENCE: 32

```
atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720
```

```
ggcggggccg tgcataccag gggcctggac ttcgcctgtg atttttgggt cctggtggtc     780

gtgggagggg tgctggcatg ttactcactg ctggtcaccg tggccttcat catcttctgg     840

gtgcggagca agaggtcccg cctgctgcac agcgactata tgaacatgac cccacggaga     900

cccggcccta cacggaaaca ttaccagccc tatgctccac cccgggactt cgcagcttac     960

agaagtcgag tgaagttcag caggtccgcc gacgctcctg cataccagca gggacagaac    1020

cagctgtata acgagctgaa tctgggccgg agagaggaat acgacgtgct ggacaaaagg    1080

cggggccggg accccgaaat gggagggaag ccacgacgga aaaacccca ggagggcctg    1140

tacaatgagc tgcaaaagga caaaatggcc gaggcttatt ctgaaatcgg gatgaaggga    1200

gagagaaggc gcggaaaagg ccacgatggc ctgtaccagg ggctgagcac cgctacaaag    1260

gacacctatg atgcactgca catgcaggcc ctgcccctc ggtga                     1305
```

```
<210> SEQ ID NO 33
<211> LENGTH: 434
<212> TYPE: PRT
<213> ORGANISM: Artificial Sequence
<220> FEATURE:
<223> OTHER INFORMATION: CD16V-28Z amino acid

<400> SEQUENCE: 33

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Phe Trp
                245                 250                 255

Val Leu Val Val Val Gly Gly Val Leu Ala Cys Tyr Ser Leu Leu Val
```

```
            260                 265                 270

Thr Val Ala Phe Ile Ile Phe Trp Val Arg Ser Lys Arg Ser Arg Leu
        275                 280                 285

Leu His Ser Asp Tyr Met Asn Met Thr Pro Arg Arg Pro Gly Pro Thr
    290                 295                 300

Arg Lys His Tyr Gln Pro Tyr Ala Pro Pro Arg Asp Phe Ala Ala Tyr
305                 310                 315                 320

Arg Ser Arg Val Lys Phe Ser Arg Ser Ala Asp Ala Pro Ala Tyr Gln
                325                 330                 335

Gln Gly Gln Asn Gln Leu Tyr Asn Glu Leu Asn Leu Gly Arg Arg Glu
            340                 345                 350

Glu Tyr Asp Val Leu Asp Lys Arg Arg Gly Arg Asp Pro Glu Met Gly
        355                 360                 365

Gly Lys Pro Arg Arg Lys Asn Pro Gln Glu Gly Leu Tyr Asn Glu Leu
    370                 375                 380

Gln Lys Asp Lys Met Ala Glu Ala Tyr Ser Glu Ile Gly Met Lys Gly
385                 390                 395                 400

Glu Arg Arg Arg Gly Lys Gly His Asp Gly Leu Tyr Gln Gly Leu Ser
                405                 410                 415

Thr Ala Thr Lys Asp Thr Tyr Asp Ala Leu His Met Gln Ala Leu Pro
            420                 425                 430

Pro Arg


<210> SEQ ID NO 34
<211> LENGTH: 1278
<212> TYPE: DNA
<213> ORGANISM: Artificial Sequence
<220> FEATURE:
<223> OTHER INFORMATION: CD16V-28(H)Z nucleotide

<400> SEQUENCE: 34

atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctgggat cgaggtcatg taccccccctc catatctgga caacgaaaag    660

tccaatggaa ctatcattca cgtgaagggc aaacatctgt gcccatctcc cctgttccct    720

gggccaagta aacctttttg ggtcctggtg gtcgtgggag gggtgctggc atgttactca    780

ctgctggtca ccgtggcctt catcatcttc tgggtgcgga gcaagaggtc ccgcctgctg    840

cacagcgact atatgaacat gaccccacgg agacccggcc ctacacggaa acattaccag    900

ccctatgctc caccccggga cttcgcagct tacagaagtc gagtgaagtt cagcaggtcc    960

gccgacgctc ctgcatacca gcagggacag aaccagctgt ataacgagct gaatctgggc   1020

cggagagagg aatacgacgt gctggacaaa aggcggggcc gggaccccga aatgggaggg   1080
```

```
aagccacgac ggaaaaaccc ccaggagggc ctgtacaatg agctgcaaaa ggacaaaatg   1140

gccgaggctt attctgaaat cgggatgaag ggagagagaa ggcgcggaaa aggccacgat   1200

ggcctgtacc aggggctgag caccgctaca aaggacacct atgatgcact gcacatgcag   1260

gccctgcccc ctcggtga                                                 1278


<210> SEQ ID NO 35
<211> LENGTH: 425
<212> TYPE: PRT
<213> ORGANISM: Artificial Sequence
<220> FEATURE:
<223> OTHER INFORMATION: CD16V-28(H)Z amino acid

<400> SEQUENCE: 35

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ile Glu
        195                 200                 205

Val Met Tyr Pro Pro Pro Tyr Leu Asp Asn Glu Lys Ser Asn Gly Thr
    210                 215                 220

Ile Ile His Val Lys Gly Lys His Leu Cys Pro Ser Pro Leu Phe Pro
225                 230                 235                 240

Gly Pro Ser Lys Pro Phe Trp Val Leu Val Val Val Gly Gly Val Leu
                245                 250                 255

Ala Cys Tyr Ser Leu Leu Val Thr Val Ala Phe Ile Ile Phe Trp Val
            260                 265                 270

Arg Ser Lys Arg Ser Arg Leu Leu His Ser Asp Tyr Met Asn Met Thr
        275                 280                 285

Pro Arg Arg Pro Gly Pro Thr Arg Lys His Tyr Gln Pro Tyr Ala Pro
    290                 295                 300

Pro Arg Asp Phe Ala Ala Tyr Arg Ser Arg Val Lys Phe Ser Arg Ser
305                 310                 315                 320
```

```
Ala Asp Ala Pro Ala Tyr Gln Gln Gly Gln Asn Gln Leu Tyr Asn Glu
                325                 330                 335

Leu Asn Leu Gly Arg Arg Glu Glu Tyr Asp Val Leu Asp Lys Arg Arg
            340                 345                 350

Gly Arg Asp Pro Glu Met Gly Gly Lys Pro Arg Arg Lys Asn Pro Gln
        355                 360                 365

Glu Gly Leu Tyr Asn Glu Leu Gln Lys Asp Lys Met Ala Glu Ala Tyr
    370                 375                 380

Ser Glu Ile Gly Met Lys Gly Glu Arg Arg Arg Gly Lys Gly His Asp
385                 390                 395                 400

Gly Leu Tyr Gln Gly Leu Ser Thr Ala Thr Lys Asp Thr Tyr Asp Ala
                405                 410                 415

Leu His Met Gln Ala Leu Pro Pro Arg
            420                 425


<210> SEQ ID NO 36
<211> LENGTH: 1407
<212> TYPE: DNA
<213> ORGANISM: Artificial Sequence
<220> FEATURE:
<223> OTHER INFORMATION: CD16V-BBOX40Z nucleotide

<400> SEQUENCE: 36

atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag ggcctggac ttcgcctgtg atatctacat ttgggctcca     780

ctggctggga cttgcggcgt gctgctgctg tctctggtca ttactctgta ttgtaagcgg    840

ggaagaaaga aactgctgta catcttcaaa cagcccttta tgaggcctgt gcagaccaca    900

caggaggaag acggctgctc ctgccggttc cccgaggaag aggaaggcgg gtgcgagctg    960

cgggaccaga gactgccacc tgatgcacac aagccaccag gaggaggcag cttcaggacc   1020

cccatccagg aggaacaggc cgacgctcat tccacactgg ccaaaattcg agtgaagttc   1080

agcaggtccg ccgacgctcc tgcataccag cagggacaga accagctgta taacgagctg   1140

aatctgggcc ggagagagga atacgacgtg ctggacaaaa ggcggggccg ggaccccgaa   1200

atgggaggga agccacgacg gaaaaacccc caggagggcc tgtacaatga gctgcaaaag   1260

gacaaaatgg ccgaggctta ttctgaaatc gggatgaagg gagagagaag gcgcggaaaa   1320

ggccacgatg gcctgtacca ggggctgagc accgctacaa aggacaccta tgatgcactg   1380

cacatgcagg ccctgccccc tcggtga                                       1407
```

<210> SEQ ID NO 37
<211> LENGTH: 468
<212> TYPE: PRT
<213> ORGANISM: Artificial Sequence
<220> FEATURE:
<223> OTHER INFORMATION: CD16V-BBOX40Z amino acid

<400> SEQUENCE: 37

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Lys Arg Gly Arg Lys Lys Leu Leu Tyr Ile
        275                 280                 285

Phe Lys Gln Pro Phe Met Arg Pro Val Gln Thr Thr Gln Glu Glu Asp
    290                 295                 300

Gly Cys Ser Cys Arg Phe Pro Glu Glu Glu Glu Gly Gly Cys Glu Leu
305                 310                 315                 320

Arg Asp Gln Arg Leu Pro Pro Asp Ala His Lys Pro Pro Gly Gly Gly
                325                 330                 335

Ser Phe Arg Thr Pro Ile Gln Glu Glu Gln Ala Asp Ala His Ser Thr
            340                 345                 350

Leu Ala Lys Ile Arg Val Lys Phe Ser Arg Ser Ala Asp Ala Pro Ala
        355                 360                 365
```

```
Tyr Gln Gln Gly Gln Asn Gln Leu Tyr Asn Glu Leu Asn Leu Gly Arg
    370                 375                 380

Arg Glu Glu Tyr Asp Val Leu Asp Lys Arg Arg Gly Arg Asp Pro Glu
385                 390                 395                 400

Met Gly Gly Lys Pro Arg Arg Lys Asn Pro Gln Glu Gly Leu Tyr Asn
                405                 410                 415

Glu Leu Gln Lys Asp Lys Met Ala Glu Ala Tyr Ser Glu Ile Gly Met
            420                 425                 430

Lys Gly Glu Arg Arg Arg Gly Lys Gly His Asp Gly Leu Tyr Gln Gly
        435                 440                 445

Leu Ser Thr Ala Thr Lys Asp Thr Tyr Asp Ala Leu His Met Gln Ala
    450                 455                 460

Leu Pro Pro Arg
465


<210> SEQ ID NO 38
<211> LENGTH: 1407
<212> TYPE: DNA
<213> ORGANISM: Artificial Sequence
<220> FEATURE:
<223> OTHER INFORMATION: CD16V-OX40BBZ nucleotide

<400> SEQUENCE: 38

atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag ggcctggac ttcgcctgtg atatctacat ttgggctcca     780

ctggctggga cttgcggcgt gctgctgctg tccctggtca tcactctgta ttgtcgggac    840

cagagactgc cacctgatgc acacaagcca ccaggaggag gcagcttcag gaccccccatc   900

caggaggaac aggccgacgc tcattccaca ctggccaaaa ttaagcgggg aagaaagaaa    960

ctgctgtaca tcttcaaaca gccctttatg aggcctgtgc agaccacaca ggaggaagac   1020

ggctgctcct gccggttccc cgaggaagag gaaggcgggt gcgagctgcg agtgaagttc   1080

agcaggtccg ccgacgctcc tgcataccag cagggacaga accagctgta taacgagctg   1140

aatctgggcc ggagagagga atacgacgtg ctggacaaaa ggcggggccg ggaccccgaa   1200

atgggaggga agccacgacg gaaaaacccc caggagggcc tgtacaatga gctgcaaaag   1260

gacaaaatgg ccgaggctta ttctgaaatc gggatgaagg gagagagaag gcgcggaaaa   1320

ggccacgatg gcctgtacca ggggctgagc accgctacaa aggacaccta tgatgcactg   1380

cacatgcagg ccctgccccc tcggtga                                       1407
```

<210> SEQ ID NO 39
<211> LENGTH: 468
<212> TYPE: PRT
<213> ORGANISM: Artificial Sequence
<220> FEATURE:
<223> OTHER INFORMATION: CD16V-OX40BBZ amino acid

<400> SEQUENCE: 39

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Arg Asp Gln Arg Leu Pro Pro Asp Ala His
        275                 280                 285

Lys Pro Pro Gly Gly Gly Ser Phe Arg Thr Pro Ile Gln Glu Glu Gln
    290                 295                 300

Ala Asp Ala His Ser Thr Leu Ala Lys Ile Lys Arg Gly Arg Lys Lys
305                 310                 315                 320

Leu Leu Tyr Ile Phe Lys Gln Pro Phe Met Arg Pro Val Gln Thr Thr
                325                 330                 335

Gln Glu Glu Asp Gly Cys Ser Cys Arg Phe Pro Glu Glu Glu Glu Gly
            340                 345                 350

Gly Cys Glu Leu Arg Val Lys Phe Ser Arg Ser Ala Asp Ala Pro Ala
        355                 360                 365
```

```
Tyr Gln Gln Gly Gln Asn Gln Leu Tyr Asn Glu Leu Asn Leu Gly Arg
    370                 375                 380

Arg Glu Glu Tyr Asp Val Leu Asp Lys Arg Arg Gly Arg Asp Pro Glu
385                 390                 395                 400

Met Gly Gly Lys Pro Arg Arg Lys Asn Pro Gln Glu Gly Leu Tyr Asn
                405                 410                 415

Glu Leu Gln Lys Asp Lys Met Ala Glu Ala Tyr Ser Glu Ile Gly Met
            420                 425                 430

Lys Gly Glu Arg Arg Arg Gly Lys Gly His Asp Gly Leu Tyr Gln Gly
        435                 440                 445

Leu Ser Thr Ala Thr Lys Asp Thr Tyr Asp Ala Leu His Met Gln Ala
    450                 455                 460

Leu Pro Pro Arg
465
```

<210> SEQ ID NO 40
<211> LENGTH: 1431
<212> TYPE: DNA
<213> ORGANISM: Artificial Sequence
<220> FEATURE:
<223> OTHER INFORMATION: CD16V-28BBZ nucleotide

<400> SEQUENCE: 40

```
atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag ggcctggac tttgcctgcg atttttgggt cctggtggtc     780

gtgggagggg tgctggcatg ttactcactg ctggtcaccg tggccttcat catcttctgg    840

gtgcggagca agaggtcccg cctgctgcac agcgactata tgaacatgac ccccacggaga    900

cccggcccta cacggaaaca ttaccagccc tatgctccac cccgggactt cgcagcttac    960

agaagtaagc ggggaagaaa gaaactgctg tacatcttca aacagccctt tatgaggcct   1020

gtgcagacca cacaggagga agacggctgc tcctgccggt tccccgagga agaggaaggc   1080

gggtgcgagc tgcgagtgaa gttcagcagg tccgccgacg ctcctgcata ccagcaggga   1140

cagaaccagc tgtataacga gctgaatctg ggccggagag aggaatacga cgtgctggac   1200

aaaaggcggg gccgggaccc cgaaatggga gggaagccac gacggaaaaa cccccaggag   1260

ggcctgtaca atgagctgca aaaggacaaa atggccgagg cttattctga aatcgggatg   1320

aagggagaga gaaggcgcgg aaaaggccac gatggcctgt accaggggct gagcaccgct   1380

acaaaggaca cctatgatgc actgcacatg caggccctgc cccctcggtg a            1431
```

<210> SEQ ID NO 41
<211> LENGTH: 476
<212> TYPE: PRT
<213> ORGANISM: Artificial Sequence
<220> FEATURE:
<223> OTHER INFORMATION: CD16V-28BBZ amino acid

<400> SEQUENCE: 41

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Phe Trp
                245                 250                 255

Val Leu Val Val Val Gly Gly Val Leu Ala Cys Tyr Ser Leu Leu Val
            260                 265                 270

Thr Val Ala Phe Ile Ile Phe Trp Val Arg Ser Lys Arg Ser Arg Leu
        275                 280                 285

Leu His Ser Asp Tyr Met Asn Met Thr Pro Arg Arg Pro Gly Pro Thr
    290                 295                 300

Arg Lys His Tyr Gln Pro Tyr Ala Pro Pro Arg Asp Phe Ala Ala Tyr
305                 310                 315                 320

Arg Ser Lys Arg Gly Arg Lys Lys Leu Leu Tyr Ile Phe Lys Gln Pro
                325                 330                 335

Phe Met Arg Pro Val Gln Thr Thr Gln Glu Glu Asp Gly Cys Ser Cys
            340                 345                 350

Arg Phe Pro Glu Glu Glu Glu Gly Gly Cys Glu Leu Arg Val Lys Phe
        355                 360                 365
```

```
Ser Arg Ser Ala Asp Ala Pro Ala Tyr Gln Gln Gly Gln Asn Gln Leu
    370                 375                 380

Tyr Asn Glu Leu Asn Leu Gly Arg Arg Glu Glu Tyr Asp Val Leu Asp
385                 390                 395                 400

Lys Arg Arg Gly Arg Asp Pro Glu Met Gly Gly Lys Pro Arg Arg Lys
                405                 410                 415

Asn Pro Gln Glu Gly Leu Tyr Asn Glu Leu Gln Lys Asp Lys Met Ala
            420                 425                 430

Glu Ala Tyr Ser Glu Ile Gly Met Lys Gly Glu Arg Arg Arg Gly Lys
        435                 440                 445

Gly His Asp Gly Leu Tyr Gln Gly Leu Ser Thr Ala Thr Lys Asp Thr
    450                 455                 460

Tyr Asp Ala Leu His Met Gln Ala Leu Pro Pro Arg
465                 470                 475


<210> SEQ ID NO 42
<211> LENGTH: 1413
<212> TYPE: DNA
<213> ORGANISM: Artificial Sequence
<220> FEATURE:
<223> OTHER INFORMATION: CD16V-28OX40Z nucleotide

<400> SEQUENCE: 42

atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag ggcctggac tttgcctgcg atttttgggt cctggtggtc     780

gtgggagggg tgctggcatg ttactcactg ctggtcaccg tggccttcat catcttctgg    840

gtgcggagca agaggtcccg cctgctgcac agcgactata tgaacatgac ccccacggaga   900

cccggcccta cacggaaaca ttaccagccc tatgctccac cccgggactt cgcagcttac    960

agaagtcggg accagagact gccacctgat gcacacaagc caccaggagg aggcagcttc   1020

aggaccccca tccaggagga acaggccgac gctcattcca cactggccaa aattcgagtg   1080

aagttcagca ggtccgccga cgctcctgca taccagcagg gacagaacca gctgtataac   1140

gagctgaatc tgggccggag agaggaatac gacgtgctgg acaaaaggcg gggccgggac   1200

cccgaaatgg gagggaagcc acgacggaaa aacccccagg agggcctgta caatgagctg   1260

caaaaggaca aaatggccga ggcttattct gaaatcggga tgaagggaga gagaaggcgc   1320

ggaaaaggcc acgatggcct gtaccagggg ctgagcaccg ctacaaagga cacctatgat   1380

gcactgcaca tgcaggccct gccccctcgg tga                                1413
```

```
<210> SEQ ID NO 43
<211> LENGTH: 470
<212> TYPE: PRT
<213> ORGANISM: Artificial Sequence
<220> FEATURE:
<223> OTHER INFORMATION: CD16V-28OX40Z amino acid

<400> SEQUENCE: 43

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Phe Trp
                245                 250                 255

Val Leu Val Val Val Gly Gly Val Leu Ala Cys Tyr Ser Leu Leu Val
            260                 265                 270

Thr Val Ala Phe Ile Ile Phe Trp Val Arg Ser Lys Arg Ser Arg Leu
        275                 280                 285

Leu His Ser Asp Tyr Met Asn Met Thr Pro Arg Arg Pro Gly Pro Thr
    290                 295                 300

Arg Lys His Tyr Gln Pro Tyr Ala Pro Pro Arg Asp Phe Ala Ala Tyr
305                 310                 315                 320

Arg Ser Arg Asp Gln Arg Leu Pro Pro Asp Ala His Lys Pro Pro Gly
                325                 330                 335

Gly Gly Ser Phe Arg Thr Pro Ile Gln Glu Glu Gln Ala Asp Ala His
            340                 345                 350

Ser Thr Leu Ala Lys Ile Arg Val Lys Phe Ser Arg Ser Ala Asp Ala
        355                 360                 365
```

```
Pro Ala Tyr Gln Gln Gly Gln Asn Gln Leu Tyr Asn Glu Leu Asn Leu
    370                 375                 380

Gly Arg Arg Glu Glu Tyr Asp Val Leu Asp Lys Arg Arg Gly Arg Asp
385                 390                 395                 400

Pro Glu Met Gly Gly Lys Pro Arg Arg Lys Asn Pro Gln Glu Gly Leu
                405                 410                 415

Tyr Asn Glu Leu Gln Lys Asp Lys Met Ala Glu Ala Tyr Ser Glu Ile
            420                 425                 430

Gly Met Lys Gly Glu Arg Arg Arg Gly Lys Gly His Asp Gly Leu Tyr
        435                 440                 445

Gln Gly Leu Ser Thr Ala Thr Lys Asp Thr Tyr Asp Ala Leu His Met
    450                 455                 460

Gln Ala Leu Pro Pro Arg
465                 470


<210> SEQ ID NO 44
<211> LENGTH: 1371
<212> TYPE: DNA
<213> ORGANISM: Artificial Sequence
<220> FEATURE:
<223> OTHER INFORMATION: CD16V-28OX40LZ nucleotide

<400> SEQUENCE: 44

atgtggcagc tgctgctgcc taccgctctg ctgctgctgg tctccgctgg gatgcgaacc      60

gaggatctgc ctaaagccgt ggtcttcctg gagcctcagt ggtacagagt gctggagaag     120

gactctgtga cactgaaatg ccagggcgct tattcaccag aggataacag cactcagtgg     180

ttccacaatg aatccctgat cagctcccag gcatctagtt actttattga cgccgctaca     240

gtggacgatt ctggagagta tcgatgccag actaacctga gcaccctgtc cgatcccgtg     300

cagctggaag tccacatcgg atggctgctg ctccaggcac caagatgggt cttcaaggag     360

gaagacccca ttcacctgcg ctgtcatagc tggaagaata ccgctctgca taaagtgaca     420

tacctccaga acggaaaggg ccgaaaatac ttccaccata attccgactt ttatatcccc     480

aaggcaaccc tgaaagatag tgggtcatat ttttgtcggg ggctggtggg aagtaaaaac     540

gtctcaagcg agactgtgaa tatcaccatt acacagggcc tggctgtcag caccatctcc     600

tctttctttc cccctggggc caaacctacc acaactcctg ctccaagacc acccacaccc     660

gctcctacta ttgcatctca gccactgagt ctgcgaccag aggcctgccg gcccgccgcc     720

ggcggggccg tgcataccag ggcctggac ttcgcctgtg atttttgggt cctggtggtc      780

gtgggagggg tgctggcatg ttactcactg ctggtcaccg tggccttcat catcttctgg     840

gtgcggagca agaggtcccg cctgctgcac agcgactata tgaacatgac ccccacggaga    900

cccggcccta cacggaaaca ttaccagccc tatgctccac cccgggactt cgcagcttac     960

agaagtgaaa gagtgcagcc cctggaagag aatgtcggga atgccgctcg cccaagattt    1020

gaaaggaaca aacgagtgaa gttcagcagg tccgccgacg ctcctgcata ccagcaggga    1080

cagaaccagc tgtataacga gctgaatctg ggccggagag aggaatacga cgtgctggac    1140

aaaaggcggg gccgggaccc cgaaatggga gggaagccac gacggaaaaa cccccaggag    1200

ggcctgtaca atgagctgca aaaggacaaa atggccgagg cttattctga aatcgggatg    1260

aagggagaga gaaggcgcgg aaaaggccac gatggcctgt accaggggct gagcaccgct    1320

acaaaggaca cctatgatgc actgcacatg caggccctgc cccctcggtg a             1371


<210> SEQ ID NO 45
```

<211> LENGTH: 456
<212> TYPE: PRT
<213> ORGANISM: Artificial Sequence
<220> FEATURE:
<223> OTHER INFORMATION: CD16V-28OX40LZ amino acid

<400> SEQUENCE: 45

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Phe Trp
                245                 250                 255

Val Leu Val Val Val Gly Gly Val Leu Ala Cys Tyr Ser Leu Leu Val
            260                 265                 270

Thr Val Ala Phe Ile Ile Phe Trp Val Arg Ser Lys Arg Ser Arg Leu
        275                 280                 285

Leu His Ser Asp Tyr Met Asn Met Thr Pro Arg Arg Pro Gly Pro Thr
    290                 295                 300

Arg Lys His Tyr Gln Pro Tyr Ala Pro Pro Arg Asp Phe Ala Ala Tyr
305                 310                 315                 320

Arg Ser Glu Arg Val Gln Pro Leu Glu Glu Asn Val Gly Asn Ala Ala
                325                 330                 335

Arg Pro Arg Phe Glu Arg Asn Lys Arg Val Lys Phe Ser Arg Ser Ala
            340                 345                 350

Asp Ala Pro Ala Tyr Gln Gln Gly Gln Asn Gln Leu Tyr Asn Glu Leu
        355                 360                 365

Asn Leu Gly Arg Arg Glu Glu Tyr Asp Val Leu Asp Lys Arg Arg Gly
    370                 375                 380
```

```
Arg Asp Pro Glu Met Gly Gly Lys Pro Arg Arg Lys Asn Pro Gln Glu
385                 390                 395                 400

Gly Leu Tyr Asn Glu Leu Gln Lys Asp Lys Met Ala Glu Ala Tyr Ser
                405                 410                 415

Glu Ile Gly Met Lys Gly Glu Arg Arg Arg Gly Lys Gly His Asp Gly
            420                 425                 430

Leu Tyr Gln Gly Leu Ser Thr Ala Thr Lys Asp Thr Tyr Asp Ala Leu
        435                 440                 445

His Met Gln Ala Leu Pro Pro Arg
    450                 455


<210> SEQ ID NO 46
<211> LENGTH: 1404
<212> TYPE: DNA
<213> ORGANISM: Artificial Sequence
<220> FEATURE:
<223> OTHER INFORMATION: CD16V-28(H)BBZ nucleotide

<400> SEQUENCE: 46

atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctgggat cgaggtcatg taccccccctc catatctgga caacgaaaag    660

tccaatggaa ctatcattca cgtgaagggc aaacatctgt gcccatctcc cctgttccct    720

gggccaagta aaccttttttg ggtcctggtg gtcgtgggag gggtgctggc atgttactca    780

ctgctggtca ccgtggcctt catcatcttc tgggtgcgga gcaagaggtc ccgcctgctg    840

cacagcgact atatgaacat gaccccacgg agacccggcc ctacacggaa acattaccag    900

ccctatgctc caccccggga cttcgcagct tacagaagta agcggggaag aaagaaactg    960

ctgtacatct tcaaacagcc ctttatgagg cctgtgcaga ccacacagga ggaagacggc   1020

tgctcctgcc ggttccccga ggaagaggaa ggcgggtgcg agctgcgagt gaagttcagc   1080

aggtccgccg acgctcctgc ataccagcag ggacagaacc agctgtataa cgagctgaat   1140

ctgggccgga gagaggaata cgacgtgctg gacaaaaggc ggggccggga ccccgaaatg   1200

ggagggaagc cacgacggaa aaacccccag gagggcctgt acaatgagct gcaaaaggac   1260

aaaatggccg aggcttattc tgaaatcggg atgaagggag agagaaggcg cggaaaaggc   1320

cacgatggcc tgtaccaggg gctgagcacc gctacaaagg acacctatga tgcactgcac   1380

atgcaggccc tgccccctcg gtga                                          1404


<210> SEQ ID NO 47
<211> LENGTH: 467
<212> TYPE: PRT
<213> ORGANISM: Artificial Sequence
```

<220> FEATURE:
<223> OTHER INFORMATION: CD16V-28(H)BBZ amino acid

<400> SEQUENCE: 47

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ile Glu
        195                 200                 205

Val Met Tyr Pro Pro Pro Tyr Leu Asp Asn Glu Lys Ser Asn Gly Thr
    210                 215                 220

Ile Ile His Val Lys Gly Lys His Leu Cys Pro Ser Pro Leu Phe Pro
225                 230                 235                 240

Gly Pro Ser Lys Pro Phe Trp Val Leu Val Val Val Gly Gly Val Leu
                245                 250                 255

Ala Cys Tyr Ser Leu Leu Val Thr Val Ala Phe Ile Ile Phe Trp Val
            260                 265                 270

Arg Ser Lys Arg Ser Arg Leu Leu His Ser Asp Tyr Met Asn Met Thr
        275                 280                 285

Pro Arg Arg Pro Gly Pro Thr Arg Lys His Tyr Gln Pro Tyr Ala Pro
    290                 295                 300

Pro Arg Asp Phe Ala Ala Tyr Arg Ser Lys Arg Gly Arg Lys Lys Leu
305                 310                 315                 320

Leu Tyr Ile Phe Lys Gln Pro Phe Met Arg Pro Val Gln Thr Thr Gln
                325                 330                 335

Glu Glu Asp Gly Cys Ser Cys Arg Phe Pro Glu Glu Glu Glu Gly Gly
            340                 345                 350

Cys Glu Leu Arg Val Lys Phe Ser Arg Ser Ala Asp Ala Pro Ala Tyr
        355                 360                 365

Gln Gln Gly Gln Asn Gln Leu Tyr Asn Glu Leu Asn Leu Gly Arg Arg
    370                 375                 380

Glu Glu Tyr Asp Val Leu Asp Lys Arg Arg Gly Arg Asp Pro Glu Met
385                 390                 395                 400
```

```
Gly Gly Lys Pro Arg Arg Lys Asn Pro Gln Glu Gly Leu Tyr Asn Glu
                405                 410                 415

Leu Gln Lys Asp Lys Met Ala Glu Ala Tyr Ser Glu Ile Gly Met Lys
            420                 425                 430

Gly Glu Arg Arg Arg Gly Lys Gly His Asp Gly Leu Tyr Gln Gly Leu
        435                 440                 445

Ser Thr Ala Thr Lys Asp Thr Tyr Asp Ala Leu His Met Gln Ala Leu
    450                 455                 460

Pro Pro Arg
465


<210> SEQ ID NO 48
<211> LENGTH: 1386
<212> TYPE: DNA
<213> ORGANISM: Artificial Sequence
<220> FEATURE:
<223> OTHER INFORMATION: CD16V-28(H)OX40Z nucleotide

<400> SEQUENCE: 48

atgtggcagc tgctgctgcc taccgctctg ctgctgctgg tctccgctgg gatgcgaacc      60

gaggatctgc ctaaagccgt ggtcttcctg gagcctcagt ggtacagagt gctggagaag     120

gactctgtga cactgaaatg ccagggcgct tattcaccag aggataacag cactcagtgg     180

ttccacaatg aatccctgat cagctcccag gcatctagtt actttattga cgccgctaca     240

gtggacgatt ctggagagta tcgatgccag actaacctga gcaccctgtc cgatcccgtg     300

cagctggaag tccacatcgg atggctgctg ctccaggcac caagatgggt cttcaaggag     360

gaagacccca ttcacctgcg ctgtcatagc tggaagaata ccgctctgca taaagtgaca     420

tacctccaga acggaaaggg ccgaaaatac ttccaccata attccgactt ttatatcccc     480

aaggcaaccc tgaaagatag tgggtcatat ttttgtcggg ggctggtggg aagtaaaaac     540

gtctcaagcg agactgtgaa tatcaccatt acacagggcc tggctgtcag caccatctcc     600

tctttctttc cccctgggat cgaggtcatg taccccccctc catatctgga caacgaaaag     660

tccaatggaa ctatcattca cgtgaagggc aaacatctgt gcccatctcc cctgttccct     720

gggccaagta aacctttttg ggtcctggtg gtcgtgggag ggtgctggc atgttactca     780

ctgctggtca ccgtggcctt catcatcttc tgggtgcgga gcaagaggtc ccgcctgctg     840

cacagcgact atatgaacat gaccccacgg agacccggcc ctacacggaa acattaccag     900

ccctatgctc caccccggga cttcgcagct tacagaagtc gggaccagag actgccacct     960

gatgcacaca agccaccagg aggaggcagc ttcaggaccc ccatccagga ggaacaggcc    1020

gacgctcatt ccacactggc caaaattcga gtgaagttca gcaggtccgc cgacgctcct    1080

gcataccagc agggacagaa ccagctgtat aacgagctga atctgggccg gagagaggaa    1140

tacgacgtgc tggacaaaag gcggggccgg gaccccgaaa tgggagggaa gccacgacgg    1200

aaaaaccccc aggagggcct gtacaatgag ctgcaaaagg acaaaatggc cgaggcttat    1260

tctgaaatcg ggatgaaggg agagagaagg cgcggaaaag gccacgatgg cctgtaccag    1320

gggctgagca ccgctacaaa ggacacctat gatgcactgc acatgcaggc cctgcccccct    1380

cggtga                                                                1386


<210> SEQ ID NO 49
<211> LENGTH: 461
<212> TYPE: PRT
<213> ORGANISM: Artificial Sequence
```

```
<220> FEATURE:
<223> OTHER INFORMATION: CD16V-28(H)OX40Z amino acid

<400> SEQUENCE: 49

Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ile Glu
        195                 200                 205

Val Met Tyr Pro Pro Pro Tyr Leu Asp Asn Glu Lys Ser Asn Gly Thr
    210                 215                 220

Ile Ile His Val Lys Gly Lys His Leu Cys Pro Ser Pro Leu Phe Pro
225                 230                 235                 240

Gly Pro Ser Lys Pro Phe Trp Val Leu Val Val Val Gly Gly Val Leu
                245                 250                 255

Ala Cys Tyr Ser Leu Leu Val Thr Val Ala Phe Ile Ile Phe Trp Val
            260                 265                 270

Arg Ser Lys Arg Ser Arg Leu Leu His Ser Asp Tyr Met Asn Met Thr
        275                 280                 285

Pro Arg Arg Pro Gly Pro Thr Arg Lys His Tyr Gln Pro Tyr Ala Pro
    290                 295                 300

Pro Arg Asp Phe Ala Ala Tyr Arg Ser Arg Asp Gln Arg Leu Pro Pro
305                 310                 315                 320

Asp Ala His Lys Pro Pro Gly Gly Gly Ser Phe Arg Thr Pro Ile Gln
                325                 330                 335

Glu Glu Gln Ala Asp Ala His Ser Thr Leu Ala Lys Ile Arg Val Lys
            340                 345                 350

Phe Ser Arg Ser Ala Asp Ala Pro Ala Tyr Gln Gln Gly Gln Asn Gln
        355                 360                 365

Leu Tyr Asn Glu Leu Asn Leu Gly Arg Arg Glu Glu Tyr Asp Val Leu
    370                 375                 380

Asp Lys Arg Arg Gly Arg Asp Pro Glu Met Gly Gly Lys Pro Arg Arg
385                 390                 395                 400
```

```
Lys Asn Pro Gln Glu Gly Leu Tyr Asn Glu Leu Gln Lys Asp Lys Met
                405                 410                 415

Ala Glu Ala Tyr Ser Glu Ile Gly Met Lys Gly Glu Arg Arg Arg Gly
            420                 425                 430

Lys Gly His Asp Gly Leu Tyr Gln Gly Leu Ser Thr Ala Thr Lys Asp
        435                 440                 445

Thr Tyr Asp Ala Leu His Met Gln Ala Leu Pro Pro Arg
    450                 455                 460
```

<210> SEQ ID NO 50
<211> LENGTH: 1344
<212> TYPE: DNA
<213> ORGANISM: Artificial Sequence
<220> FEATURE:
<223> OTHER INFORMATION: CD16V-28(H)OX40LZ nucleotide

<400> SEQUENCE: 50

```
atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctgggat cgaggtcatg taccccccctc catatctgga caacgaaaag    660

tccaatggaa ctatcattca cgtgaagggc aaacatctgt gcccatctcc cctgttccct    720

gggccaagta aaccttttttg ggtcctggtg gtcgtgggag gggtgctggc atgttactca    780

ctgctggtca ccgtggcctt catcatcttc tgggtgcgga gcaagaggtc ccgcctgctg    840

cacagcgact atatgaacat gaccccacgg agacccggcc ctacacggaa acattaccag    900

ccctatgctc caccccggga cttcgcagct tacagaagtg aaagagtgca gcccctggaa    960

gagaatgtcg ggaatgccgc tcgcccaaga tttgaaagga acaaacgagt gaagttcagc   1020

aggtccgccg acgctcctgc ataccagcag ggacagaacc agctgtataa cgagctgaat   1080

ctgggccgga gagaggaata cgacgtgctg gacaaaaggc ggggccggga ccccgaaatg   1140

ggagggaagc cacgacggaa aaacccccag gagggcctgt acaatgagct gcaaaaggac   1200

aaaatggccg aggcttattc tgaaatcggg atgaagggag agagaaggcg cggaaaaggc   1260

cacgatggcc tgtaccaggg gctgagcacc gctacaaagg acacctatga tgcactgcac   1320

atgcaggccc tgccccctcg gtga                                          1344
```

<210> SEQ ID NO 51
<211> LENGTH: 447
<212> TYPE: PRT
<213> ORGANISM: Artificial Sequence
<220> FEATURE:
<223> OTHER INFORMATION: CD16V-28(H)OX40LZ amino acid

<400> SEQUENCE: 51

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ile Glu
        195                 200                 205

Val Met Tyr Pro Pro Pro Tyr Leu Asp Asn Glu Lys Ser Asn Gly Thr
    210                 215                 220

Ile Ile His Val Lys Gly Lys His Leu Cys Pro Ser Pro Leu Phe Pro
225                 230                 235                 240

Gly Pro Ser Lys Pro Phe Trp Val Leu Val Val Val Gly Gly Val Leu
                245                 250                 255

Ala Cys Tyr Ser Leu Leu Val Thr Val Ala Phe Ile Ile Phe Trp Val
            260                 265                 270

Arg Ser Lys Arg Ser Arg Leu Leu His Ser Asp Tyr Met Asn Met Thr
        275                 280                 285

Pro Arg Arg Pro Gly Pro Thr Arg Lys His Tyr Gln Pro Tyr Ala Pro
    290                 295                 300

Pro Arg Asp Phe Ala Ala Tyr Arg Ser Glu Arg Val Gln Pro Leu Glu
305                 310                 315                 320

Glu Asn Val Gly Asn Ala Ala Arg Pro Arg Phe Glu Arg Asn Lys Arg
                325                 330                 335

Val Lys Phe Ser Arg Ser Ala Asp Ala Pro Ala Tyr Gln Gln Gly Gln
            340                 345                 350

Asn Gln Leu Tyr Asn Glu Leu Asn Leu Gly Arg Arg Glu Glu Tyr Asp
        355                 360                 365

Val Leu Asp Lys Arg Arg Gly Arg Asp Pro Glu Met Gly Gly Lys Pro
    370                 375                 380

Arg Arg Lys Asn Pro Gln Glu Gly Leu Tyr Asn Glu Leu Gln Lys Asp
385                 390                 395                 400

Lys Met Ala Glu Ala Tyr Ser Glu Ile Gly Met Lys Gly Glu Arg Arg
                405                 410                 415

Arg Gly Lys Gly His Asp Gly Leu Tyr Gln Gly Leu Ser Thr Ala Thr
```

420 425 430

Lys Asp Thr Tyr Asp Ala Leu His Met Gln Ala Leu Pro Pro Arg
435 440 445

<210> SEQ ID NO 52
<211> LENGTH: 1365
<212> TYPE: DNA
<213> ORGANISM: Artificial Sequence
<220> FEATURE:
<223> OTHER INFORMATION: CD16V-BBOX40LZ nucleotide

<400> SEQUENCE: 52

```
atgtggcagc tgctgctgcc taccgctctg ctgctgctgg tctccgctgg gatgcgaacc     60

gaggatctgc ctaaagccgt ggtcttcctg gagcctcagt ggtacagagt gctggagaag    120

gactctgtga cactgaaatg ccagggcgct tattcaccag aggataacag cactcagtgg    180

ttccacaatg aatccctgat cagctcccag gcatctagtt actttattga cgccgctaca    240

gtggacgatt ctggagagta tcgatgccag actaacctga gcaccctgtc cgatcccgtg    300

cagctggaag tccacatcgg atggctgctg ctccaggcac caagatgggt cttcaaggag    360

gaagacccca ttcacctgcg ctgtcatagc tggaagaata ccgctctgca taaagtgaca    420

tacctccaga acggaaaggg ccgaaaatac ttccaccata attccgactt ttatatcccc    480

aaggcaaccc tgaaagatag tgggtcatat ttttgtcggg ggctggtggg aagtaaaaac    540

gtctcaagcg agactgtgaa tatcaccatt acacagggcc tggctgtcag caccatctcc    600

tctttctttc cccctggggc caaacctacc acaactcctg ctccaagacc acccacaccc    660

gctcctacta ttgcatctca gccactgagt ctgcgaccag aggcctgccg gcccgccgcc    720

ggcggggccg tgcataccag ggcctggac ttcgcctgtg atatctacat ttgggctcca    780

ctggctggga cttgcggcgt gctgctgctg tctctggtca ttactctgta ttgtaagcgg    840

ggaagaaaga aactgctgta catcttcaaa cagcccttta tgaggcctgt gcagaccaca    900

caggaggaag acggctgctc ctgccggttc cccgaggaag aggaaggcgg gtgcgagctg    960

gaaagagtgc agcccctgga agagaatgtc gggaatgccg ctcgcccaag atttgaaagg   1020

aacaaacgag tgaagttcag caggtccgcc gacgctcctg cataccagca gggacagaac   1080

cagctgtata acgagctgaa tctgggccgg agagaggaat acgacgtgct ggacaaaagg   1140

cggggccggg accccgaaat gggagggaag ccacgacgga aaaacccca ggagggcctg   1200

tacaatgagc tgcaaaagga caaaatggcc gaggcttatt ctgaaatcgg gatgaaggga   1260

gagagaaggc gcggaaaagg ccacgatggc ctgtaccagg ggctgagcac cgctacaaag   1320

gacacctatg atgcactgca catgcaggcc ctgcccccctc ggtga                   1365
```

<210> SEQ ID NO 53
<211> LENGTH: 454
<212> TYPE: PRT
<213> ORGANISM: Artificial Sequence
<220> FEATURE:
<223> OTHER INFORMATION: CD16V-BBOX40LZ amino acid

<400> SEQUENCE: 53

Met Trp Gln Leu Leu Leu Pro Thr Ala Leu Leu Leu Leu Val Ser Ala
1 5 10 15

Gly Met Arg Thr Glu Asp Leu Pro Lys Ala Val Val Phe Leu Glu Pro
20 25 30

Gln Trp Tyr Arg Val Leu Glu Lys Asp Ser Val Thr Leu Lys Cys Gln
35 40 45

```
Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95

Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Lys Arg Gly Arg Lys Lys Leu Leu Tyr Ile
        275                 280                 285

Phe Lys Gln Pro Phe Met Arg Pro Val Gln Thr Thr Gln Glu Glu Asp
    290                 295                 300

Gly Cys Ser Cys Arg Phe Pro Glu Glu Glu Glu Gly Gly Cys Glu Leu
305                 310                 315                 320

Glu Arg Val Gln Pro Leu Glu Glu Asn Val Gly Asn Ala Ala Arg Pro
                325                 330                 335

Arg Phe Glu Arg Asn Lys Arg Val Lys Phe Ser Arg Ser Ala Asp Ala
            340                 345                 350

Pro Ala Tyr Gln Gln Gly Gln Asn Gln Leu Tyr Asn Glu Leu Asn Leu
        355                 360                 365

Gly Arg Arg Glu Glu Tyr Asp Val Leu Asp Lys Arg Arg Gly Arg Asp
    370                 375                 380

Pro Glu Met Gly Gly Lys Pro Arg Arg Lys Asn Pro Gln Glu Gly Leu
385                 390                 395                 400

Tyr Asn Glu Leu Gln Lys Asp Lys Met Ala Glu Ala Tyr Ser Glu Ile
                405                 410                 415

Gly Met Lys Gly Glu Arg Arg Arg Gly Lys Gly His Asp Gly Leu Tyr
            420                 425                 430

Gln Gly Leu Ser Thr Ala Thr Lys Asp Thr Tyr Asp Ala Leu His Met
        435                 440                 445

Gln Ala Leu Pro Pro Arg
    450
```

<210> SEQ ID NO 54
<211> LENGTH: 1239
<212> TYPE: DNA
<213> ORGANISM: Artificial Sequence
<220> FEATURE:
<223> OTHER INFORMATION: CD16V-ZOX40L nucleotide

<400> SEQUENCE: 54

```
atgtggcagc tgctgctgcc taccgctctg ctgctgctgg tctccgctgg gatgcgaacc     60
gaggatctgc ctaaagccgt ggtcttcctg gagcctcagt ggtacagagt gctggagaag    120
gactctgtga cactgaaatg ccagggcgct tattcaccag aggataacag cactcagtgg    180
ttccacaatg aatccctgat cagctcccag gcatctagtt actttattga cgccgctaca    240
gtggacgatt ctggagagta tcgatgccag actaacctga gcaccctgtc cgatcccgtg    300
cagctggaag tccacatcgg atggctgctg ctccaggcac caagatgggt cttcaaggag    360
gaagacccca ttcacctgcg ctgtcatagc tggaagaata ccgctctgca taaagtgaca    420
tacctccaga acggaaaggg ccgaaaatac ttccaccata attccgactt ttatatcccc    480
aaggcaaccc tgaaagatag tgggtcatat ttttgtcggg ggctggtggg aagtaaaaac    540
gtctcaagcg agactgtgaa tatcaccatt acacagggcc tggctgtcag caccatctcc    600
tctttctttc cccctggggc caaacctacc acaactcctg ctccaagacc acccacaccc    660
gctcctacta ttgcatctca gccactgagt ctgcgaccag aggcctgccg gcccgccgcc    720
ggcggggccg tgcataccag gggcctggac ttcgcctgtg atatctacat ttgggctcca    780
ctggctggga cttgcggcgt gctgctgctg tctctggtca ttactctgta ttgtcgagtg    840
aagttcagca ggtccgccga cgctcctgca taccagcagg gacagaacca gctgtataac    900
gagctgaatc tgggccggag agaggaatac gacgtgctgg acaaaaggcg gggccgggac    960
cccgaaatgg gagggaagcc acgacggaaa aacccccagg agggcctgta caatgagctg   1020
caaaaggaca aaatggccga ggcttattct gaaatcggga tgaagggaga gagaaggcgc   1080
ggaaaaggcc acgatggcct gtaccagggg ctgagcaccg ctacaaagga cacctatgat   1140
gcactgcaca tgcaggccct gccccctcgg gaaagagtgc agcccctgga agagaatgtc   1200
gggaatgccg ctcgcccaag atttgaaagg aacaaatga                            1239
```

<210> SEQ ID NO 55
<211> LENGTH: 412
<212> TYPE: PRT
<213> ORGANISM: Artificial Sequence
<220> FEATURE:
<223> OTHER INFORMATION: CD16V-ZOX40L amino acid

<400> SEQUENCE: 55

```
Met Trp Gln Leu Leu Leu Pro Thr Ala Leu Leu Leu Leu Val Ser Ala
1               5                   10                  15

Gly Met Arg Thr Glu Asp Leu Pro Lys Ala Val Val Phe Leu Glu Pro
            20                  25                  30

Gln Trp Tyr Arg Val Leu Glu Lys Asp Ser Val Thr Leu Lys Cys Gln
        35                  40                  45

Gly Ala Tyr Ser Pro Glu Asp Asn Ser Thr Gln Trp Phe His Asn Glu
    50                  55                  60

Ser Leu Ile Ser Ser Gln Ala Ser Ser Tyr Phe Ile Asp Ala Ala Thr
65                  70                  75                  80

Val Asp Asp Ser Gly Glu Tyr Arg Cys Gln Thr Asn Leu Ser Thr Leu
                85                  90                  95
```

```
Ser Asp Pro Val Gln Leu Glu Val His Ile Gly Trp Leu Leu Leu Gln
            100                 105                 110

Ala Pro Arg Trp Val Phe Lys Glu Glu Asp Pro Ile His Leu Arg Cys
        115                 120                 125

His Ser Trp Lys Asn Thr Ala Leu His Lys Val Thr Tyr Leu Gln Asn
    130                 135                 140

Gly Lys Gly Arg Lys Tyr Phe His His Asn Ser Asp Phe Tyr Ile Pro
145                 150                 155                 160

Lys Ala Thr Leu Lys Asp Ser Gly Ser Tyr Phe Cys Arg Gly Leu Val
                165                 170                 175

Gly Ser Lys Asn Val Ser Ser Glu Thr Val Asn Ile Thr Ile Thr Gln
            180                 185                 190

Gly Leu Ala Val Ser Thr Ile Ser Ser Phe Phe Pro Pro Gly Ala Lys
        195                 200                 205

Pro Thr Thr Thr Pro Ala Pro Arg Pro Pro Thr Pro Ala Pro Thr Ile
    210                 215                 220

Ala Ser Gln Pro Leu Ser Leu Arg Pro Glu Ala Cys Arg Pro Ala Ala
225                 230                 235                 240

Gly Gly Ala Val His Thr Arg Gly Leu Asp Phe Ala Cys Asp Ile Tyr
                245                 250                 255

Ile Trp Ala Pro Leu Ala Gly Thr Cys Gly Val Leu Leu Leu Ser Leu
            260                 265                 270

Val Ile Thr Leu Tyr Cys Arg Val Lys Phe Ser Arg Ser Ala Asp Ala
        275                 280                 285

Pro Ala Tyr Gln Gln Gly Gln Asn Gln Leu Tyr Asn Glu Leu Asn Leu
    290                 295                 300

Gly Arg Arg Glu Glu Tyr Asp Val Leu Asp Lys Arg Arg Gly Arg Asp
305                 310                 315                 320

Pro Glu Met Gly Gly Lys Pro Arg Arg Lys Asn Pro Gln Glu Gly Leu
                325                 330                 335

Tyr Asn Glu Leu Gln Lys Asp Lys Met Ala Glu Ala Tyr Ser Glu Ile
            340                 345                 350

Gly Met Lys Gly Glu Arg Arg Arg Gly Lys Gly His Asp Gly Leu Tyr
        355                 360                 365

Gln Gly Leu Ser Thr Ala Thr Lys Asp Thr Tyr Asp Ala Leu His Met
    370                 375                 380

Gln Ala Leu Pro Pro Arg Glu Arg Val Gln Pro Leu Glu Glu Asn Val
385                 390                 395                 400

Gly Asn Ala Ala Arg Pro Arg Phe Glu Arg Asn Lys
                405                 410
```

<210> SEQ ID NO 56
<211> LENGTH: 63
<212> TYPE: DNA
<213> ORGANISM: Artificial Sequence
<220> FEATURE:
<223> OTHER INFORMATION: CD8 alpha nucleotide

<400> SEQUENCE: 56

```
atggccttac cagtgaccgc cttgctcctg ccgctggcct tgctgctcca cgccgccagg     60

ccg                                                                   63
```

<210> SEQ ID NO 57
<211> LENGTH: 63
<212> TYPE: DNA

<213> ORGANISM: Artificial Sequence
<220> FEATURE:
<223> OTHER INFORMATION: CD8 alpha nucleotide codon optimization

<400> SEQUENCE: 57

```
atggctctgc cagtgactgc actgctgctg ccactggccc tgctgctgca cgcagctcga     60

cct                                                                   63
```

<210> SEQ ID NO 58
<211> LENGTH: 21
<212> TYPE: PRT
<213> ORGANISM: Artificial Sequence
<220> FEATURE:
<223> OTHER INFORMATION: CD8 alpha amino acid

<400> SEQUENCE: 58

```
Met Ala Leu Pro Val Thr Ala Leu Leu Leu Pro Leu Ala Leu Leu Leu
1               5                   10                  15

His Ala Ala Arg Pro
            20
```

<210> SEQ ID NO 59
<211> LENGTH: 405
<212> TYPE: DNA
<213> ORGANISM: Artificial Sequence
<220> FEATURE:
<223> OTHER INFORMATION: NKG2D nucleotide

<400> SEQUENCE: 59

```
ttattcaacc aagaagttca aattcccttg accgaaagtt actgtggccc atgtcctaaa     60

aactggatat gttacaaaaa taactgctac caatttttg atgagagtaa aaactggtat     120

gagagccagg cttcttgtat gtctcaaaat gccagccttc tgaaagtata cagcaaagag    180

gaccaggatt tacttaaact ggtgaagtca tatcattgga tgggactagt acacattcca    240

acaaatggat cttggcagtg ggaagatggc tccattctct cacccaacct actaacaata    300

attgaaatgc agaagggaga ctgtgcactc tatgcctcga gctttaaagg ctatatagaa    360

aactgttcaa ctccaaatac atacatctgc atgcaaagga ctgtg                    405
```

<210> SEQ ID NO 60
<211> LENGTH: 405
<212> TYPE: DNA
<213> ORGANISM: Artificial Sequence
<220> FEATURE:
<223> OTHER INFORMATION: NKG2D nucleotide codon optimization

<400> SEQUENCE: 60

```
ctgttcaacc aggaggtcca gatcccactg accgaaagtt actgcggacc atgtcccaag     60

aactggatct gctacaagaa caactgttac cagttctttg acgagtctaa gaactggtat    120

gaatctcagg ccagttgcat gtcacagaat gcttcactgc tgaaggtgta cagcaaagag    180

gaccaggatc tgctgaagct ggtgaaatcc tatcactgga tgggcctggt ccatatccca    240

accaacgggt cttggcagtg ggaggacgga agcattctgt cccccaatct gctgacaatc    300

attgaaatgc agaagggcga ttgtgctctg tacgcaagct ccttcaaagg gtatatcgag    360

aactgctcca cccccaatac atacatttgt atgcagagga cagtg                    405
```

<210> SEQ ID NO 61
<211> LENGTH: 135
<212> TYPE: PRT
<213> ORGANISM: Artificial Sequence

```
<220> FEATURE:
<223> OTHER INFORMATION: NKG2D amino acid

<400> SEQUENCE: 61

Leu Phe Asn Gln Glu Val Gln Ile Pro Leu Thr Glu Ser Tyr Cys Gly
1               5                   10                  15

Pro Cys Pro Lys Asn Trp Ile Cys Tyr Lys Asn Asn Cys Tyr Gln Phe
            20                  25                  30

Phe Asp Glu Ser Lys Asn Trp Tyr Glu Ser Gln Ala Ser Cys Met Ser
        35                  40                  45

Gln Asn Ala Ser Leu Leu Lys Val Tyr Ser Lys Glu Asp Gln Asp Leu
    50                  55                  60

Leu Lys Leu Val Lys Ser Tyr His Trp Met Gly Leu Val His Ile Pro
65                  70                  75                  80

Thr Asn Gly Ser Trp Gln Trp Glu Asp Gly Ser Ile Leu Ser Pro Asn
                85                  90                  95

Leu Leu Thr Ile Ile Glu Met Gln Lys Gly Asp Cys Ala Leu Tyr Ala
            100                 105                 110

Ser Ser Phe Lys Gly Tyr Ile Glu Asn Cys Ser Thr Pro Asn Thr Tyr
        115                 120                 125

Ile Cys Met Gln Arg Thr Val
    130                 135


<210> SEQ ID NO 62
<211> LENGTH: 1023
<212> TYPE: DNA
<213> ORGANISM: Artificial Sequence
<220> FEATURE:
<223> OTHER INFORMATION: NKG2D-Z nucleotide

<400> SEQUENCE: 62

atggctctgc cagtgactgc actgctgctg ccactggccc tgctgctgca cgcagctcga      60

cctctgttca accaggaggt ccagatccca ctgaccgaaa gttactgcgg accatgtccc     120

aagaactgga tctgctacaa gaacaactgt taccagttct ttgacgagtc taagaactgg     180

tatgaatctc aggccagttg catgtcacag aatgcttcac tgctgaaggt gtacagcaaa     240

gaggaccagg atctgctgaa gctggtgaaa tcctatcact ggatgggcct ggtccatatc     300

ccaaccaacg ggtcttggca gtgggaggac ggaagcattc tgtcccccaa tctgctgaca     360

atcattgaaa tgcagaaggg cgattgtgct ctgtacgcaa gctccttcaa agggtatatc     420

gagaactgct ccaccccaa tacatacatt tgtatgcaga ggacagtggc aaaacctacc      480

acaactcctg caccacgccc ccctactcca gcacctacca tcgcatctca gccactgagt     540

ctgcgaccag aggcctgccg gcccgccgcc ggcggggccg tccataccag agggctggac     600

tttgcctgcg atatctacat ttgggcccct ctggctggaa catgtggcgt gctgctgctg     660

tccctggtca ttactctgta ttgtcgagtg aagttcagca ggtccgccga cgctcctgca     720

taccagcagg gacagaacca gctgtataac gagctgaatc tgggccggag agaggaatac     780

gacgtgctgg acaaaaggcg gggccgggac cccgaaatgg gagggaagcc acgacggaaa     840

aacccccagg agggcctgta caatgagctg caaaaggaca aaatggccga ggcttattct     900

gaaatcggga tgaagggaga gagaaggcgc ggaaaaggcc acgatggcct gtaccagggg     960

ctgagcaccg ctacaaagga cacctatgat gcactgcaca tgcaggccct gccccctcgg    1020

tga                                                                  1023
```

<210> SEQ ID NO 63
<211> LENGTH: 340
<212> TYPE: PRT
<213> ORGANISM: Artificial Sequence
<220> FEATURE:
<223> OTHER INFORMATION: NKG2D-Z amino acid

<400> SEQUENCE: 63

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
        195                 200                 205

Ala Pro Leu Ala Gly Thr Cys Gly Val Leu Leu Leu Ser Leu Val Ile
    210                 215                 220

Thr Leu Tyr Cys Arg Val Lys Phe Ser Arg Ser Ala Asp Ala Pro Ala
225                 230                 235                 240

Tyr Gln Gln Gly Gln Asn Gln Leu Tyr Asn Glu Leu Asn Leu Gly Arg
                245                 250                 255

Arg Glu Glu Tyr Asp Val Leu Asp Lys Arg Arg Gly Arg Asp Pro Glu
            260                 265                 270

Met Gly Gly Lys Pro Arg Arg Lys Asn Pro Gln Glu Gly Leu Tyr Asn
        275                 280                 285

Glu Leu Gln Lys Asp Lys Met Ala Glu Ala Tyr Ser Glu Ile Gly Met
    290                 295                 300

Lys Gly Glu Arg Arg Arg Gly Lys Gly His Asp Gly Leu Tyr Gln Gly
305                 310                 315                 320

Leu Ser Thr Ala Thr Lys Asp Thr Tyr Asp Ala Leu His Met Gln Ala
                325                 330                 335

Leu Pro Pro Arg
            340
```

<210> SEQ ID NO 64
<211> LENGTH: 1149
<212> TYPE: DNA

<213> ORGANISM: Artificial Sequence
<220> FEATURE:
<223> OTHER INFORMATION: NKG2D-BBZ nucleotide

<400> SEQUENCE: 64

```
atggctctgc cagtgactgc actgctgctg ccactggccc tgctgctgca cgcagctcga      60

cctctgttca accaggaggt ccagatccca ctgaccgaaa gttactgcgg accatgtccc     120

aagaactgga tctgctacaa gaacaactgt taccagttct ttgacgagtc taagaactgg     180

tatgaatctc aggccagttg catgtcacag aatgcttcac tgctgaaggt gtacagcaaa     240

gaggaccagg atctgctgaa gctggtgaaa tcctatcact ggatgggcct ggtccatatc     300

ccaaccaacg ggtcttggca gtgggaggac ggaagcattc tgtcccccaa tctgctgaca     360

atcattgaaa tgcagaaggg cgattgtgct ctgtacgcaa gctccttcaa agggtatatc     420

gagaactgct ccacccccaa tacatacatt tgtatgcaga ggacagtggc aaaacctacc     480

acaactcctg caccacgccc ccctactcca gcacctacca tcgcatctca gccactgagt     540

ctgcgaccag aggcctgccg gcccgccgcc ggcggggccg tccataccag agggctggac     600

tttgcctgcg atatctacat ttgggcccct ctggctggaa catgtggcgt gctgctgctg     660

tccctggtca ttactctgta ttgtaagcgg ggaagaaaga aactgctgta catcttcaaa     720

cagcccttta tgaggcctgt gcagaccaca caggaggaag acggctgctc ctgccggttc     780

cccgaggaag aggaaggcgg gtgcgagctg cgagtgaagt tcagcaggtc cgccgacgct     840

cctgcatacc agcagggaca gaaccagctg tataacgagc tgaatctggg ccggagagag     900

gaatacgacg tgctggacaa aaggcggggc cgggaccccg aaatgggagg gaagccacga     960

cggaaaaacc cccaggaggg cctgtacaat gagctgcaaa aggacaaaat ggccgaggct    1020

tattctgaaa tcgggatgaa gggagagaga aggcgcggaa aaggccacga tggcctgtac    1080

caggggctga gcaccgctac aaaggacacc tatgatgcac tgcacatgca ggccctgccc    1140

cctcggtga                                                            1149
```

<210> SEQ ID NO 65
<211> LENGTH: 382
<212> TYPE: PRT
<213> ORGANISM: Artificial Sequence
<220> FEATURE:
<223> OTHER INFORMATION: NKG2D-BBZ amino acid

<400> SEQUENCE: 65

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125
```

```
Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
        195                 200                 205

Ala Pro Leu Ala Gly Thr Cys Gly Val Leu Leu Leu Ser Leu Val Ile
    210                 215                 220

Thr Leu Tyr Cys Lys Arg Gly Arg Lys Lys Leu Leu Tyr Ile Phe Lys
225                 230                 235                 240

Gln Pro Phe Met Arg Pro Val Gln Thr Thr Gln Glu Glu Asp Gly Cys
                245                 250                 255

Ser Cys Arg Phe Pro Glu Glu Glu Glu Gly Gly Cys Glu Leu Arg Val
            260                 265                 270

Lys Phe Ser Arg Ser Ala Asp Ala Pro Ala Tyr Gln Gln Gly Gln Asn
        275                 280                 285

Gln Leu Tyr Asn Glu Leu Asn Leu Gly Arg Arg Glu Glu Tyr Asp Val
    290                 295                 300

Leu Asp Lys Arg Arg Gly Arg Asp Pro Glu Met Gly Gly Lys Pro Arg
305                 310                 315                 320

Arg Lys Asn Pro Gln Glu Gly Leu Tyr Asn Glu Leu Gln Lys Asp Lys
                325                 330                 335

Met Ala Glu Ala Tyr Ser Glu Ile Gly Met Lys Gly Glu Arg Arg Arg
            340                 345                 350

Gly Lys Gly His Asp Gly Leu Tyr Gln Gly Leu Ser Thr Ala Thr Lys
        355                 360                 365

Asp Thr Tyr Asp Ala Leu His Met Gln Ala Leu Pro Pro Arg
    370                 375                 380


<210> SEQ ID NO 66
<211> LENGTH: 1131
<212> TYPE: DNA
<213> ORGANISM: Artificial Sequence
<220> FEATURE:
<223> OTHER INFORMATION: NKG2D-OX40Z nucleotide

<400> SEQUENCE: 66

atggctctgc cagtgactgc actgctgctg ccactggccc tgctgctgca cgcagctcga      60

cctctgttca accaggaggt ccagatccca ctgaccgaaa gttactgcgg accatgtccc     120

aagaactgga tctgctacaa gaacaactgt taccagttct ttgacgagtc taagaactgg     180

tatgaatctc aggccagttg catgtcacag aatgcttcac tgctgaaggt gtacagcaaa     240

gaggaccagg atctgctgaa gctggtgaaa tcctatcact ggatgggcct ggtccatatc     300

ccaaccaacg ggtcttggca gtgggaggac ggaagcattc tgtcccccaa tctgctgaca     360

atcattgaaa tgcagaaggg cgattgtgct ctgtacgcaa gctccttcaa agggtatatc     420

gagaactgct ccaccccaa tacatacatt tgtatgcaga ggacagtggc aaaacctacc     480

acaactcctg caccacgccc ccctactcca gcacctacca tcgcatctca gccactgagt     540

ctgcgaccag aggcctgccg gcccgccgcc ggcggggccg tccataccag agggctggac     600
```

```
tttgcctgcg atatctacat ttgggcccct ctggctggaa catgtggcgt gctgctgctg    660

tccctggtca ttactctgta ttgtcgggac cagagactgc cacctgatgc acacaagcca    720

ccaggaggag gcagcttcag gacccccatc caggaggaac aggccgacgc tcattccaca    780

ctggccaaaa ttcgagtgaa gttcagcagg tccgccgacg ctcctgcata ccagcaggga    840

cagaaccagc tgtataacga gctgaatctg ggccggagag aggaatacga cgtgctggac    900

aaaaggcggg gccgggaccc cgaaatggga gggaagccac gacggaaaaa cccccaggag    960

ggcctgtaca atgagctgca aaaggacaaa atggccgagg cttattctga aatcgggatg   1020

aagggagaga gaaggcgcgg aaaaggccac gatggcctgt accaggggct gagcaccgct   1080

acaaaggaca cctatgatgc actgcacatg caggccctgc cccctcggtg a            1131
```

```
<210> SEQ ID NO 67
<211> LENGTH: 376
<212> TYPE: PRT
<213> ORGANISM: Artificial Sequence
<220> FEATURE:
<223> OTHER INFORMATION: NKG2D-OX40Z amino acid

<400> SEQUENCE: 67

Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
        195                 200                 205

Ala Pro Leu Ala Gly Thr Cys Gly Val Leu Leu Leu Ser Leu Val Ile
    210                 215                 220

Thr Leu Tyr Cys Arg Asp Gln Arg Leu Pro Pro Asp Ala His Lys Pro
225                 230                 235                 240

Pro Gly Gly Gly Ser Phe Arg Thr Pro Ile Gln Glu Glu Gln Ala Asp
                245                 250                 255

Ala His Ser Thr Leu Ala Lys Ile Arg Val Lys Phe Ser Arg Ser Ala
            260                 265                 270
```

```
Asp Ala Pro Ala Tyr Gln Gln Gly Gln Asn Gln Leu Tyr Asn Glu Leu
        275                 280                 285

Asn Leu Gly Arg Arg Glu Glu Tyr Asp Val Leu Asp Lys Arg Arg Gly
    290                 295                 300

Arg Asp Pro Glu Met Gly Gly Lys Pro Arg Arg Lys Asn Pro Gln Glu
305                 310                 315                 320

Gly Leu Tyr Asn Glu Leu Gln Lys Asp Lys Met Ala Glu Ala Tyr Ser
                325                 330                 335

Glu Ile Gly Met Lys Gly Glu Arg Arg Arg Gly Lys Gly His Asp Gly
            340                 345                 350

Leu Tyr Gln Gly Leu Ser Thr Ala Thr Lys Asp Thr Tyr Asp Ala Leu
        355                 360                 365

His Met Gln Ala Leu Pro Pro Arg
    370                 375


<210> SEQ ID NO 68
<211> LENGTH: 1089
<212> TYPE: DNA
<213> ORGANISM: Artificial Sequence
<220> FEATURE:
<223> OTHER INFORMATION: NKG2D-ZOX40L nucleotide

<400> SEQUENCE: 68

atggctctgc cagtgactgc actgctgctg ccactggccc tgctgctgca cgcagctcga      60

cctctgttca accaggaggt ccagatccca ctgaccgaaa gttactgcgg accatgtccc     120

aagaactgga tctgctacaa gaacaactgt taccagttct ttgacgagtc taagaactgg     180

tatgaatctc aggccagttg catgtcacag aatgcttcac tgctgaaggt gtacagcaaa     240

gaggaccagg atctgctgaa gctggtgaaa tcctatcact ggatgggcct ggtccatatc     300

ccaaccaacg ggtcttggca gtgggaggac ggaagcattc tgtcccccaa tctgctgaca     360

atcattgaaa tgcagaaggg cgattgtgct ctgtacgcaa gctccttcaa agggtatatc     420

gagaactgct ccacccccaa tacatacatt tgtatgcaga ggacagtggc aaaacctacc     480

acaactcctg caccacgccc ccctactcca gcacctacca tcgcatctca gccactgagt     540

ctgcgaccag aggcctgccg gcccgccgcc ggcggggccg tccataccag agggctggac     600

tttgcctgcg atatctacat ttgggcccct ctggctggaa catgtggcgt gctgctgctg     660

tccctggtca ttactctgta ttgtcgagtg aagttcagca ggtccgccga cgctcctgca     720

taccagcagg gacagaacca gctgtataac gagctgaatc tgggccggag agaggaatac     780

gacgtgctgg acaaaaggcg gggccgggac cccgaaatgg gagggaagcc acgacggaaa     840

aacccccagg agggcctgta caatgagctg caaaaggaca aaatggccga ggcttattct     900

gaaatcggga tgaagggaga gagaaggcgc ggaaaaggcc acgatggcct gtaccagggg     960

ctgagcaccg ctacaaagga cacctatgat gcactgcaca tgcaggccct gccccctcgg    1020

gaaagagtgc agcccctgga agagaatgtc gggaatgccg ctcgcccaag atttgaaagg    1080

aacaaatga                                                            1089


<210> SEQ ID NO 69
<211> LENGTH: 362
<212> TYPE: PRT
<213> ORGANISM: Artificial Sequence
<220> FEATURE:
<223> OTHER INFORMATION: NKG2D-ZOX40L amino acid

<400> SEQUENCE: 69
```

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
        195                 200                 205

Ala Pro Leu Ala Gly Thr Cys Gly Val Leu Leu Leu Ser Leu Val Ile
    210                 215                 220

Thr Leu Tyr Cys Arg Val Lys Phe Ser Arg Ser Ala Asp Ala Pro Ala
225                 230                 235                 240

Tyr Gln Gln Gly Gln Asn Gln Leu Tyr Asn Glu Leu Asn Leu Gly Arg
                245                 250                 255

Arg Glu Glu Tyr Asp Val Leu Asp Lys Arg Arg Gly Arg Asp Pro Glu
            260                 265                 270

Met Gly Gly Lys Pro Arg Arg Lys Asn Pro Gln Glu Gly Leu Tyr Asn
        275                 280                 285

Glu Leu Gln Lys Asp Lys Met Ala Glu Ala Tyr Ser Glu Ile Gly Met
    290                 295                 300

Lys Gly Glu Arg Arg Arg Gly Lys Gly His Asp Gly Leu Tyr Gln Gly
305                 310                 315                 320

Leu Ser Thr Ala Thr Lys Asp Thr Tyr Asp Ala Leu His Met Gln Ala
                325                 330                 335

Leu Pro Pro Arg Glu Arg Val Gln Pro Leu Glu Glu Asn Val Gly Asn
            340                 345                 350

Ala Ala Arg Pro Arg Phe Glu Arg Asn Lys
        355                 360
```

<210> SEQ ID NO 70
<211> LENGTH: 1155
<212> TYPE: DNA
<213> ORGANISM: Artificial Sequence
<220> FEATURE:
<223> OTHER INFORMATION: NKG2D-28Z nucleotide

<400> SEQUENCE: 70

```
atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240

gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccaccccca tacatacatt tgtatgcaga ggacagtggc aaaacctacc    480

acaactcctg caccacgccc ccctactcca gcacctacca tcgcatctca gccactgagt    540

ctgcgaccag aggcctgccg gcccgccgcc ggcggggccg tccataccag agggctggac    600

tttgcctgcg atttttgggt cctggtggtc gtgggagggg tgctggcatg ttactcactg    660

ctggtcaccg tggccttcat catcttctgg gtgcggagca agaggtcccg cctgctgcac    720

agcgactata tgaacatgac ccccacggaga cccggcccta cacggaaaca ttaccagccc    780

tatgctccac ccgggactt cgcagcttac agaagtcgag tgaagttcag caggtccgcc    840

gacgctcctg cataccagca gggacagaac cagctgtata acgagctgaa tctgggccgg    900

agagaggaat acgacgtgct ggacaaaagg cggggccggg accccgaaat gggagggaag    960

ccacgacgga aaaaccccca ggagggcctg tacaatgagc tgcaaaagga caaaatggcc   1020

gaggcttatt ctgaaatcgg gatgaaggga gagagaaggc gcggaaaagg ccacgatggc   1080

ctgtaccagg ggctgagcac cgctacaaag gacacctatg atgcactgca catgcaggcc   1140

ctgcccctc ggtga                                                   1155
```

<210> SEQ ID NO 71
<211> LENGTH: 384
<212> TYPE: PRT
<213> ORGANISM: Artificial Sequence
<220> FEATURE:
<223> OTHER INFORMATION: NKG2D-28Z amino acid

<400> SEQUENCE: 71

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160
```

```
Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Phe Trp Val Leu
        195                 200                 205

Val Val Val Gly Gly Val Leu Ala Cys Tyr Ser Leu Leu Val Thr Val
    210                 215                 220

Ala Phe Ile Ile Phe Trp Val Arg Ser Lys Arg Ser Arg Leu Leu His
225                 230                 235                 240

Ser Asp Tyr Met Asn Met Thr Pro Arg Arg Pro Gly Pro Thr Arg Lys
                245                 250                 255

His Tyr Gln Pro Tyr Ala Pro Pro Arg Asp Phe Ala Ala Tyr Arg Ser
            260                 265                 270

Arg Val Lys Phe Ser Arg Ser Ala Asp Ala Pro Ala Tyr Gln Gln Gly
        275                 280                 285

Gln Asn Gln Leu Tyr Asn Glu Leu Asn Leu Gly Arg Arg Glu Glu Tyr
    290                 295                 300

Asp Val Leu Asp Lys Arg Arg Gly Arg Asp Pro Glu Met Gly Gly Lys
305                 310                 315                 320

Pro Arg Arg Lys Asn Pro Gln Glu Gly Leu Tyr Asn Glu Leu Gln Lys
                325                 330                 335

Asp Lys Met Ala Glu Ala Tyr Ser Glu Ile Gly Met Lys Gly Glu Arg
            340                 345                 350

Arg Arg Gly Lys Gly His Asp Gly Leu Tyr Gln Gly Leu Ser Thr Ala
        355                 360                 365

Thr Lys Asp Thr Tyr Asp Ala Leu His Met Gln Ala Leu Pro Pro Arg
    370                 375                 380
```

<210> SEQ ID NO 72
<211> LENGTH: 1128
<212> TYPE: DNA
<213> ORGANISM: Artificial Sequence
<220> FEATURE:
<223> OTHER INFORMATION: NKG2D-28(H)Z nucleotide

<400> SEQUENCE: 72

```
atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240

gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccacccccaa tacatacatt tgtatgcaga ggacagtgat cgaggtcatg    480

tacccccctc catatctgga caacgaaaag tccaatggaa ctatcattca cgtgaagggc    540

aaacatctgt gcccatctcc cctgttccct gggccaagta aacctttttg ggtcctggtg    600

gtcgtgggag ggtgctggc atgttactca ctgctggtca ccgtggcctt catcatcttc    660

tgggtgcgga gcaagaggtc ccgcctgctg cacagcgact atatgaacat gaccccacgg    720

agacccggcc ctacacggaa acattaccag ccctatgctc caccccggga cttcgcagct    780
```

```
tacagaagtc gagtgaagtt cagcaggtcc gccgacgctc ctgcatacca gcagggacag    840

aaccagctgt ataacgagct gaatctgggc cggagagagg aatacgacgt gctggacaaa    900

aggcggggcc gggaccccga aatgggaggg aagccacgac ggaaaaaccc ccaggagggc    960

ctgtacaatg agctgcaaaa ggacaaaatg gccgaggctt attctgaaat cgggatgaag   1020

ggagagagaa ggcgcggaaa aggccacgat ggcctgtacc aggggctgag caccgctaca   1080

aaggacacct atgatgcact gcacatgcag gccctgcccc ctcggtga                1128


<210> SEQ ID NO 73
<211> LENGTH: 375
<212> TYPE: PRT
<213> ORGANISM: Artificial Sequence
<220> FEATURE:
<223> OTHER INFORMATION: NKG2D-28(H)Z amino acid

<400> SEQUENCE: 73

Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ile Glu Val Met
145                 150                 155                 160

Tyr Pro Pro Pro Tyr Leu Asp Asn Glu Lys Ser Asn Gly Thr Ile Ile
                165                 170                 175

His Val Lys Gly Lys His Leu Cys Pro Ser Pro Leu Phe Pro Gly Pro
            180                 185                 190

Ser Lys Pro Phe Trp Val Leu Val Val Val Gly Gly Val Leu Ala Cys
        195                 200                 205

Tyr Ser Leu Leu Val Thr Val Ala Phe Ile Ile Phe Trp Val Arg Ser
    210                 215                 220

Lys Arg Ser Arg Leu Leu His Ser Asp Tyr Met Asn Met Thr Pro Arg
225                 230                 235                 240

Arg Pro Gly Pro Thr Arg Lys His Tyr Gln Pro Tyr Ala Pro Pro Arg
                245                 250                 255

Asp Phe Ala Ala Tyr Arg Ser Arg Val Lys Phe Ser Arg Ser Ala Asp
            260                 265                 270

Ala Pro Ala Tyr Gln Gln Gly Gln Asn Gln Leu Tyr Asn Glu Leu Asn
        275                 280                 285

Leu Gly Arg Arg Glu Glu Tyr Asp Val Leu Asp Lys Arg Arg Gly Arg
    290                 295                 300
```

```
Asp Pro Glu Met Gly Gly Lys Pro Arg Arg Lys Asn Pro Gln Glu Gly
305                 310                 315                 320

Leu Tyr Asn Glu Leu Gln Lys Asp Lys Met Ala Glu Ala Tyr Ser Glu
                325                 330                 335

Ile Gly Met Lys Gly Glu Arg Arg Arg Gly Lys Gly His Asp Gly Leu
            340                 345                 350

Tyr Gln Gly Leu Ser Thr Ala Thr Lys Asp Thr Tyr Asp Ala Leu His
        355                 360                 365

Met Gln Ala Leu Pro Pro Arg
    370                 375


<210> SEQ ID NO 74
<211> LENGTH: 1257
<212> TYPE: DNA
<213> ORGANISM: Artificial Sequence
<220> FEATURE:
<223> OTHER INFORMATION: NKG2D-BBOX40Z nucleotide

<400> SEQUENCE: 74

atggctctgc cagtgactgc actgctgctg ccactggccc tgctgctgca cgcagctcga      60

cctctgttca accaggaggt ccagatccca ctgaccgaaa gttactgcgg accatgtccc     120

aagaactgga tctgctacaa gaacaactgt taccagttct ttgacgagtc taagaactgg     180

tatgaatctc aggccagttg catgtcacag aatgcttcac tgctgaaggt gtacagcaaa     240

gaggaccagg atctgctgaa gctggtgaaa tcctatcact ggatgggcct ggtccatatc     300

ccaaccaacg ggtcttggca gtgggaggac ggaagcattc tgtcccccaa tctgctgaca     360

atcattgaaa tgcagaaggg cgattgtgct ctgtacgcaa gctccttcaa agggtatatc     420

gagaactgct ccacccccaa tacatacatt tgtatgcaga ggacagtggc aaaacctacc     480

acaactcctg caccacgccc ccctactcca gcacctacca tcgcatctca gccactgagt     540

ctgcgaccag aggcctgccg gcccgccgcc ggcggggccg tccataccag agggctggac     600

tttgcctgcg atatctacat ttgggcccct ctggctggaa catgtggcgt gctgctgctg     660

tccctggtca ttactctgta ttgtaagcgg ggaagaaaga aactgctgta catcttcaaa     720

cagcccttta tgaggcctgt gcagaccaca caggaggaag acggctgctc ctgccggttc     780

cccgaggaag aggaaggcgg gtgcgagctg cgggaccaga gactgccacc tgatgcacac     840

aagccaccag gaggaggcag cttcaggacc cccatccagg aggaacaggc cgacgctcat     900

tccacactgg ccaaaattcg agtgaagttc agcaggtccg ccgacgctcc tgcataccag     960

cagggacaga accagctgta taacgagctg aatctgggcc ggagagagga atacgacgtg    1020

ctggacaaaa ggcggggccg ggaccccgaa atgggaggga agccacgacg gaaaaacccc    1080

caggagggcc tgtacaatga gctgcaaaag gacaaaatgg ccgaggctta ttctgaaatc    1140

gggatgaagg gagagagaag gcgcggaaaa ggccacgatg gcctgtacca ggggctgagc    1200

accgctacaa aggacaccta tgatgcactg cacatgcagg ccctgccccc tcggtga       1257


<210> SEQ ID NO 75
<211> LENGTH: 418
<212> TYPE: PRT
<213> ORGANISM: Artificial Sequence
<220> FEATURE:
<223> OTHER INFORMATION: NKG2D-BBOX40Z amino acid

<400> SEQUENCE: 75

Met Ala Leu Pro Val Thr Ala Leu Leu Leu Pro Leu Ala Leu Leu Leu
1               5                   10                  15
```

-continued

```
His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
        195                 200                 205

Ala Pro Leu Ala Gly Thr Cys Gly Val Leu Leu Leu Ser Leu Val Ile
    210                 215                 220

Thr Leu Tyr Cys Lys Arg Gly Arg Lys Lys Leu Leu Tyr Ile Phe Lys
225                 230                 235                 240

Gln Pro Phe Met Arg Pro Val Gln Thr Thr Gln Glu Glu Asp Gly Cys
                245                 250                 255

Ser Cys Arg Phe Pro Glu Glu Glu Glu Gly Gly Cys Glu Leu Arg Asp
            260                 265                 270

Gln Arg Leu Pro Pro Asp Ala His Lys Pro Pro Gly Gly Gly Ser Phe
        275                 280                 285

Arg Thr Pro Ile Gln Glu Glu Gln Ala Asp Ala His Ser Thr Leu Ala
    290                 295                 300

Lys Ile Arg Val Lys Phe Ser Arg Ser Ala Asp Ala Pro Ala Tyr Gln
305                 310                 315                 320

Gln Gly Gln Asn Gln Leu Tyr Asn Glu Leu Asn Leu Gly Arg Arg Glu
                325                 330                 335

Glu Tyr Asp Val Leu Asp Lys Arg Arg Gly Arg Asp Pro Glu Met Gly
            340                 345                 350

Gly Lys Pro Arg Arg Lys Asn Pro Gln Glu Gly Leu Tyr Asn Glu Leu
        355                 360                 365

Gln Lys Asp Lys Met Ala Glu Ala Tyr Ser Glu Ile Gly Met Lys Gly
    370                 375                 380

Glu Arg Arg Arg Gly Lys Gly His Asp Gly Leu Tyr Gln Gly Leu Ser
385                 390                 395                 400

Thr Ala Thr Lys Asp Thr Tyr Asp Ala Leu His Met Gln Ala Leu Pro
                405                 410                 415

Pro Arg
```

<210> SEQ ID NO 76
<211> LENGTH: 1215
<212> TYPE: DNA
<213> ORGANISM: Artificial Sequence
<220> FEATURE:
<223> OTHER INFORMATION: NKG2D-BBOX40LZ nucleotide

<400> SEQUENCE: 76

```
atggctctgc cagtgactgc actgctgctg ccactggccc tgctgctgca cgcagctcga     60
cctctgttca accaggaggt ccagatccca ctgaccgaaa gttactgcgg accatgtccc    120
aagaactgga tctgctacaa gaacaactgt taccagttct ttgacgagtc taagaactgg    180
tatgaatctc aggccagttg catgtcacag aatgcttcac tgctgaaggt gtacagcaaa    240
gaggaccagg atctgctgaa gctggtgaaa tcctatcact ggatgggcct ggtccatatc    300
ccaaccaacg ggtcttggca gtgggaggac ggaagcattc tgtcccccaa tctgctgaca    360
atcattgaaa tgcagaaggg cgattgtgct ctgtacgcaa gctccttcaa agggtatatc    420
gagaactgct ccaccccaa tacatacatt tgtatgcaga ggacagtggc aaaacctacc    480
acaactcctg caccacgccc ccctactcca gcacctacca tcgcatctca gccactgagt    540
ctgcgaccag aggcctgccg gcccgccgcc ggcggggccg tccataccag agggctggac    600
tttgcctgcg atatctacat ttgggcccct ctggctggaa catgtggcgt gctgctgctg    660
tccctggtca ttactctgta ttgtaagcgg ggaagaaaga aactgctgta catcttcaaa    720
cagcccttta tgaggcctgt gcagaccaca caggaggaag acggctgctc ctgccggttc    780
cccgaggaag aggaaggcgg gtgcgagctg gaaagagtgc agcccctgga agagaatgtc    840
gggaatgccg ctcgcccaag atttgaaagg aacaaacgag tgaagttcag caggtccgcc    900
gacgctcctg cataccagca gggacagaac cagctgtata acgagctgaa tctgggccgg    960
agagaggaat acgacgtgct ggacaaaagg cggggccggg accccgaaat gggagggaag   1020
ccacgacgga aaaaccccca ggagggcctg tacaatgagc tgcaaaagga caaaatggcc   1080
gaggcttatt ctgaaatcgg gatgaaggga gagagaaggc gcggaaaagg ccacgatggc   1140
ctgtaccagg ggctgagcac cgctacaaag gacacctatg atgcactgca catgcaggcc   1200
ctgcccctc ggtga                                                     1215
```

<210> SEQ ID NO 77
<211> LENGTH: 404
<212> TYPE: PRT
<213> ORGANISM: Artificial Sequence
<220> FEATURE:
<223> OTHER INFORMATION: NKG2D-BBOX40LZ amino acid

<400> SEQUENCE: 77

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95
```

```
Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
        195                 200                 205

Ala Pro Leu Ala Gly Thr Cys Gly Val Leu Leu Leu Ser Leu Val Ile
    210                 215                 220

Thr Leu Tyr Cys Lys Arg Gly Arg Lys Lys Leu Leu Tyr Ile Phe Lys
225                 230                 235                 240

Gln Pro Phe Met Arg Pro Val Gln Thr Thr Gln Glu Glu Asp Gly Cys
                245                 250                 255

Ser Cys Arg Phe Pro Glu Glu Glu Glu Gly Gly Cys Glu Leu Glu Arg
            260                 265                 270

Val Gln Pro Leu Glu Glu Asn Val Gly Asn Ala Ala Arg Pro Arg Phe
        275                 280                 285

Glu Arg Asn Lys Arg Val Lys Phe Ser Arg Ser Ala Asp Ala Pro Ala
    290                 295                 300

Tyr Gln Gln Gly Gln Asn Gln Leu Tyr Asn Glu Leu Asn Leu Gly Arg
305                 310                 315                 320

Arg Glu Glu Tyr Asp Val Leu Asp Lys Arg Arg Gly Arg Asp Pro Glu
                325                 330                 335

Met Gly Gly Lys Pro Arg Arg Lys Asn Pro Gln Glu Gly Leu Tyr Asn
            340                 345                 350

Glu Leu Gln Lys Asp Lys Met Ala Glu Ala Tyr Ser Glu Ile Gly Met
        355                 360                 365

Lys Gly Glu Arg Arg Arg Gly Lys Gly His Asp Gly Leu Tyr Gln Gly
    370                 375                 380

Leu Ser Thr Ala Thr Lys Asp Thr Tyr Asp Ala Leu His Met Gln Ala
385                 390                 395                 400

Leu Pro Pro Arg

<210> SEQ ID NO 78
<211> LENGTH: 1257
<212> TYPE: DNA
<213> ORGANISM: Artificial Sequence
<220> FEATURE:
<223> OTHER INFORMATION: NKG2D-OX40BBZ nucleotide

<400> SEQUENCE: 78

atggctctgc cagtgactgc actgctgctg ccactggccc tgctgctgca cgcagctcga      60

cctctgttca accaggaggt ccagatccca ctgaccgaaa gttactgcgg accatgtccc     120

aagaactgga tctgctacaa gaacaactgt taccagttct ttgacgagtc taagaactgg     180

tatgaatctc aggccagttg catgtcacag aatgcttcac tgctgaaggt gtacagcaaa     240

gaggaccagg atctgctgaa gctggtgaaa tcctatcact ggatgggcct ggtccatatc     300
```

```
ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccacccccaa tacatacatt tgtatgcaga ggacagtggc aaaacctacc    480

acaactcctg caccacgccc ccctactcca gcacctacca tcgcatctca gccactgagt    540

ctgcgaccag aggcctgccg gcccgccgcc ggcggggccg tccataccag agggctggac    600

tttgcctgcg atatctacat ttgggcccct ctggctggaa catgtggcgt gctgctgctg    660

tccctggtca ttactctgta ttgtcgggac cagagactgc cacctgatgc acacaagcca    720

ccaggaggag gcagcttcag gacccccatc caggaggaac aggccgacgc tcattccaca    780

ctggccaaaa ttaagcgggg aagaaagaaa ctgctgtaca tcttcaaaca gccctttatg    840

aggcctgtgc agaccacaca ggaggaagac ggctgctcct gccggttccc cgaggaagag    900

gaaggcgggt gcgagctgcg agtgaagttc agcaggtccg ccgacgctcc tgcataccag    960

cagggacaga accagctgta taacgagctg aatctgggcc ggagagagga atacgacgtg   1020

ctggacaaaa ggcggggccg ggaccccgaa atgggaggga agccacgacg gaaaaacccc   1080

caggagggcc tgtacaatga gctgcaaaag gacaaaatgg ccgaggctta ttctgaaatc   1140

gggatgaagg gagagagaag gcgcggaaaa ggccacgatg gcctgtacca ggggctgagc   1200

accgctacaa aggacaccta tgatgcactg cacatgcagg ccctgccccc tcggtga      1257
```

<210> SEQ ID NO 79
<211> LENGTH: 418
<212> TYPE: PRT
<213> ORGANISM: Artificial Sequence
<220> FEATURE:
<223> OTHER INFORMATION: NKG2D-OX40BBZ amino acid

<400> SEQUENCE: 79

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Ile Tyr Ile Trp
```

```
        195                 200                 205

Ala Pro Leu Ala Gly Thr Cys Gly Val Leu Leu Leu Ser Leu Val Ile
    210                 215                 220

Thr Leu Tyr Cys Arg Asp Gln Arg Leu Pro Pro Asp Ala His Lys Pro
225                 230                 235                 240

Pro Gly Gly Gly Ser Phe Arg Thr Pro Ile Gln Glu Glu Gln Ala Asp
                245                 250                 255

Ala His Ser Thr Leu Ala Lys Ile Lys Arg Gly Arg Lys Lys Leu Leu
            260                 265                 270

Tyr Ile Phe Lys Gln Pro Phe Met Arg Pro Val Gln Thr Thr Gln Glu
        275                 280                 285

Glu Asp Gly Cys Ser Cys Arg Phe Pro Glu Glu Glu Glu Gly Gly Cys
    290                 295                 300

Glu Leu Arg Val Lys Phe Ser Arg Ser Ala Asp Ala Pro Ala Tyr Gln
305                 310                 315                 320

Gln Gly Gln Asn Gln Leu Tyr Asn Glu Leu Asn Leu Gly Arg Arg Glu
                325                 330                 335

Glu Tyr Asp Val Leu Asp Lys Arg Arg Gly Arg Asp Pro Glu Met Gly
            340                 345                 350

Gly Lys Pro Arg Arg Lys Asn Pro Gln Glu Gly Leu Tyr Asn Glu Leu
        355                 360                 365

Gln Lys Asp Lys Met Ala Glu Ala Tyr Ser Glu Ile Gly Met Lys Gly
    370                 375                 380

Glu Arg Arg Arg Gly Lys Gly His Asp Gly Leu Tyr Gln Gly Leu Ser
385                 390                 395                 400

Thr Ala Thr Lys Asp Thr Tyr Asp Ala Leu His Met Gln Ala Leu Pro
                405                 410                 415

Pro Arg
```

<210> SEQ ID NO 80
<211> LENGTH: 1281
<212> TYPE: DNA
<213> ORGANISM: Artificial Sequence
<220> FEATURE:
<223> OTHER INFORMATION: NKG2D-28BBZ nucleotide

<400> SEQUENCE: 80

```
atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240

gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccaccccaa tacatacatt tgtatgcaga ggacagtggc aaaacctacc     480

acaactcctg caccacgccc ccctactcca gcacctacca tcgcatctca gccactgagt    540

ctgcgaccag aggcctgccg gcccgccgcc ggcggggccg tccataccag agggctggac    600

tttgcctgcg atttttgggt cctggtggtc gtgggagggg tgctggcatg ttactcactg    660

ctggtcaccg tggccttcat catcttctgg gtgcggagca agaggtcccg cctgctgcac    720

agcgactata tgaacatgac ccccacggaga cccggcccta cacggaaaca ttaccagccc    780
```

```
tatgctccac cccgggactt cgcagcttac agaagtaagc ggggaagaaa gaaactgctg    840

tacatcttca aacagccctt tatgaggcct gtgcagacca cacaggagga agacggctgc    900

tcctgccggt tccccgagga agaggaaggc gggtgcgagc tgcgagtgaa gttcagcagg    960

tccgccgacg ctcctgcata ccagcaggga cagaaccagc tgtataacga gctgaatctg   1020

ggccggagag aggaatacga cgtgctggac aaaaggcggg gccgggaccc cgaaatggga   1080

gggaagccac gacggaaaaa cccccaggag ggcctgtaca atgagctgca aaaggacaaa   1140

atggccgagg cttattctga aatcgggatg aagggagaga gaaggcgcgg aaaaggccac   1200

gatggcctgt accaggggct gagcaccgct acaaaggaca cctatgatgc actgcacatg   1260

caggccctgc cccctcggtg a                                             1281
```

```
<210> SEQ ID NO 81
<211> LENGTH: 426
<212> TYPE: PRT
<213> ORGANISM: Artificial Sequence
<220> FEATURE:
<223> OTHER INFORMATION: NKG2D-28BBZ amino acid

<400> SEQUENCE: 81

Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Phe Trp Val Leu
        195                 200                 205

Val Val Val Gly Gly Val Leu Ala Cys Tyr Ser Leu Leu Val Thr Val
    210                 215                 220

Ala Phe Ile Ile Phe Trp Val Arg Ser Lys Arg Ser Arg Leu Leu His
225                 230                 235                 240

Ser Asp Tyr Met Asn Met Thr Pro Arg Arg Pro Gly Pro Thr Arg Lys
                245                 250                 255

His Tyr Gln Pro Tyr Ala Pro Pro Arg Asp Phe Ala Ala Tyr Arg Ser
            260                 265                 270
```

```
Lys Arg Gly Arg Lys Lys Leu Leu Tyr Ile Phe Lys Gln Pro Phe Met
        275                 280                 285

Arg Pro Val Gln Thr Thr Gln Glu Glu Asp Gly Cys Ser Cys Arg Phe
    290                 295                 300

Pro Glu Glu Glu Glu Gly Gly Cys Glu Leu Arg Val Lys Phe Ser Arg
305                 310                 315                 320

Ser Ala Asp Ala Pro Ala Tyr Gln Gln Gly Gln Asn Gln Leu Tyr Asn
                325                 330                 335

Glu Leu Asn Leu Gly Arg Arg Glu Glu Tyr Asp Val Leu Asp Lys Arg
            340                 345                 350

Arg Gly Arg Asp Pro Glu Met Gly Gly Lys Pro Arg Arg Lys Asn Pro
        355                 360                 365

Gln Glu Gly Leu Tyr Asn Glu Leu Gln Lys Asp Lys Met Ala Glu Ala
    370                 375                 380

Tyr Ser Glu Ile Gly Met Lys Gly Glu Arg Arg Arg Gly Lys Gly His
385                 390                 395                 400

Asp Gly Leu Tyr Gln Gly Leu Ser Thr Ala Thr Lys Asp Thr Tyr Asp
                405                 410                 415

Ala Leu His Met Gln Ala Leu Pro Pro Arg
            420                 425
```

<210> SEQ ID NO 82
<211> LENGTH: 1263
<212> TYPE: DNA
<213> ORGANISM: Artificial Sequence
<220> FEATURE:
<223> OTHER INFORMATION: NKG2D-28OX40Z nucleotide

<400> SEQUENCE: 82

```
atggctctgc cagtgactgc actgctgctg ccactggccc tgctgctgca cgcagctcga     60
cctctgttca accaggaggt ccagatccca ctgaccgaaa gttactgcgg accatgtccc    120
aagaactgga tctgctacaa gaacaactgt taccagttct ttgacgagtc taagaactgg    180
tatgaatctc aggccagttg catgtcacag aatgcttcac tgctgaaggt gtacagcaaa    240
gaggaccagg atctgctgaa gctggtgaaa tcctatcact ggatgggcct ggtccatatc    300
ccaaccaacg ggtcttggca gtgggaggac ggaagcattc tgtcccccaa tctgctgaca    360
atcattgaaa tgcagaaggg cgattgtgct ctgtacgcaa gctccttcaa agggtatatc    420
gagaactgct ccacccccaa tacatacatt tgtatgcaga ggacagtggc aaaacctacc    480
acaactcctg caccacgccc ccctactcca gcacctacca tcgcatctca gccactgagt    540
ctgcgaccag aggcctgccg gcccgccgcc ggcggggccg tccataccag agggctggac    600
tttgcctgcg atttttgggt cctggtggtc gtgggagggg tgctggcatg ttactcactg    660
ctggtcaccg tggccttcat catcttctgg gtgcggagca agaggtcccg cctgctgcac    720
agcgactata tgaacatgac ccccacggaga cccggcccta cacggaaaca ttaccagccc    780
tatgctccac cccgggactt cgcagcttac agaagtcggg accagagact gccacctgat    840
gcacacaagc caccaggagg aggcagcttc aggaccccca tccaggagga acaggccgac    900
gctcattcca cactggccaa aattcgagtg aagttcagca ggtccgccga cgctcctgca    960
taccagcagg gacagaacca gctgtataac gagctgaatc tgggccggag agaggaatac   1020
gacgtgctgg acaaaaggcg gggccgggac cccgaaatgg gagggaagcc acgacggaaa   1080
aacccccagg agggcctgta caatgagctg caaaaggaca aaatggccga ggcttattct   1140
gaaatcggga tgaagggaga gagaaggcgc ggaaaaggcc acgatggcct gtaccagggg   1200
```

```
ctgagcaccg ctacaaagga cacctatgat gcactgcaca tgcaggccct gccccctcgg   1260

tga                                                                 1263


<210> SEQ ID NO 83
<211> LENGTH: 420
<212> TYPE: PRT
<213> ORGANISM: Artificial Sequence
<220> FEATURE:
<223> OTHER INFORMATION: NKG2D-28OX40Z amino acid

<400> SEQUENCE: 83

Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Phe Trp Val Leu
        195                 200                 205

Val Val Val Gly Gly Val Leu Ala Cys Tyr Ser Leu Leu Val Thr Val
    210                 215                 220

Ala Phe Ile Ile Phe Trp Val Arg Ser Lys Arg Ser Arg Leu Leu His
225                 230                 235                 240

Ser Asp Tyr Met Asn Met Thr Pro Arg Arg Pro Gly Pro Thr Arg Lys
                245                 250                 255

His Tyr Gln Pro Tyr Ala Pro Pro Arg Asp Phe Ala Ala Tyr Arg Ser
            260                 265                 270

Arg Asp Gln Arg Leu Pro Pro Asp Ala His Lys Pro Pro Gly Gly Gly
        275                 280                 285

Ser Phe Arg Thr Pro Ile Gln Glu Glu Gln Ala Asp Ala His Ser Thr
    290                 295                 300

Leu Ala Lys Ile Arg Val Lys Phe Ser Arg Ser Ala Asp Ala Pro Ala
305                 310                 315                 320

Tyr Gln Gln Gly Gln Asn Gln Leu Tyr Asn Glu Leu Asn Leu Gly Arg
                325                 330                 335

Arg Glu Glu Tyr Asp Val Leu Asp Lys Arg Arg Gly Arg Asp Pro Glu
```

```
            340                 345                 350

Met Gly Gly Lys Pro Arg Arg Lys Asn Pro Gln Glu Gly Leu Tyr Asn
        355                 360                 365

Glu Leu Gln Lys Asp Lys Met Ala Glu Ala Tyr Ser Glu Ile Gly Met
    370                 375                 380

Lys Gly Glu Arg Arg Arg Gly Lys Gly His Asp Gly Leu Tyr Gln Gly
385                 390                 395                 400

Leu Ser Thr Ala Thr Lys Asp Thr Tyr Asp Ala Leu His Met Gln Ala
                405                 410                 415

Leu Pro Pro Arg
            420


<210> SEQ ID NO 84
<211> LENGTH: 1221
<212> TYPE: DNA
<213> ORGANISM: Artificial Sequence
<220> FEATURE:
<223> OTHER INFORMATION: NKG2D-28OX40LZ nucleotide

<400> SEQUENCE: 84

atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240

gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccacccccaa tacatacatt tgtatgcaga ggacagtggc aaaacctacc    480

acaactcctg caccacgccc ccctactcca gcacctacca tcgcatctca gccactgagt    540

ctgcgaccag aggcctgccg gcccgccgcc ggcggggccg tccataccag agggctggac    600

tttgcctgcg atttttgggt cctggtggtc gtgggagggg tgctggcatg ttactcactg    660

ctggtcaccg tggccttcat catcttctgg gtgcggagca agaggtcccg cctgctgcac    720

agcgactata tgaacatgac ccccacggaga cccggcccta cacggaaaca ttaccagccc    780

tatgctccac cccgggactt cgcagcttac agaagtgaaa gagtgcagcc cctggaagag    840

aatgtcggga atgccgctcg cccaagattt gaaaggaaca aacgagtgaa gttcagcagg    900

tccgccgacg ctcctgcata ccagcaggga cagaaccagc tgtataacga gctgaatctg    960

ggccggagag aggaatacga cgtgctggac aaaaggcggg gccgggaccc cgaaatggga   1020

gggaagccac gacggaaaaa cccccaggag ggcctgtaca atgagctgca aaaggacaaa   1080

atggccgagg cttattctga aatcgggatg aagggagaga gaaggcgcgg aaaaggccac   1140

gatggcctgt accaggggct gagcaccgct acaaaggaca cctatgatgc actgcacatg   1200

caggccctgc cccctcggtg a                                              1221


<210> SEQ ID NO 85
<211> LENGTH: 406
<212> TYPE: PRT
<213> ORGANISM: Artificial Sequence
<220> FEATURE:
<223> OTHER INFORMATION: NKG2D-28OX40LZ amino acid

<400> SEQUENCE: 85
```

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Lys Pro Thr
145                 150                 155                 160

Thr Thr Pro Ala Pro Arg Pro Pro Thr Pro Ala Pro Thr Ile Ala Ser
                165                 170                 175

Gln Pro Leu Ser Leu Arg Pro Glu Ala Cys Arg Pro Ala Ala Gly Gly
            180                 185                 190

Ala Val His Thr Arg Gly Leu Asp Phe Ala Cys Asp Phe Trp Val Leu
        195                 200                 205

Val Val Val Gly Gly Val Leu Ala Cys Tyr Ser Leu Leu Val Thr Val
    210                 215                 220

Ala Phe Ile Ile Phe Trp Val Arg Ser Lys Arg Ser Arg Leu Leu His
225                 230                 235                 240

Ser Asp Tyr Met Asn Met Thr Pro Arg Arg Pro Gly Pro Thr Arg Lys
                245                 250                 255

His Tyr Gln Pro Tyr Ala Pro Pro Arg Asp Phe Ala Ala Tyr Arg Ser
            260                 265                 270

Glu Arg Val Gln Pro Leu Glu Glu Asn Val Gly Asn Ala Ala Arg Pro
        275                 280                 285

Arg Phe Glu Arg Asn Lys Arg Val Lys Phe Ser Arg Ser Ala Asp Ala
    290                 295                 300

Pro Ala Tyr Gln Gln Gly Gln Asn Gln Leu Tyr Asn Glu Leu Asn Leu
305                 310                 315                 320

Gly Arg Arg Glu Glu Tyr Asp Val Leu Asp Lys Arg Arg Gly Arg Asp
                325                 330                 335

Pro Glu Met Gly Gly Lys Pro Arg Arg Lys Asn Pro Gln Glu Gly Leu
            340                 345                 350

Tyr Asn Glu Leu Gln Lys Asp Lys Met Ala Glu Ala Tyr Ser Glu Ile
        355                 360                 365

Gly Met Lys Gly Glu Arg Arg Arg Gly Lys Gly His Asp Gly Leu Tyr
    370                 375                 380

Gln Gly Leu Ser Thr Ala Thr Lys Asp Thr Tyr Asp Ala Leu His Met
385                 390                 395                 400

Gln Ala Leu Pro Pro Arg
                405
```

<210> SEQ ID NO 86
<211> LENGTH: 1254
<212> TYPE: DNA
<213> ORGANISM: Artificial Sequence
<220> FEATURE:
<223> OTHER INFORMATION: NKG2D-28(H)BBZ nucleotide

<400> SEQUENCE: 86

```
atggctctgc cagtgactgc actgctgctg ccactggccc tgctgctgca cgcagctcga     60
cctctgttca accaggaggt ccagatccca ctgaccgaaa gttactgcgg accatgtccc    120
aagaactgga tctgctacaa gaacaactgt taccagttct ttgacgagtc taagaactgg    180
tatgaatctc aggccagttg catgtcacag aatgcttcac tgctgaaggt gtacagcaaa    240
gaggaccagg atctgctgaa gctggtgaaa tcctatcact ggatgggcct ggtccatatc    300
ccaaccaacg ggtcttggca gtgggaggac ggaagcattc tgtcccccaa tctgctgaca    360
atcattgaaa tgcagaaggg cgattgtgct ctgtacgcaa gctccttcaa agggtatatc    420
gagaactgct ccaccccaa tacatacatt tgtatgcaga ggacagtgat cgaggtcatg    480
tacccccctc catatctgga caacgaaaag tccaatggaa ctatcattca cgtgaagggc    540
aaacatctgt gcccatctcc cctgttccct gggccaagta aaccttttg ggtcctggtg    600
gtcgtgggag gggtgctggc atgttactca ctgctggtca ccgtggcctt catcatcttc    660
tgggtgcgga gcaagaggtc ccgcctgctg cacagcgact atatgaacat gaccccacgg    720
agacccggcc ctacacggaa acattaccag ccctatgctc caccccggga cttcgcagct    780
tacagaagta agcggggaag aaagaaactg ctgtacatct tcaaacagcc ctttatgagg    840
cctgtgcaga ccacacagga ggaagacggc tgctcctgcc ggttccccga ggaagaggaa    900
ggcgggtgcg agctgcgagt gaagttcagc aggtccgccg acgctcctgc ataccagcag    960
ggacagaacc agctgtataa cgagctgaat ctgggccgga gagaggaata cgacgtgctg   1020
gacaaaaggc ggggccggga ccccgaaatg ggagggaagc cacgacggaa aaaccccag   1080
gagggcctgt acaatgagct gcaaaaggac aaaatggccg aggcttattc tgaaatcggg   1140
atgaagggag agagaaggcg cggaaaaggc cacgatggcc tgtaccaggg gctgagcacc   1200
gctacaaagg acacctatga tgcactgcac atgcaggccc tgccccctcg gtga         1254
```

<210> SEQ ID NO 87
<211> LENGTH: 417
<212> TYPE: PRT
<213> ORGANISM: Artificial Sequence
<220> FEATURE:
<223> OTHER INFORMATION: NKG2D-28(H)BBZ amino acid

<400> SEQUENCE: 87

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95
```

```
Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ile Glu Val Met
145                 150                 155                 160

Tyr Pro Pro Pro Tyr Leu Asp Asn Glu Lys Ser Asn Gly Thr Ile Ile
                165                 170                 175

His Val Lys Gly Lys His Leu Cys Pro Ser Pro Leu Phe Pro Gly Pro
            180                 185                 190

Ser Lys Pro Phe Trp Val Leu Val Val Val Gly Gly Val Leu Ala Cys
        195                 200                 205

Tyr Ser Leu Leu Val Thr Val Ala Phe Ile Ile Phe Trp Val Arg Ser
    210                 215                 220

Lys Arg Ser Arg Leu Leu His Ser Asp Tyr Met Asn Met Thr Pro Arg
225                 230                 235                 240

Arg Pro Gly Pro Thr Arg Lys His Tyr Gln Pro Tyr Ala Pro Pro Arg
                245                 250                 255

Asp Phe Ala Ala Tyr Arg Ser Lys Arg Gly Arg Lys Lys Leu Leu Tyr
            260                 265                 270

Ile Phe Lys Gln Pro Phe Met Arg Pro Val Gln Thr Thr Gln Glu Glu
        275                 280                 285

Asp Gly Cys Ser Cys Arg Phe Pro Glu Glu Glu Glu Gly Gly Cys Glu
    290                 295                 300

Leu Arg Val Lys Phe Ser Arg Ser Ala Asp Ala Pro Ala Tyr Gln Gln
305                 310                 315                 320

Gly Gln Asn Gln Leu Tyr Asn Glu Leu Asn Leu Gly Arg Arg Glu Glu
                325                 330                 335

Tyr Asp Val Leu Asp Lys Arg Arg Gly Arg Asp Pro Glu Met Gly Gly
            340                 345                 350

Lys Pro Arg Arg Lys Asn Pro Gln Glu Gly Leu Tyr Asn Glu Leu Gln
        355                 360                 365

Lys Asp Lys Met Ala Glu Ala Tyr Ser Glu Ile Gly Met Lys Gly Glu
    370                 375                 380

Arg Arg Arg Gly Lys Gly His Asp Gly Leu Tyr Gln Gly Leu Ser Thr
385                 390                 395                 400

Ala Thr Lys Asp Thr Tyr Asp Ala Leu His Met Gln Ala Leu Pro Pro
                405                 410                 415

Arg
```

```
<210> SEQ ID NO 88
<211> LENGTH: 1236
<212> TYPE: DNA
<213> ORGANISM: Artificial Sequence
<220> FEATURE:
<223> OTHER INFORMATION: NKG2D-28(H)OX40Z nucleotide

<400> SEQUENCE: 88

atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240
```

```
gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccaccccaa tacatacatt tgtatgcaga ggacagtgat cgaggtcatg    480

tacccccctc catatctgga caacgaaaag tccaatggaa ctatcattca cgtgaagggc    540

aaacatctgt gcccatctcc cctgttccct gggccaagta aacctttttg ggtcctggtg    600

gtcgtgggag gggtgctggc atgttactca ctgctggtca ccgtggcctt catcatcttc    660

tgggtgcgga gcaagaggtc ccgcctgctg cacagcgact atatgaacat gaccccacgg    720

agacccggcc ctacacggaa acattaccag ccctatgctc caccccggga cttcgcagct    780

tacagaagtc gggaccagag actgccacct gatgcacaca agccaccagg aggaggcagc    840

ttcaggaccc ccatccagga ggaacaggcc gacgctcatt ccacactggc caaaattcga    900

gtgaagttca gcaggtccgc cgacgctcct gcataccagc agggacagaa ccagctgtat    960

aacgagctga atctgggccg gagagaggaa tacgacgtgc tggacaaaag gcggggccgg   1020

gaccccgaaa tgggagggaa gccacgacgg aaaaaccccc aggagggcct gtacaatgag   1080

ctgcaaaagg acaaaatggc cgaggcttat tctgaaatcg ggatgaaggg agagagaagg   1140

cgcggaaaag gccacgatgg cctgtaccag ggcctgagca ccgctacaaa ggacacctat   1200

gatgcactgc acatgcaggc cctgccccct cggtga                             1236
```

<210> SEQ ID NO 89
<211> LENGTH: 411
<212> TYPE: PRT
<213> ORGANISM: Artificial Sequence
<220> FEATURE:
<223> OTHER INFORMATION: NKG2D-28(H)OX40Z amino acid

<400> SEQUENCE: 89

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ile Glu Val Met
145                 150                 155                 160

Tyr Pro Pro Pro Tyr Leu Asp Asn Glu Lys Ser Asn Gly Thr Ile Ile
                165                 170                 175

His Val Lys Gly Lys His Leu Cys Pro Ser Pro Leu Phe Pro Gly Pro
```

```
            180                 185                 190

Ser Lys Pro Phe Trp Val Leu Val Val Val Gly Gly Val Leu Ala Cys
        195                 200                 205

Tyr Ser Leu Leu Val Thr Val Ala Phe Ile Ile Phe Trp Val Arg Ser
    210                 215                 220

Lys Arg Ser Arg Leu Leu His Ser Asp Tyr Met Asn Met Thr Pro Arg
225                 230                 235                 240

Arg Pro Gly Pro Thr Arg Lys His Tyr Gln Pro Tyr Ala Pro Pro Arg
                245                 250                 255

Asp Phe Ala Ala Tyr Arg Ser Arg Asp Gln Arg Leu Pro Pro Asp Ala
            260                 265                 270

His Lys Pro Pro Gly Gly Gly Ser Phe Arg Thr Pro Ile Gln Glu Glu
        275                 280                 285

Gln Ala Asp Ala His Ser Thr Leu Ala Lys Ile Arg Val Lys Phe Ser
    290                 295                 300

Arg Ser Ala Asp Ala Pro Ala Tyr Gln Gln Gly Gln Asn Gln Leu Tyr
305                 310                 315                 320

Asn Glu Leu Asn Leu Gly Arg Arg Glu Glu Tyr Asp Val Leu Asp Lys
                325                 330                 335

Arg Arg Gly Arg Asp Pro Glu Met Gly Gly Lys Pro Arg Arg Lys Asn
            340                 345                 350

Pro Gln Glu Gly Leu Tyr Asn Glu Leu Gln Lys Asp Lys Met Ala Glu
        355                 360                 365

Ala Tyr Ser Glu Ile Gly Met Lys Gly Glu Arg Arg Arg Gly Lys Gly
    370                 375                 380

His Asp Gly Leu Tyr Gln Gly Leu Ser Thr Ala Thr Lys Asp Thr Tyr
385                 390                 395                 400

Asp Ala Leu His Met Gln Ala Leu Pro Pro Arg
                405                 410
```

<210> SEQ ID NO 90
<211> LENGTH: 1194
<212> TYPE: DNA
<213> ORGANISM: Artificial Sequence
<220> FEATURE:
<223> OTHER INFORMATION: NKG2D-28(H)OX40LZ nucleotide

<400> SEQUENCE: 90

```
atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240

gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccacccccaa tacatacatt tgtatgcaga ggacagtgat cgaggtcatg    480

taccccccctc catatctgga caacgaaaag tccaatggaa ctatcattca cgtgaagggc    540

aaacatctgt gcccatctcc cctgttccct gggccaagta aaccttttttg ggtcctggtg    600

gtcgtgggag ggtgctggc atgttactca ctgctggtca ccgtggcctt catcatcttc    660

tgggtgcgga gcaagaggtc ccgcctgctg cacagcgact atatgaacat gaccccacgg    720

agacccggcc ctacacggaa acattaccag ccctatgctc caccccggga cttcgcagct    780
```

```
tacagaagtg aaagagtgca gcccctggaa gagaatgtcg ggaatgccgc tcgcccaaga    840

tttgaaagga acaaacgagt gaagttcagc aggtccgccg acgctcctgc ataccagcag    900

ggacagaacc agctgtataa cgagctgaat ctgggccgga gagaggaata cgacgtgctg    960

gacaaaaggc ggggccggga ccccgaaatg ggagggaagc cacgacggaa aaacccccag   1020

gagggcctgt acaatgagct gcaaaaggac aaaatggccg aggcttattc tgaaatcggg   1080

atgaagggag agagaaggcg cggaaaaggc cacgatggcc tgtaccaggg gctgagcacc   1140

gctacaaagg acacctatga tgcactgcac atgcaggccc tgccccctcg gtga         1194
```

```
<210> SEQ ID NO 91
<211> LENGTH: 397
<212> TYPE: PRT
<213> ORGANISM: Artificial Sequence
<220> FEATURE:
<223> OTHER INFORMATION: NKG2D-28(H)OX40LZ amino acid

<400> SEQUENCE: 91

Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ile Glu Val Met
145                 150                 155                 160

Tyr Pro Pro Pro Tyr Leu Asp Asn Glu Lys Ser Asn Gly Thr Ile Ile
                165                 170                 175

His Val Lys Gly Lys His Leu Cys Pro Ser Pro Leu Phe Pro Gly Pro
            180                 185                 190

Ser Lys Pro Phe Trp Val Leu Val Val Val Gly Gly Val Leu Ala Cys
        195                 200                 205

Tyr Ser Leu Leu Val Thr Val Ala Phe Ile Ile Phe Trp Val Arg Ser
    210                 215                 220

Lys Arg Ser Arg Leu Leu His Ser Asp Tyr Met Asn Met Thr Pro Arg
225                 230                 235                 240

Arg Pro Gly Pro Thr Arg Lys His Tyr Gln Pro Tyr Ala Pro Pro Arg
                245                 250                 255

Asp Phe Ala Ala Tyr Arg Ser Glu Arg Val Gln Pro Leu Glu Glu Asn
            260                 265                 270

Val Gly Asn Ala Ala Arg Pro Arg Phe Glu Arg Asn Lys Arg Val Lys
        275                 280                 285
```

```
Phe Ser Arg Ser Ala Asp Ala Pro Ala Tyr Gln Gln Gly Gln Asn Gln
    290                 295                 300

Leu Tyr Asn Glu Leu Asn Leu Gly Arg Arg Glu Glu Tyr Asp Val Leu
305                 310                 315                 320

Asp Lys Arg Arg Gly Arg Asp Pro Glu Met Gly Gly Lys Pro Arg Arg
                325                 330                 335

Lys Asn Pro Gln Glu Gly Leu Tyr Asn Glu Leu Gln Lys Asp Lys Met
            340                 345                 350

Ala Glu Ala Tyr Ser Glu Ile Gly Met Lys Gly Glu Arg Arg Arg Gly
        355                 360                 365

Lys Gly His Asp Gly Leu Tyr Gln Gly Leu Ser Thr Ala Thr Lys Asp
    370                 375                 380

Thr Tyr Asp Ala Leu His Met Gln Ala Leu Pro Pro Arg
385                 390                 395
```

<210> SEQ ID NO 92
<211> LENGTH: 1203
<212> TYPE: DNA
<213> ORGANISM: Artificial Sequence
<220> FEATURE:
<223> OTHER INFORMATION: NKG2D-AAA-28(H)OX40LZ nucleotide

<400> SEQUENCE: 92

```
atggctctgc cagtgactgc actgctgctg ccactggccc tgctgctgca cgcagctcga     60

cctctgttca accaggaggt ccagatccca ctgaccgaaa gttactgcgg accatgtccc    120

aagaactgga tctgctacaa gaacaactgt taccagttct ttgacgagtc taagaactgg    180

tatgaatctc aggccagttg catgtcacag aatgcttcac tgctgaaggt gtacagcaaa    240

gaggaccagg atctgctgaa gctggtgaaa tcctatcact ggatgggcct ggtccatatc    300

ccaaccaacg ggtcttggca gtgggaggac ggaagcattc tgtcccccaa tctgctgaca    360

atcattgaaa tgcagaaggg cgattgtgct ctgtacgcaa gctccttcaa agggtatatc    420

gagaactgct ccacccccaa tacatacatt tgtatgcaga ggacagtggc cgccgctatc    480

gaggtcatgt acccccctcc atatctggac aacgaaaagt ccaatggaac tatcattcac    540

gtgaagggca aacatctgtg cccatctccc ctgttccctg ggccaagtaa accttttttgg    600

gtcctggtgg tcgtgggagg ggtgctggca tgttactcac tgctggtcac cgtggccttc    660

atcatcttct gggtgcggag caagaggtcc cgcctgctgc acagcgacta tatgaacatg    720

accccacgga gacccggccc tacacggaaa cattaccagc cctatgctcc accccgggac    780

ttcgcagctt acagaagtga aagagtgcag cccctggaag agaatgtcgg gaatgccgct    840

cgcccaagat ttgaaaggaa caaacgagtg aagttcagca ggtccgccga cgctcctgca    900

taccagcagg gacagaacca gctgtataac gagctgaatc tgggccggag agaggaatac    960

gacgtgctgg acaaaaggcg ggcccgggac cccgaaatgg gagggaagcc acgacggaaa   1020

aacccccagg agggcctgta caatgagctg caaaaggaca aaatggccga ggcttattct   1080

gaaatcggga tgaagggaga gagaaggcgc ggaaaaggcc acgatggcct gtaccagggg   1140

ctgagcaccg ctacaaagga cacctatgat gcactgcaca tgcaggccct gccccctcgg   1200

tga                                                                 1203
```

<210> SEQ ID NO 93
<211> LENGTH: 400
<212> TYPE: PRT
<213> ORGANISM: Artificial Sequence
<220> FEATURE:

<223> OTHER INFORMATION: NKG2D-AAA-28(H)OX40LZ amino acid

<400> SEQUENCE: 93

```
Met Ala Leu Pro Val Thr Ala Leu Leu Leu Pro Leu Ala Leu Leu Leu
1               5                   10                  15

His Ala Ala Arg Pro Leu Phe Asn Gln Glu Val Gln Ile Pro Leu Thr
            20                  25                  30

Glu Ser Tyr Cys Gly Pro Cys Pro Lys Asn Trp Ile Cys Tyr Lys Asn
        35                  40                  45

Asn Cys Tyr Gln Phe Phe Asp Glu Ser Lys Asn Trp Tyr Glu Ser Gln
    50                  55                  60

Ala Ser Cys Met Ser Gln Asn Ala Ser Leu Leu Lys Val Tyr Ser Lys
65                  70                  75                  80

Glu Asp Gln Asp Leu Leu Lys Leu Val Lys Ser Tyr His Trp Met Gly
                85                  90                  95

Leu Val His Ile Pro Thr Asn Gly Ser Trp Gln Trp Glu Asp Gly Ser
            100                 105                 110

Ile Leu Ser Pro Asn Leu Leu Thr Ile Ile Glu Met Gln Lys Gly Asp
        115                 120                 125

Cys Ala Leu Tyr Ala Ser Ser Phe Lys Gly Tyr Ile Glu Asn Cys Ser
    130                 135                 140

Thr Pro Asn Thr Tyr Ile Cys Met Gln Arg Thr Val Ala Ala Ala Ile
145                 150                 155                 160

Glu Val Met Tyr Pro Pro Pro Tyr Leu Asp Asn Glu Lys Ser Asn Gly
                165                 170                 175

Thr Ile Ile His Val Lys Gly Lys His Leu Cys Pro Ser Pro Leu Phe
            180                 185                 190

Pro Gly Pro Ser Lys Pro Phe Trp Val Leu Val Val Val Gly Gly Val
        195                 200                 205

Leu Ala Cys Tyr Ser Leu Leu Val Thr Val Ala Phe Ile Ile Phe Trp
    210                 215                 220

Val Arg Ser Lys Arg Ser Arg Leu Leu His Ser Asp Tyr Met Asn Met
225                 230                 235                 240

Thr Pro Arg Arg Pro Gly Pro Thr Arg Lys His Tyr Gln Pro Tyr Ala
                245                 250                 255

Pro Pro Arg Asp Phe Ala Ala Tyr Arg Ser Glu Arg Val Gln Pro Leu
            260                 265                 270

Glu Glu Asn Val Gly Asn Ala Ala Arg Pro Arg Phe Glu Arg Asn Lys
        275                 280                 285

Arg Val Lys Phe Ser Arg Ser Ala Asp Ala Pro Ala Tyr Gln Gln Gly
    290                 295                 300

Gln Asn Gln Leu Tyr Asn Glu Leu Asn Leu Gly Arg Arg Glu Glu Tyr
305                 310                 315                 320

Asp Val Leu Asp Lys Arg Arg Gly Arg Asp Pro Glu Met Gly Gly Lys
                325                 330                 335

Pro Arg Arg Lys Asn Pro Gln Glu Gly Leu Tyr Asn Glu Leu Gln Lys
            340                 345                 350

Asp Lys Met Ala Glu Ala Tyr Ser Glu Ile Gly Met Lys Gly Glu Arg
        355                 360                 365

Arg Arg Gly Lys Gly His Asp Gly Leu Tyr Gln Gly Leu Ser Thr Ala
    370                 375                 380

Thr Lys Asp Thr Tyr Asp Ala Leu His Met Gln Ala Leu Pro Pro Arg
385                 390                 395                 400
```